US007671706B2

(12) United States Patent
Taniguchi

(10) Patent No.: US 7,671,706 B2
(45) Date of Patent: Mar. 2, 2010

(54) HIGH FREQUENCY MULTILAYER BANDPASS FILTER

(75) Inventor: Tetsuo Taniguchi, Yasu (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 195 days.

(21) Appl. No.: 11/697,025

(22) Filed: Apr. 5, 2007

(65) Prior Publication Data

US 2007/0241839 A1 Oct. 18, 2007

Related U.S. Application Data

(60) Provisional application No. 60/744,846, filed on Apr. 14, 2006, provisional application No. 60/821,428, filed on Aug. 4, 2006.

(30) Foreign Application Priority Data

Apr. 14, 2006 (JP) .............................. 2006-112263
Jul. 19, 2006 (JP) .............................. 2006-197214

(51) Int. Cl.
*H01P 1/20* (2006.01)
(52) U.S. Cl. ..................... 333/203; 333/175; 333/185
(58) Field of Classification Search ................ 333/175, 333/177, 185, 204
See application file for complete search history.

(56) References Cited

U.S. PATENT DOCUMENTS 5,602,517 A * 2/1997 Kaneko et al. ............... 333/185

5,668,511 A * 9/1997 Furutani et al. ............. 333/204
6,503,645 B1 1/2003 Taira et al.
6,661,312 B2 * 12/2003 Orihara ...................... 333/185

(Continued)

FOREIGN PATENT DOCUMENTS

JP 3-262313 A 11/1991

(Continued)

OTHER PUBLICATIONS

Official communication issued in counterpart International Application No. PCT/JP2007/055071, mailed on Jun. 26, 2007.

*Primary Examiner*—Robert Pascal
*Assistant Examiner*—Kimberly E Glenn
(74) *Attorney, Agent, or Firm*—Keating & Bennett, LLP

(57) ABSTRACT

In a multilayer bandpass filter, capacitances are produced between a ground electrode provided in a ground electrode formation layer and capacitor electrodes provided in a capacitor electrode formation layer. A plurality of inductor electrodes are defined by via-electrodes and line electrodes such that loop planes of inductor electrodes at least partially overlap each other when seen in a direction in which the inductor electrodes are arranged. The direction of the loop of the inductor electrode of the LC parallel resonator located (at a first stage) at an input end is set to be opposite to the direction of the loop of the inductor electrodes of the LC parallel resonator (at a second stage) adjacent to the inductor electrode of the LC parallel resonator located at the input end. Similarly, the direction of the loop of the inductor electrode of the LC parallel resonator located (at a fifth stage) at an output end is set to be opposite to the direction of the loop of the inductor electrodes of the LC parallel resonator (at a fourth stage) adjacent to the inductor electrode of the LC parallel resonator located at the output end.

12 Claims, 53 Drawing Sheets

U.S. PATENT DOCUMENTS

| | | | |
|---|---|---|---|
| 6,733,890 B2 * | 5/2004 | Imanaka et al. | 428/426 |
| 6,768,399 B2 * | 7/2004 | Uriu et al. | 333/204 |
| 6,914,500 B2 | 7/2005 | Hirabayashi | |
| 6,972,646 B2 | 12/2005 | Hirabayashi | |
| 2003/0048156 A1 | 3/2003 | Uriu et al. | |
| 2004/0085164 A1 | 5/2004 | Hirabayashi | |
| 2005/0190017 A1 | 9/2005 | Hirabayashi | |

FOREIGN PATENT DOCUMENTS

| | | |
|---|---|---|
| JP | 04-006911 A | 1/1992 |
| JP | 4-150011 A | 5/1992 |
| JP | 5-14007 A | 1/1993 |
| JP | 11-225033 A | 8/1999 |
| JP | 2000-201001 A | 7/2000 |
| JP | 2000-332638 A | 11/2000 |
| JP | 2002-252117 A | 9/2002 |
| JP | 2003-45723 A | 2/2003 |
| JP | 2003-198226 A | 7/2003 |
| JP | 2004-128153 A | 4/2004 |
| WO | 02/09225 A1 | 1/2002 |

* cited by examiner

UNIT:mm

|   | A1 | A2 | A3 | B1 | B2 | B3 | B4 | C1 | C2 | C3 |
|---|---|---|---|---|---|---|---|---|---|---|
| (A) | 0.30 | 0.30 | 0.30 | 0.15 | 0.15 | 0.15 | 0.15 | 0.475 | 0.40 | 0.475 |
| (B) | 0.30 | 0.30 | 0.30 | 0.15 | 0.15 | 0.15 | 0.15 | 0.475 | 0.45 | 0.475 |
| (C) | 0.225 | 0.3 | 0.225 | 0.2 | 0.2 | 0.2 | 0.2 | 0.425 | 0.45 | 0.425 |

UNIT:mm

|     | A1    | A2    | A3    | A4    |
|-----|-------|-------|-------|-------|
| (A) | 0.2   | 0.3   | 0.3   | 0.2   |
| (B) | 0.225 | 0.275 | 0.275 | 0.225 |
| (C) | 0.25  | 0.25  | 0.25  | 0.25  |
| (D) | 0.175 | 0.325 | 0.325 | 0.175 |

UNIT:mm

|     | B1   | B2   | B3   | B4   | C1  | C2   | C3  | C4   | C5  |
|-----|------|------|------|------|-----|------|-----|------|-----|
| (A) | 0.2  | 0.3  | 0.3  | 0.2  | 0.1 | 0.1  | 0.1 | 0.1  | 0.1 |
| (B) | 0.2  | 0.2  | 0.2  | 0.2  | 0.1 | 0.2  | 0.1 | 0.2  | 0.1 |
| (C) | 0.2  | 0.1  | 0.1  | 0.2  | 0.1 | 0.3  | 0.1 | 0.3  | 0.1 |
| (D) | 0.15 | 0.3  | 0.3  | 0.15 | 0.1 | 0.15 | 0.1 | 0.15 | 0.1 |
| (E) | 0.1  | 0.3  | 0.3  | 0.1  | 0.1 | 0.2  | 0.1 | 0.2  | 0.1 |
| (F) | 0.2  | 0.25 | 0.25 | 0.2  | 0.1 | 0.1  | 0.2 | 0.1  | 0.1 |
| (G) | 0.2  | 0.2  | 0.2  | 0.2  | 0.1 | 0.1  | 0.3 | 0.1  | 0.1 |

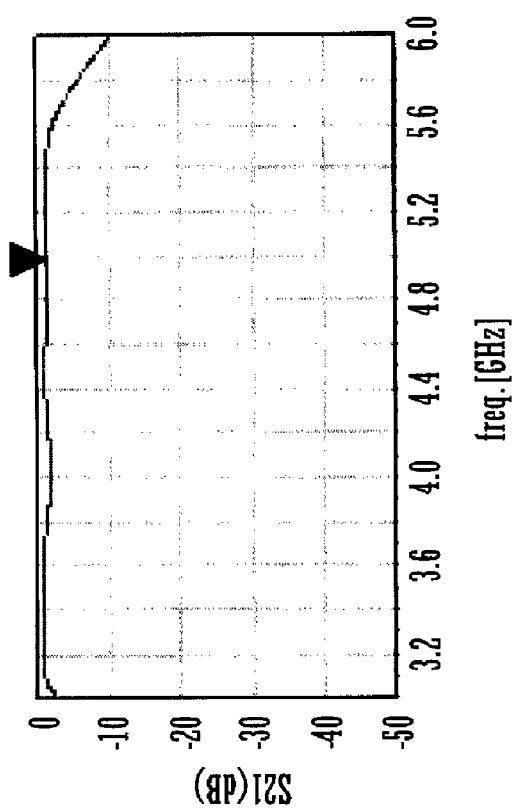
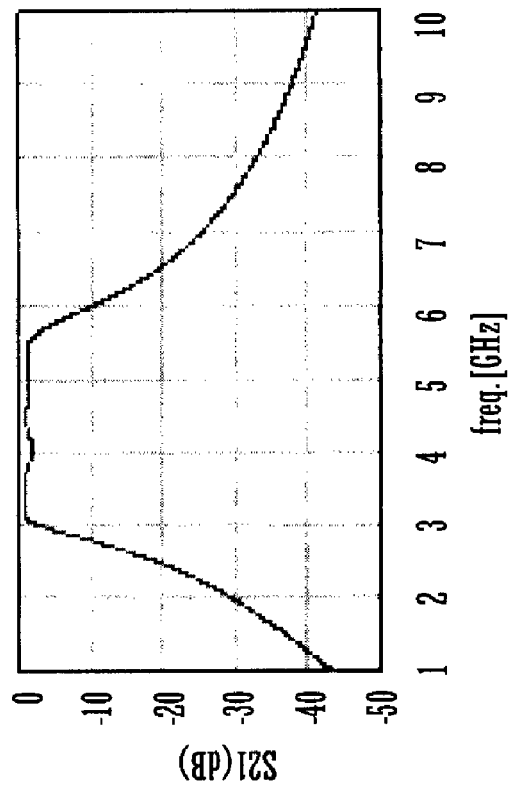
FIG. 33B
FIG. 33A

FIG. 50

HIGH FREQUENCY MULTILAYER BANDPASS FILTER

BACKGROUND OF THE INVENTION

1. Field of the Invention

The present invention relates to a multilayer bandpass filter having a multilayer structure including a plurality of dielectric layers and a plurality of electrode layers.

2. Description of the Related Art

It is known to manufacture a small-sized low-cost high-frequency bandpass filter by producing a plurality of LC resonators in a multilayer structure including dielectric layers and electrode layers.

Examples of such multilayer bandpass filters are disclosed in Japanese Unexamined Patent Application Publication No. 4-6911 (Patent Document 1), Japanese Unexamined Patent Application Publication No. 2000-201001 (Patent Document 2), Japanese Unexamined Patent Application Publication No. 2003-198226 (Patent Document 3), and International Publication Pamphlet No. 02/009225 (Patent Document 4).

Referring to FIGS. 1A and 1B, a multilayer bandpass filter disclosed in Patent Document 1 is described below.

FIG. 1A shows a circuit diagram, and FIG. 1B shows a cross-sectional view of the multilayer bandpass filter disclosed in Patent Document 1. This filter includes a plurality of LC parallel resonant circuits inductively (magnetically) coupled with each other. More specifically, a plurality of parallel resonators are formed using coils L1, L2, L3, ..., Ln and capacitors C1, C2, C3, ..., Cn, such that coils of adjacent resonators are magnetically coupled with each other.

As shown in FIG. 1B, a capacitor electrode pattern 12 and a coil pattern 13 are formed by printing in each of a first layer 10-1, a second layer 10-2 and a third layer 10-3, such that a resonator is formed by these layers. More specifically, capacitance is formed between a ground electrode 11 and capacitor electrodes 12, and coil patterns 13 in two layers are electrically connected to each other via a blind through-hole 14. Below the third layer 10-3, a similar resonator is formed in a plurality of layers including a fourth layer 10-4 and lower layers such that adjacent coils are magnetically coupled.

In a bandpass filter disclosed in Patent Document 2, in a multilayer structure of dielectric layers and electrode layers, a plurality of LC resonators are formed with a plurality of capacitances defined by a plurality of capacitor formation electrodes and inductances occurring on the plurality of capacitor formation electrodes, such that adjacent LC resonators are located at different height levels in the multilayer structure as seen in a thickness direction of the multilayer structure, and such that adjacent LC resonators are electromagnetically coupled with each other. Disposing the plurality of LC resonators at different height levels as seen in the thickness direction in the multilayer structure enables a small-sized bandpass filter to be produced while obtaining a resonator-to-resonator distance necessary to achieve desired characteristics.

In a multilayer bandpass filter disclosed in Patent Document 3, a pair of parallel lines defining first and second filter lines are formed in a partial area of a wiring layer such that the first and second filter lines oppose different circuit layers and extend parallel to the circuit layers, and such that the pair of lines are folded via a dielectric layer.

In a multilayer bandpass filter disclosed in Patent Document 4, two strip lines each defining a resonator are disposed in the same layer such that the two strip lines are spaced by a fixed distance from each other such that the two strip lines are electromagnetically coupled with each other.

In the multilayer bandpass filter disclosed in Patent Document 1, because the coil pattern of each LC parallel resonator is provided in two layers, magnetic coupling between LC parallel resonators becomes large. Furthermore, the two-layer coil pattern causes a reduction in the Q value of the coil, which results in an increase in insertion loss of the multilayer bandpass filter. The above-described problems can be resolved if the distance between LC parallel resonators is set to be sufficiently large. However, this results in an increase in the thickness of the multilayer bandpass filter.

In the multilayer bandpass filter disclosed in Patent Document 2, operations of the resonators are based on self resonance of capacitors, that is, LC resonators are provided by the capacitance of capacitor electrodes and inductance occurring on the capacitor electrodes. However, in this configuration, it is difficult to produce a resonator having desired inductance, and thus, it is difficult to produce a low-loss bandpass filter with desired characteristics.

In the multilayer bandpass filters disclosed in Patent Documents 3 and 4, although it is possible to achieve a small-sized low-loss bandpass filter, in order to increase the number of resonators to achieve steep attenuation at upper and lower edges of a passband, it is necessary to dispose two stages of filters in a thickness direction such that strip lines are coupled with each other in the thickness direction. Thus, a problem in this configuration is that the filter must have a large thickness.

In the known multilayer bandpass filters described above, when LC parallel resonators including capacitor electrodes and inductor electrodes are formed in a multilayer structure such that adjacent inductor electrodes are inductively coupled with each other, a ripple (deviation) of a transfer characteristic occurs in a passband.

SUMMARY OF THE INVENTION

To overcome the problems described above, preferred embodiments of the present invention provide a small-sized low-loss multilayer bandpass filter with steep attenuation at edges of a passband and with low ripple in the passband.

According to a preferred embodiment of the present invention, a multilayer bandpass filter includes a multilayer structure including a plurality of dielectric layers and a plurality of electrode layers each having at least one of a capacitor electrode and an inductor electrode, wherein three or more LC parallel resonators are defined with the capacitor electrodes and the inductor electrodes such that adjacent LC parallel resonators are coupled with each other. The multilayer bandpass filter includes an input electrode and an output electrode, the input electrode being electrically connected to a LC parallel resonator located at an input side of the three or more LC parallel resonators, the output electrode being electrically connected to another LC parallel resonator located at an output of the three or more LC parallel resonators. The inductor electrode of each of the three or more LC parallel resonators define a loop such that when seen in a direction in which the inductor electrodes are arranged, a loop plane of the loop of the inductor electrode of each LC parallel resonator at least partially overlaps a loop plane of the loop of the inductor electrode of an adjacent LC parallel resonator thereby coupling these LC parallel resonators. At least for two LC parallel resonators that are coupled with each other, the loops of the inductor electrodes of the LC parallel resonators extend in directions opposite to each other.

In preferred embodiments of the present invention, the direction of the loop of the inductor electrode of the LC parallel resonator at the input end is set to be opposite to the direction of the loop of the inductor electrode of the LC parallel resonator adjacent to the inductor electrode of the LC parallel resonator at the input end, and the direction of the loop of the inductor electrode of the LC parallel resonator at the output end is set to be opposite to the direction of the loop of the inductor electrode of the LC parallel resonator adjacent to the inductor electrode of the LC parallel resonator at the output end.

Preferably, at least one of the LC parallel resonators includes a plurality of inductor electrodes.

In a preferred embodiment, a transverse electrode electrically isolated from the inductor electrodes of the three or more LC parallel resonators and extending across the three or more LC parallel resonators is provided.

Preferably, the transverse electrode is grounded as required.

Preferably, a side electrode (which is usually grounded) is provided on a side surface of dielectric layers disposed on one another, and a ground electrode provided in a ground plane of the LC parallel resonator is electrically connected to the side electrode via at least one connection electrode.

In another preferred embodiment, the ground electrode includes a plurality of sub ground electrodes used for particular ones of the three or more LC parallel resonators, the plurality of sub ground electrodes being electrically isolated from each other (at high frequencies).

Preferably, the inductor electrode of each of the three or more LC parallel resonators is configured in the shape of a coil with a via-electrode extending in a direction in which the dielectric layers are disposed on one another and at least a line electrode extending in a direction that is substantially perpendicular to the direction in which the dielectric layers are disposed on one another, and the inductor electrodes and the capacitor electrodes are disposed in a direction that is substantially perpendicular to the direction in which the dielectric layers and the electrode layers are disposed on one another.

Preferably, an input/output electrode formation layer in which the input electrode and the output electrode are formed is disposed separately from an electrode layer in which at least the capacitor electrodes or the line electrodes or both types of electrodes are formed, and the input terminal and the output terminal respectively electrically connected to the input electrode and the output electrode are disposed on side surfaces of the multilayer structure.

In another preferred embodiment of the present invention, the input/output electrode formation layer is disposed between the electrode layer in which the line electrodes are formed and the electrode layer in which the capacitor electrodes are formed.

The capacitor electrode of each LC parallel resonator is configured in the shape of a chip capacitor mounted on the surface of the multilayer structure.

In a preferred embodiment of the present invention, the capacitor electrode of each of the three or more LC parallel resonators creates capacitance between the capacitor electrode and a common ground electrode extending over a region where the capacitor electrodes of the three or more LC parallel resonators are located, and the capacitor electrodes are disposed in the same electrode layer.

In a preferred embodiment of the present invention, the line electrodes are disposed in the same electrode layer.

In another preferred embodiment of the present invention, the line electrodes are distributed in an area such that they are distributed in a line-symmetric arrangement about an imaginary center line passing through the center of the area and extending substantially parallel to the line electrodes.

In another preferred embodiment of the present invention, at least two adjacent line electrodes have different widths from each other.

In another preferred embodiment of the present invention, the line electrodes are disposed at uneven intervals as seen in a width direction.

In another preferred embodiment, each line electrode is connected to two via-electrodes spaced from each other by a distance that is different at least between the above-described two line electrodes.

Preferably, a capacitor electrode arranged to capacitively couple the input electrode and the output electrode with each other is disposed in a particular one of the plurality of electrode layers.

Preferably, at least one of the line electrodes has a meander shape or a U-like shape.

In another preferred embodiment of the present invention, an additional capacitor electrode is provided in an area which is not between the capacitor electrode of the LC parallel resonator at the input side and the capacitor electrode of the LC parallel resonator at the output side.

Preferably, the capacitor electrodes of the LC parallel resonators at the input end and the output end are provided in an electrode layer that is different from an electrode layer in which the other capacitor electrodes are provided.

In another preferred embodiment of the present invention, the line electrodes are defined by chip inductors mounted on the surface of the multilayer structure.

In a preferred embodiment of the present invention, the dielectric layer on which the electrode layer including the line electrodes is disposed has a relative dielectric constant in the range of about 6 to about 80, and the dielectric layer on which the electrode layer including the capacitor electrodes is disposed has a relative dielectric constant equal to or greater than about 20.

In a preferred embodiment of the present invention, the dielectric layers are made of low temperate cured ceramic.

With the various preferred embodiments of the present invention, a loop is formed with an inductor electrode of each of three or more LC parallel resonators such that loop planes of the respective loops of the inductor electrodes of the LC parallel resonators coupled with each other at least partially overlap each other when seen in a direction in which inductor electrodes are arranged. This configuration produces an increase in the coupling strength (inductive coupling strength) between adjacent LC parallel resonators, and thus achieves a wide passband.

Because the inductor electrodes are formed separately from the capacitor electrodes, inductors having high Q values are obtained, which achieves a low insertion loss.

Unlike the resonators based on self resonance, it is possible to produce resonators with desired inductance, and thus, it is possible to achieve a desired passband with a low insertion loss.

Because the LC parallel resonators are configured such that the loop direction of the inductor electrode is opposite at least between two LC parallel resonators coupled with each other, the ripple of the insertion loss is suppressed in the passband, and thus, good passband characteristics are achieved.

The direction of the loop of the inductor electrode of the LC parallel resonator located closest to the input side is opposite to the direction of the loop of the inductor electrode of the LC parallel resonator adjacent to the inductor electrode of the LC parallel resonator located closest to the input side, and the direction of the loop of the inductor electrode of the LC parallel resonator located closest to the output side is opposite to the direction of the loop of the inductor electrode of the LC parallel resonator adjacent to the inductor electrode of the LC parallel resonator located closest to the output side. This configuration enables a further reduction in the ripple of the insertion loss in the passband.

By arranging the transverse electrode to be electrically isolated from the inductor electrodes of the three or more LC parallel resonators and to extend across the three or more LC parallel resonators, a desired characteristic in the passband is achieved simply by adjusting the shape of the transverse electrode and/or the distance (layer thickness) to the inductor electrodes, without having to modify the configuration of the LC parallel resonators.

By grounding the transverse electrode, it is possible to achieve a bandpass filter having a characteristic in a passband different from that obtained when the transverse electrode is not grounded.

By providing a plurality of inductor electrodes for at least one of the plurality of LC parallel resonators, it is possible to easily achieve an optimum inductance value and easily optimize the strength of coupling between inductor electrodes of adjacent LC parallel resonators via overlapping portions of the loop planes of the inductor electrodes.

In the configuration in which the ground electrode provided in the ground plane of the LC parallel resonators is electrically connected via the connection electrode to the side electrode provided on the side surface of the multilayer structure of dielectric layers, the connection electrode functions as an inductor having small inductance, and the characteristics in the passband can be modified simply by modifying the shape of the connection electrode.

In the configuration in which the ground electrode is configured so as to include a plurality of sub ground electrodes electrically isolated from each other, the provision of the electrically isolated sub ground electrodes makes it possible to prevent a high-frequency signal from propagating in an undesirable fashion via the ground electrode between particular ones of the plurality of LC parallel resonators.

In the configuration in which the inductor electrodes and the capacitor electrodes of the plurality of LC parallel resonators are arranged in a direction that is substantially perpendicular to the direction in which the dielectric layers and the electrode layers are disposed one on another, the distance between the loop planes of adjacent inductor electrodes can be set to be substantially equal for all LC parallel resonators. More specifically, when the electrode layer is disposed on the dielectric layer, if a deviation occurs between the electrode layer and the dielectric layer in a direction that is substantially parallel to the layer planes, substantially no deviation occurs in the distance between inductor electrodes of adjacent LC parallel resonators. This makes it possible to achieve characteristics in the passband having no significant variations from one filter to another.

In the configuration in which the input/output electrode formation layer in which the input electrode and the output electrode are provided is disposed separately from the electrode layer in which at least the capacitor electrodes or the line electrodes or both types of electrodes are provided, the input terminal and the output terminal can be disposed at arbitrary locations in the multilayer structure of dielectric layers and electric layers, regardless of the locations and the shapes of the capacitor electrodes and the inductor electrodes.

In the configuration in which the input/output electrode formation layer is disposed between the electrode layer in which the line electrodes are provided and the electrode layer in which the capacitor electrodes are provided, the change in the resonant frequency due to the cutting accuracy of the multilayer structure and the accuracy of layer-to-layer stacking can be reduced. More specifically, because via-electrodes are disposed at locations with high relative positional accuracy, even if a deviation occurs in layer-to-layer stacking or a parallel displacement occurs in the locations of the via-electrodes, the inductances of the inductor electrodes are maintained substantially unchanged, and thus, the locations of the input/output electrodes do not significant influence the resonant frequency.

In the configuration in which the capacitor electrode of each LC parallel resonator is configured in the shape of a chip capacitor mounted on the surface of the multilayer structure, large capacitances are achieved for each LC parallel resonator. In this configuration, it is also possible to couple the LC parallel resonator only via inductive coupling. This facilitates the design of the filter.

In the configuration in which the capacitor electrode of each of the plurality of LC parallel resonators creates capacitance between the capacitor electrode and the common ground electrode extending over the region at which the capacitor electrodes of the plurality of LC parallel resonators are located, capacitance also occurs between adjacent capacitor electrodes, which makes it unnecessary to provide a coupling capacitive element between LC parallel resonators. This also makes it possible to achieve a high Q value for the resonators. Furthermore, even if a layer-to-layer stacking error or a printing alignment error occurs for the layer in which the capacitor electrodes are formed, substantially no change occurs in capacitance between the capacitance electrodes and the ground electrode and substantially no change occurs in capacitance between adjacent capacitance electrodes, and thus substantially no change in characteristics due to such variation errors occurs.

In the configuration in which each inductor electrode of each of the plurality of LC parallel resonators includes a line electrode extending in a direction that is substantially parallel to dielectric layers, and all line electrodes are disposed in the same electrode layer, even if a printing alignment error or a stacking error occurs in the line electrode formation layer, a significant change occurs in the inductance of the inductor electrodes. Furthermore, in this configuration, the distance between the loop planes of adjacent inductor electrodes can be set to be substantially equal for LC parallel resonators, and thus, there is no significant variation in inductor-to-inductor distance between adjacent LC parallel resonators. This minimizes variations in characteristics in the passband of the filter.

In the configuration in which the line electrodes are distributed in an area such that they are distributed in a line-symmetric fashion about an imaginary center line passing through the center of the area and extending substantially parallel to the line electrodes, the symmetric structure in the input-output direction enables substantially equal electrically characteristics to be obtained regardless of the direction in which the filter is mounted on a circuit board.

In the configuration in which at least two adjacent line electrodes are configured to have different widths from one another, a fine adjustment of the inductance of the inductors of LC parallel resonators can be made.

In the configuration in which the line electrodes are disposed at uneven intervals as seen in a width direction, the electromagnetic coupling between LC parallel resonators can be adjusted so as to adjust the input/output impedance of the multilayer bandpass filter.

In the configuration in which each line electrode is connected to two via-electrodes spaced from each other by a distance which is different at least between two line electrodes, a fine adjustment of the resonant frequency of each LC parallel resonator can be made so as to minimize the ripple in the passband.

In the configuration in which the line electrodes are defined by chip inductors mounted on the surface of the multilayer structure, inductors having a large inductance are obtained. In addition, a desired attenuation characteristic can be obtained by adjusting the inductance of the chip inductors.

In the configuration in which at least one of the line electrodes is configured in a meander shape or a U-like shape, it is possible to provide line electrodes having a relatively large length in a limited area. Therefore, a necessary inductance can be provided in a small area so as to reduce the overall size.

In the configuration in which an additional capacitor electrode is provided in an area that is not located between the capacitor electrode of the LC parallel resonator at the input side and the capacitor electrode of the LC parallel resonator at the output side, the capacitance between the capacitor electrode of the LC parallel resonator at the input side and the capacitor electrode of the LC parallel resonator at the output side can be provided without being influenced by the other capacitor electrodes. In this configuration, no undesirable coupling occurs, and thus, the design of the frequencies of attenuation poles at both edges of the passband is facilitated.

By adjusting the capacitance between the input electrode and the output electrode, the frequency of an attenuation pole at one edge of the passband or attenuation poles at both edges of the passband of the filter can be adjusted, thereby controlling the attenuation characteristics of the filter. However, if there is another electrode between the input electrode and the output electrode, it is necessary to control the capacitance via this electrode, and thus, it is difficult to control the capacitance. To avoid the above-described problem, the capacitor electrodes of the LC parallel resonators at the input end and the output end are provided in an electrode layer different from an electrode layer in which the other capacitor electrodes are provided. In this configuration, these capacitors are not coupled with the capacitor electrodes of the other resonators, and thus, capacitances can be obtained in a highly reliable manner. This improves attenuation pole characteristics and thus improves filter characteristics. Furthermore, the capacitance can be adjusted by adjusting only the distance between the input electrode and the output electrode. This facilitates adjusting and setting of the frequency of attenuation poles.

In the configuration in which the capacitor electrode is arranged to capacitively couple the input electrode and the output electrode with each other, desired attenuation characteristics are obtained by adjusting this capacitor electrode without changing the basic configuration of the LC parallel resonators.

In the configuration in which the dielectric layer on which the electrode layer including the line electrodes is disposed has a relative dielectric constant in the range from about 6 to about 80, and the dielectric layer on which the electrode layer including the capacitor electrodes is disposed has a relative dielectric constant equal to or greater than about a large capacitance per unit area is achieved, and thus, the overall size of the filter is reduced without having a significant reduction in the Q values of the inductors.

In the configuration in which the dielectric layers are made of low temperate cured ceramic, high capacitance per unit area is achieved, and thus, the overall size of the filter is reduced.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 33A and 33B show transfer characteristics of the multilayer bandpass filter configured so as to have an ungrounded transverse electrode according to the twelfth preferred embodiment of the present invention.

FIG. 50 is an exploded perspective view of a multilayer bandpass filter according to a nineteenth preferred embodiment of the present invention.

DETAILED DESCRIPTION OF PREFERRED EMBODIMENTS

First Preferred Embodiment

A multilayer bandpass filter according to a first preferred embodiment is described below with reference to FIGS. 2A to 9B.

Figure 1A:
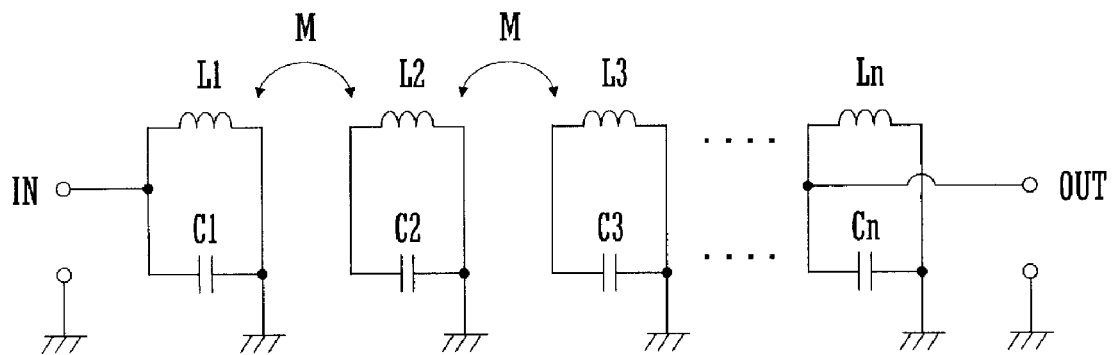
FIGS. 1A and 1B show an equivalent circuit and a cross section of a multilayer bandpass filter disclosed in Patent Document 1.
Figure 1B:
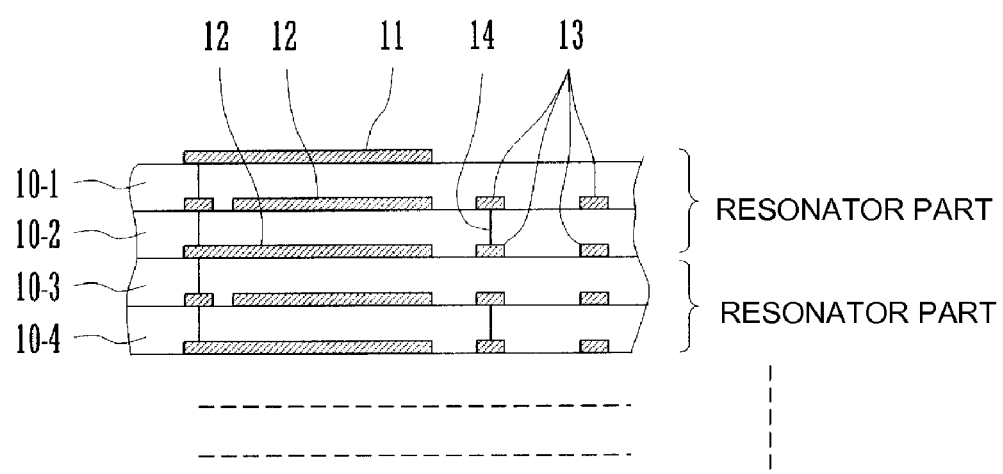
Figure 2A:
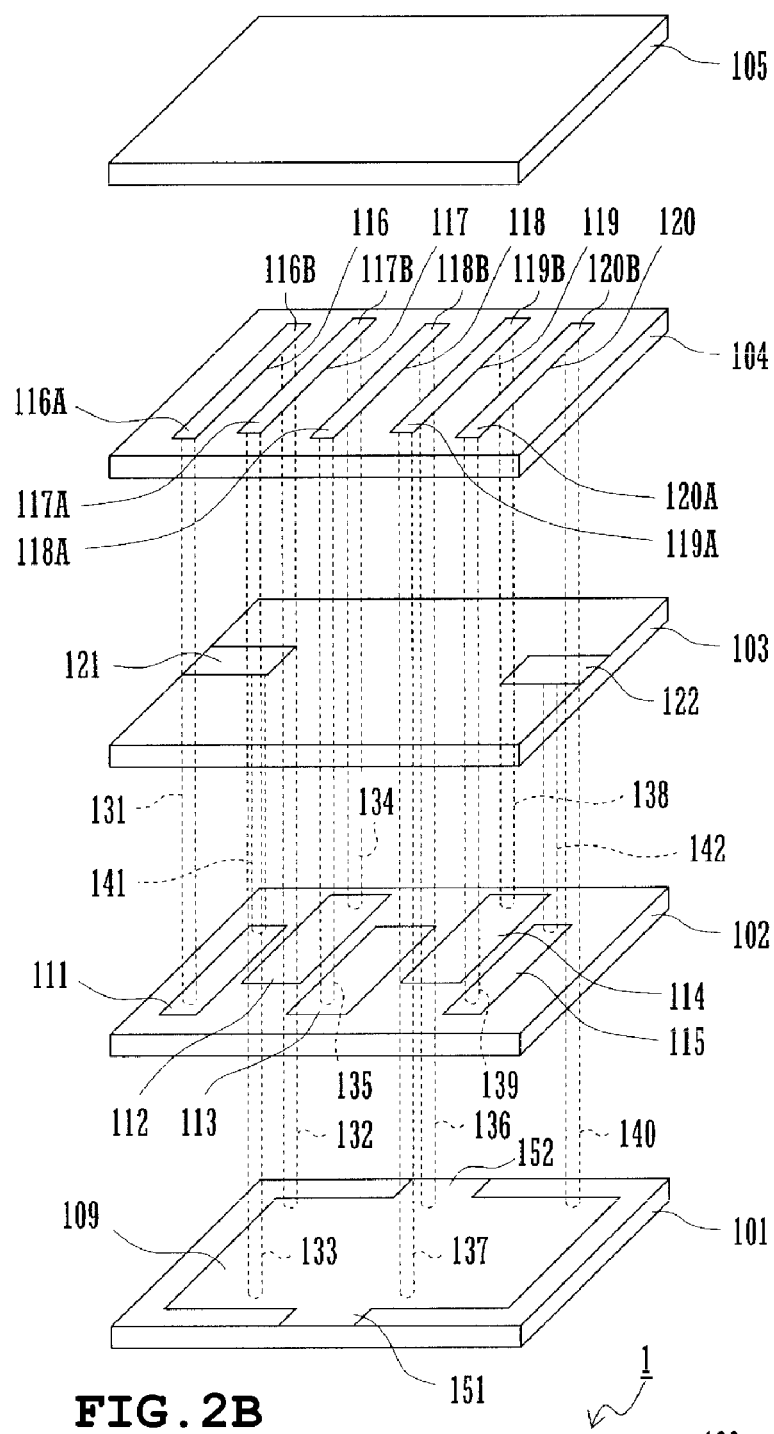
FIGS. 2A and 2B show an exploded perspective view and an external perspective view of a multilayer bandpass filter according to a first preferred embodiment of the present invention.
Figure 2B:
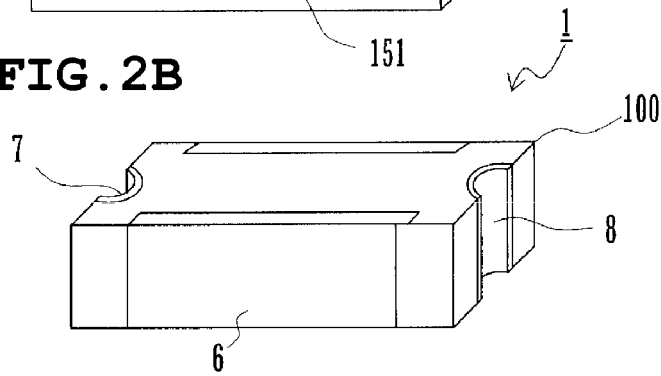

FIG. 2A shows an exploded perspective view of a multilayer bandpass filter according to a first preferred embodiment, and FIG. 2B is a perspective view showing an appearance of the multilayer bandpass filter.

As shown in FIG. 2A, the multilayer bandpass filter includes a ground electrode formation layer 101, a capacitor electrode formation layer 102, an input/output electrode formation layer 103, a line electrode formation layer 104, and an external layer 105. In each of these layers, a particular electrode pattern is provided on the upper surface of a dielectric layer, and these layers are disposed on one another in a multilayer structure.

As shown in FIG. 2A, a ground electrode 109 is provided on the upper surface of the ground electrode formation layer 101. Capacitor electrodes 111 to 115 are provided in the capacitor electrode formation layer 102. Input/output electrodes 121 and 122 are provided in the input/output electrode formation layer 103. Line electrodes 116 to 120 are provided in the line electrode formation layer 104. This multilayer bandpass filter is preferably arranged so as to have a multilayer structure including five dielectric layers and four electrode layers, for example, and to have terminal electrodes on end surfaces.

In FIG. 2B, reference numeral 100 denotes the multilayer structure including the above-described dielectric layers and electrode layers. Of four side surfaces of this multilayer structure, input/output terminals 7 and 8 are provided on respective two side surfaces (end surfaces) opposing each other, and ground terminals 6 are provided on the remaining two side surfaces thereby obtaining a multilayer bandpass filter 1.

Of the above-described layers, dielectric layers are preferably made of low temperature co-fired ceramic (LTCC) with a relative dielectric constant in the range of about 6 to about 80.

The dielectric layer on which the electrode layer including the line electrodes are provided, that is, the line electrode formation layer 104, and also the external layer 105 have a relative dielectric constant in the range of about 6 to about 80. The capacitor electrode formation layer has a relative dielectric constant equal to or greater than about 20. Each dielectric layer is made using low temperate cure ceramic including glass and at least one component selected from a group consisting of titanium oxide, barium oxide, and alumina. In other preferred embodiments described below, each dielectric layer is made of a similar material.

In FIG. 2A, in the ground electrode formation layer 101, the ground electrode 109 is arranged over an area slightly smaller than the total planar dimension of the ground electrode formation layer 101, and ground connection electrodes 151 and 152 are arranged such that they are electrically connected to the ground electrode 109 and they extend to respective two side ends of the ground electrode formation layer 101. The two ground connection electrode 151 and 152 are electrically connected to the ground terminal 6 shown in FIG. 2B.

In the capacitor electrode formation layer 102, five capacitor electrodes 111 to 115 each having a substantially rectangular shape are preferably arranged so as to be substantially parallel to each other. Capacitance is produced between the respective capacitor electrodes 111 to 115 and the ground electrode 109. Capacitance is also created between adjacent capacitor electrodes 111 to 115.

In the input/output electrode formation layer 103, substantially rectangular input/output electrodes 121 and 122 are arranged so as to be in contact with respective two short sides of the input/output electrode formation layer 103. These two input/output electrodes 121 and 122 are electrically connected to the input/output terminal 7 or 8 shown in FIG. 2B.

In the line electrode formation layer 104, line electrodes 116 to 120 having a line shape are arranged so as to be substantially parallel to each other.

In the capacitor electrode formation layer 102, the input/output electrode formation layer 103 and the line electrode formation layer 104, via-electrodes 131 to 142 are arranged in a direction in which the capacitor electrode formation layer 102, the input/output electrode formation layer 103, and the line electrode formation layer 104 are disposed on one another. The via-electrode 131 is electrically connected to the one end 116A of the line electrode 116 and the capacitor electrode 111. The via-electrode 132 is electrically connected to the other end 116B of the line electrode 116 and to the ground electrode 109. The via-electrode 133 is electrically connected to one end 117A of the line electrode 117 and to the ground electrode 109. The via-electrode 134 is electrically connected to the other end 117B of the line electrode 117 and to the capacitor electrode 112. The via-electrode 135 is electrically connected to one end 118A of the line electrode 118 and to the capacitor electrode 113. The via-electrode 136 is electrically connected to the other end 118B of the line electrode 118 and to the ground electrode 109. The via-electrode 137 is electrically connected to one end 119A of the line electrode 119 and to the ground electrode 109. The via-electrode 138 is electrically connected to the other end 119B of the line electrode 119 and to the capacitor electrode 114. The via-electrode 139 is electrically connected to one end 120A of the line electrode 120 and to the capacitor electrode 115. The via-electrode 140 is electrically connected to the other end 120B of the line electrode 120 and to the ground electrode 109.

Thus, inductor electrodes are defined by the respective via-electrodes and line electrodes in loop directions as shown below in Table 1.

TABLE 1

| Inductor electrode | via-electrode | Line electrode | Loop direction |
|---|---|---|---|
| First | 131, 132 | 116 | 1 |
| Second | 133, 134 | 117 | 0 |
| Third | 135, 136 | 118 | 1 |
| Fourth | 137, 138 | 119 | 0 |
| Fifth | 139, 140 | 120 | 1 |

Note that a "loop" of an inductor electrode refers to a path of the inductor electrode starting from a node between this inductor electrode and a capacitor electrode. That is, a starting point is defined by a node between a capacitor electrode and a via-electrode, and a loop is formed by a path starting with this starting point and including this via-electrode, a line electrode, and another via-electrode.

"Loop direction" is defined by a rotation direction of a loop extending from its starting point seen in an arrangement direction in which line electrodes are arranged side by side. For example, when loops formed by respective inductor electrodes shown in FIG. 2A are seen in a direction from the input/output electrode 121 to the input/output electrode 122, a first inductor electrode forms a loop starting from a node between a capacitor electrode 111 and a via-electrode 131 and extending through a via-electrode 131 and a line electrode 116 until reaching a node between the line electrode 116 and a via-electrode 132, and thus the loop of this first inductor electrode extends in a clockwise direction. In the case of a second inductor electrode, a loop extends starting from a node between a capacitor electrode 112 and a via-electrode 134 to a node between a line electrode 117 and via-electrode 133 through the via-electrode 134 and the line electrode 117, and thus the loop of this second inductor electrode extends in a counterclockwise direction. The loop extends either in the counterclockwise direction or in the clockwise direction, and thus the counterclockwise direction is denoted by "1" and the clockwise direction is denoted by "0".

Thus, in the case of five (five-stage) LC parallel resonators shown in Table 1, resonator-to-resonator coupling polarities are represented by a sequence of numerals of "1" or "0" as <10101> when seen in a direction from the input terminal to the output terminal of the bandpass filter.

Figure 3A:
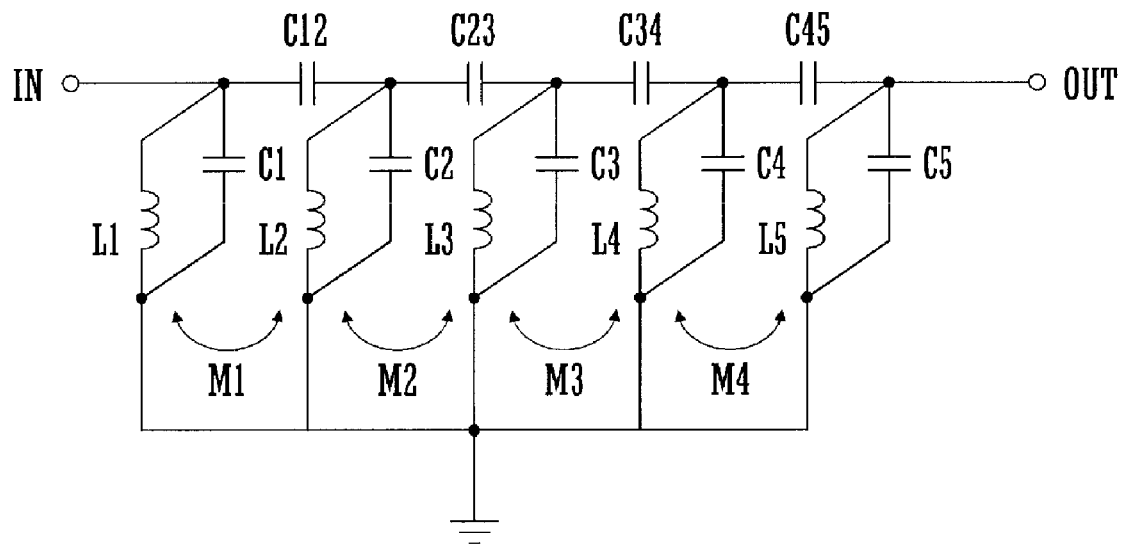
FIGS. 3A and 3B show an equivalent circuit and a transfer characteristic of the multilayer bandpass filter according to the first preferred embodiment of the present invention.

The input/output via-electrode 141 is electrically connected to the input/output electrode 121 and the capacitor electrode 111, and the input/output via-electrode 142 is electrically connected to the input/output electrode 122 and the capacitor electrode 115. FIG. 3A shows an equivalent circuit of the multilayer bandpass filter described above, and FIG. 3B shows a transfer characteristic (S21 of S parameters) thereof.

In FIG. 3A, an input terminal IN corresponds to an input/output terminal electrically connected to the input/output electrode 121 shown in FIG. 2A, and an output terminal OUT corresponds to an input/output terminal 8 electrically connected to the input/output electrode 122. An inductor L1 is a symbolic expression of inductance on an inductor electrode including the via-electrodes 131 and 132 and the line electrode 116. An inductor L2 is a symbolic expression of inductance on an inductor electrode including the via-electrodes 133 and 134 and the line electrode 117. Similarly, an inductor L3 is a symbolic expression of inductance on an inductor electrode including the via-electrodes 135 and 136 and the line electrode 118, an inductor L4 is a symbolic expression of inductance on an inductor electrode including the via-electrodes 137 and 138 and the line electrode 119, and an inductor L5 is a symbolic expression of inductance on an inductor electrode including the via-electrodes 139 and 140 and the line electrode 120.

Capacitances between the respective capacitor electrodes 111 to 115 and the ground electrode 109 are represented symbolically by capacitors C1 to C5. A capacitor C12 is a symbolic expression of capacitance between the capacitor electrodes 111 and 112. Similarly, a capacitor C23 is a symbolic expression of capacitance between the capacitor electrodes 112 and 113, a capacitor C34 is a symbolic expression of capacitance between the capacitor electrodes 113 and 114, and a capacitor C45 is a symbolic expression of capacitance between the capacitor electrodes 114 and 115.

When loop planes of respective inductor electrodes each including two via-electrodes and one line electrode are seen in a direction in which the inductor electrodes are arranged, the loop planes at least partially overlap each other. As a result, inductive coupling occurs at least between inductors of adjacent inductor electrodes.

Figure 3B:
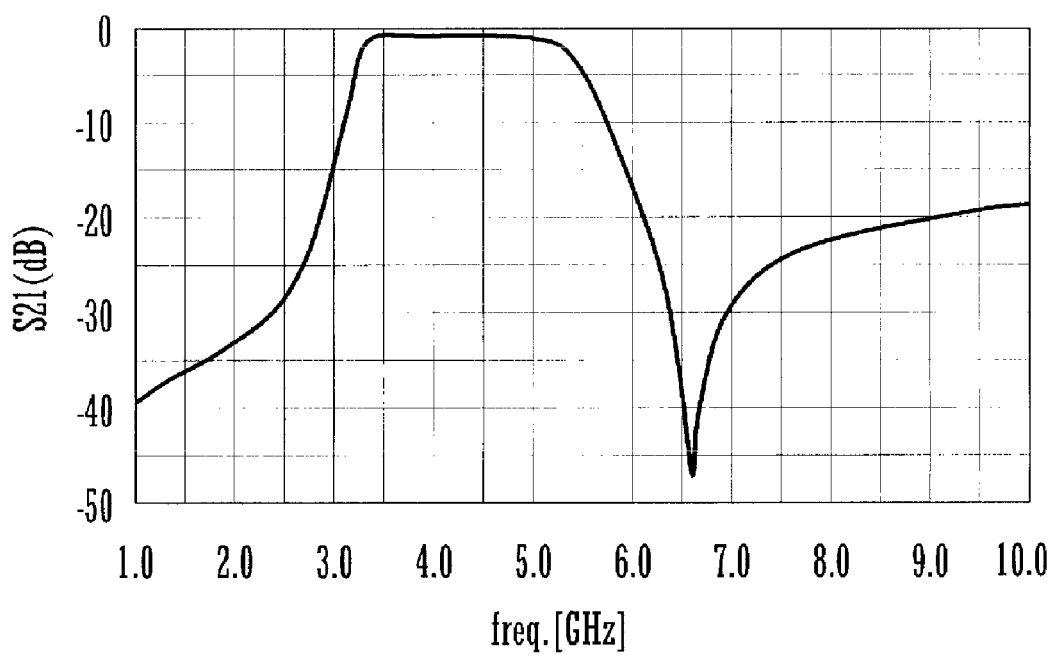

In the present preferred embodiment, as shown in FIG. 3B, the multilayer bandpass filter has a transfer characteristic that allows an input signal to pass in a frequency band of about 3.3 GHz to about 5.3 GHz and blocks the input signal in the other frequency ranges. The transfer characteristic has an attenuation pole at about 6.6 GHz, which ensures large attenuation in a range close to this attenuation pole. This attenuation pole is produced as a result of inductive coupling of a plurality of LC parallel resonators whose coupling polarity is alternately inverted from one LC parallel resonator to another.

Second Preferred Embodiment

Figure 4:
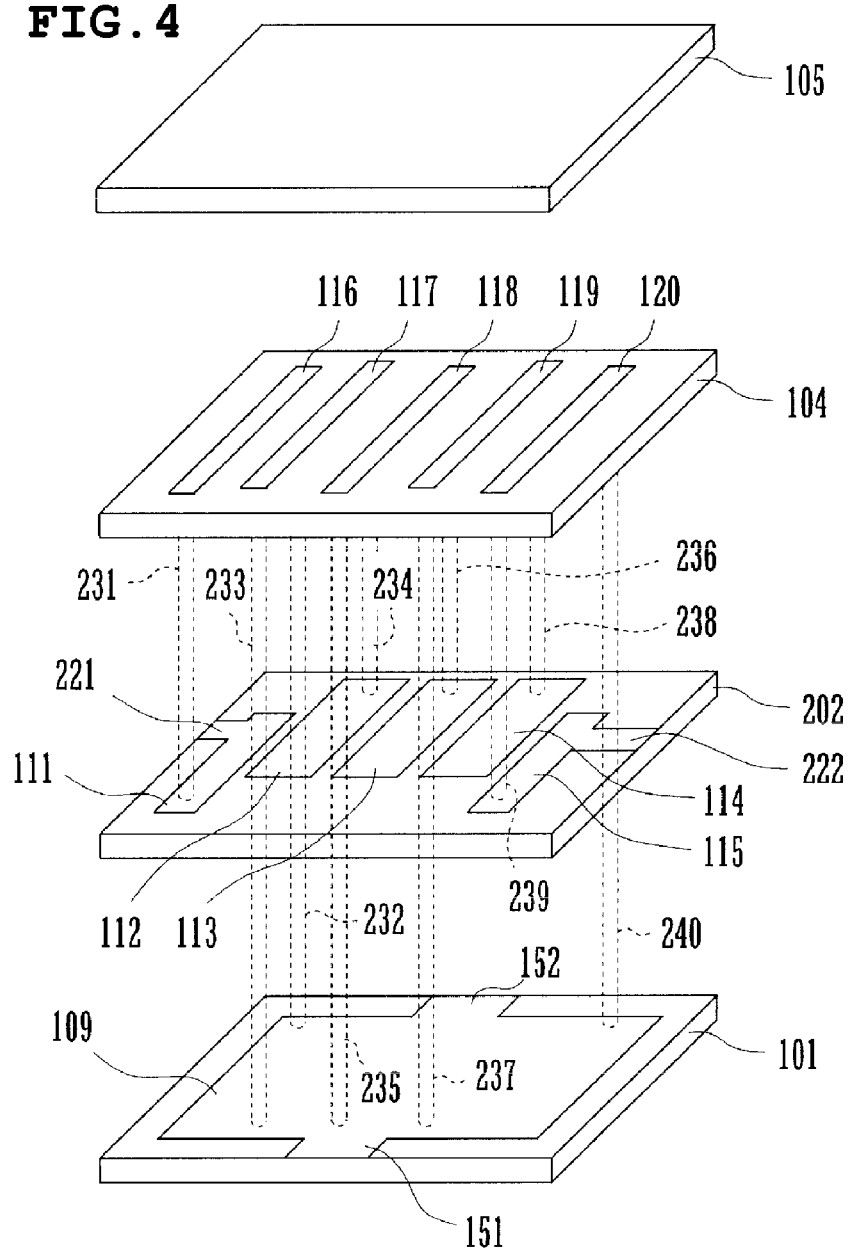
FIG. 4 is an exploded perspective view of a multilayer bandpass filter according to a second preferred embodiment of the present invention.

FIG. 4 is an exploded perspective view of a multilayer bandpass filter according to a second preferred embodiment of the present invention. FIG. 4 is represented in a similar manner to FIG. 2A for convenience of comparison therewith. In FIG. 4, similar parts to those in FIG. 2A are denoted by similar reference numerals.

The multilayer bandpass filter according to the second preferred embodiment is different from that according to the first preferred embodiment in the manner of extending input/output electrodes and the polarity of inductive coupling between adjacent LC parallel resonators.

The multilayer bandpass filter according to this second preferred embodiment is in the form of a multilayer structure including a ground electrode formation layer 101, a capacitor electrode formation layer 202, a line electrode formation layer 104, and an external layer 105.

A ground electrode 109 and ground connection electrodes 151 and 152 are provided in the ground electrode formation layer 101. Five capacitor electrodes 111 to 115 preferably are provided in the capacitor electrode formation layer 202. In this capacitor electrode formation layer 202, input/output electrodes 221 and 222 are arranged such that one end thereof is electrically connected to the capacitor electrode 111 or 115, and the other end thereof extends to either end of the capacitor electrode formation layer 202. In the line electrode formation layer 104, five line electrodes 116 to 120 are provided.

A via-electrode 231 is electrically connected to the capacitor electrode 111 and one end of the line electrode 116, and a via-electrode 232 is electrically connected to the other end of the line electrode 116 and to the ground electrode 109. A via-electrode 233 is electrically connected to the ground electrode 109 and one end of the line electrode 117, and a via-electrode 234 is electrically connected to the other end of the line electrode 117 and to the capacitor electrode 112. A via-electrode 235 is electrically connected to the ground electrode 109 and one end of the line electrode 118, and a via-electrode 236 is electrically connected to the other end of the line electrode 118 and to the capacitor electrode 113. A via-electrode 237 electrically connected to the ground electrode 109 and one end of the line electrode 119, and a via-electrode 238 is electrically connected to the other end of the line electrode 119 and to the capacitor electrode 114. A via-electrode 239 is electrically connected to one end of the line electrode 120 and to the capacitor electrode 115, and a via-electrode 240 is electrically connected to the other end of the line electrode 120 and to the ground electrode 109.

Thus, inductor electrodes are defined by the respective via-electrodes and line electrodes in loop directions as shown below in Table 2.

TABLE 2

| Inductor electrode | via-electrode | Line electrode | Loop direction |
|---|---|---|---|
| First | 231, 232 | 116 | 1 |
| Second | 233, 234 | 117 | 0 |
| Third | 235, 236 | 118 | 0 |
| Fourth | 237, 238 | 119 | 0 |
| Fifth | 239, 240 | 120 | 1 |

As shown in Table 2, the inductor electrode (the first inductor electrode) of the LC parallel resonator closest to the input terminal has a loop direction opposite to that of the inductor electrode (the second inductor electrode) of the immediately adjacent LC parallel resonator. Similarly, the inductor electrode (the fifth inductor electrode) of the LC parallel resonator closest to the output terminal has a loop direction opposite to that of the inductor electrode (the fourth inductor electrode) of the immediately adjacent LC parallel resonator. The loop direction of the third inductor electrode is the same as the loop directions of the second and fourth inductor electrodes. Thus, in this bandpass filter, coupling polarities among the LC parallel resonators can be represented as <10001>.

The ripple in the passband is suppressed as a result of the above-described configuration of the bandpass filter, that is, as a result of the opposite inductor electrode loop direction between adjacent LC parallel resonators in particular between the LC parallel resonator at the input side or the output side and the adjacent LC parallel resonator coupled with it.

Third Preferred Embodiment

A multilayer bandpass filter according to a third preferred embodiment of the present invention is described below with reference to FIGS. 5 to 9B.

Figure 5:
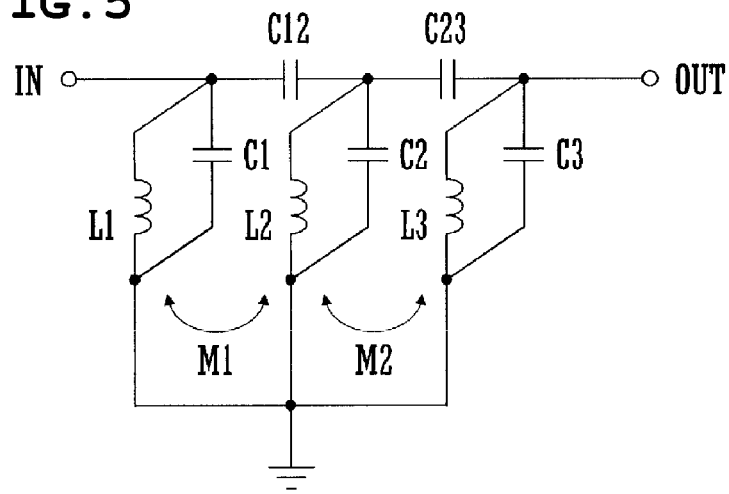
FIG. 5 is an equivalent circuit diagram of a multilayer bandpass filter according to a third preferred embodiment of the present invention.

In this third preferred embodiment, the multilayer bandpass filter includes three LC parallel resonators, and its equivalent circuit is represented as shown in FIG. 5. In the first and second preferred embodiments described above, five (five stages of) LC parallel resonators are coupled. In the third preferred embodiment, each inductor electrode includes two via-electrodes and one line electrode.

FIGS. 6A to 9B show dependence of the characteristics of the three-stage multilayer bandpass filter configured in the above-described manner on polarities of inductive coupling between adjacent LC parallel resonators, that is, on the loop directions of the inductor electrodes. That is, FIGS. 6A to 9B show transfer characteristics (S21 of S parameters) for respective configurations in terms of the coupling polarity, wherein FIGS. 6A, 7A, 8A, and 9A of these figures show the characteristic over a wide range including the passband and upper and lower attenuation bands adjacent to the passband, and FIGS. 6B, 7B, 8B, and 9B of the figures show details of the characteristic of the passband.

Figure 6A:
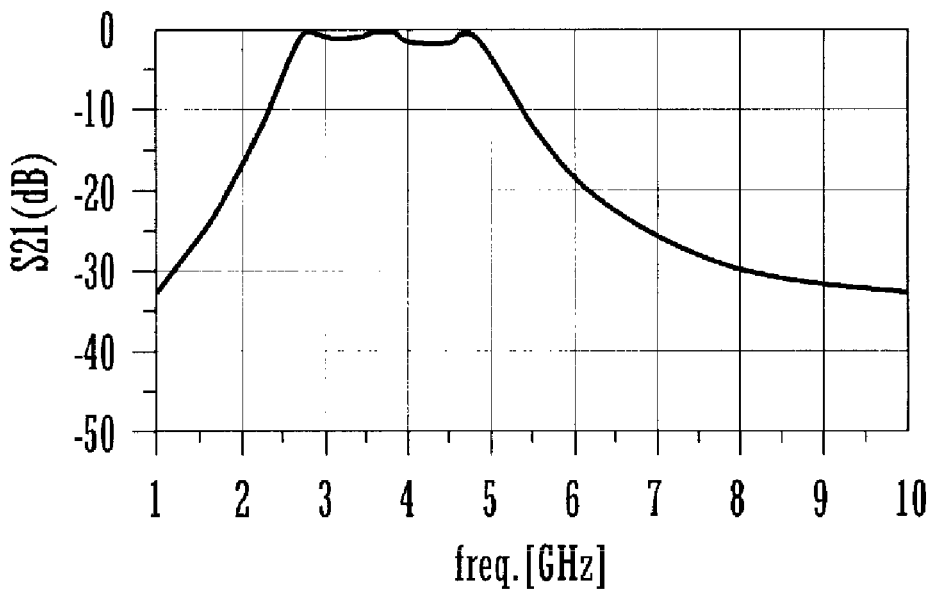
FIGS. 6A and 6B show transfer characteristics obtained when the filter is configured such that LC parallel resonators are inductively coupled so as to have a sequence of polarities of <101>.
Figure 6B:
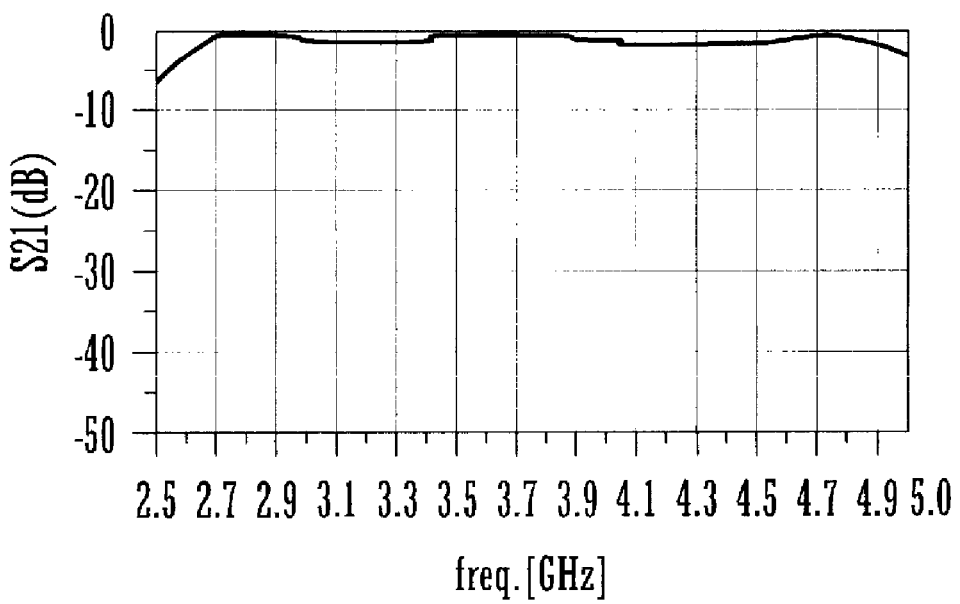

FIGS. 6A and 6B show the characteristic of a 3-stage multilayer bandpass filter in which three LC parallel resonators are coupled so as to have a sequence of polarities of <101>, that is, the LC parallel resonator closest to the input terminal and the second-stage LC parallel resonator have negative inductive coupling, and the second LC parallel resonator and the LC parallel resonator closest to the output terminal have negative inductive coupling. The multilayer bandpass filter of this example has a passband of about 2.7 GHz to about 4.8 GHz in which there is a small ripple.

Figure 7A:
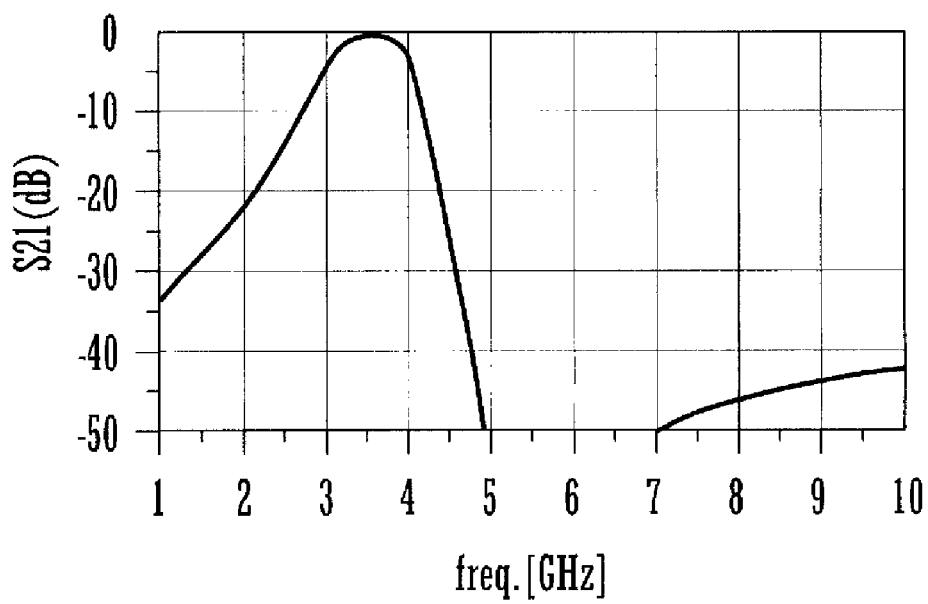
FIGS. 7A and 7B show transfer characteristics obtained when the filter is configured such that LC parallel resonators are inductively coupled so as to have a sequence of polarities of <111>.
Figure 7B:
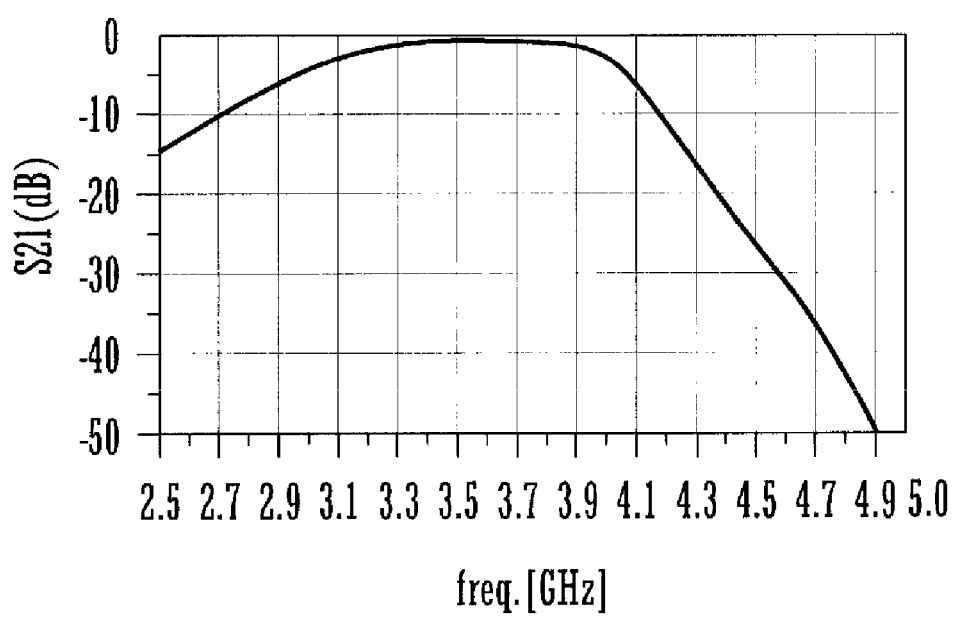

FIGS. 7A and 7B show an example of a characteristic obtained when the multilayer bandpass filter whose characteristic is shown in FIGS. 6A and 6B is modified such that the coupling polarity becomes the same (<111>) for all LC parallel resonators while maintaining the inductance of the inductor electrodes and the capacitance of the capacitor electrodes. As shown in FIGS. 7A and 7B, this example has a passband of about 3.2 to about 4.0 GHz, that is, the above modification of the configuration produces a reduced width of the passband.

Figure 8A:
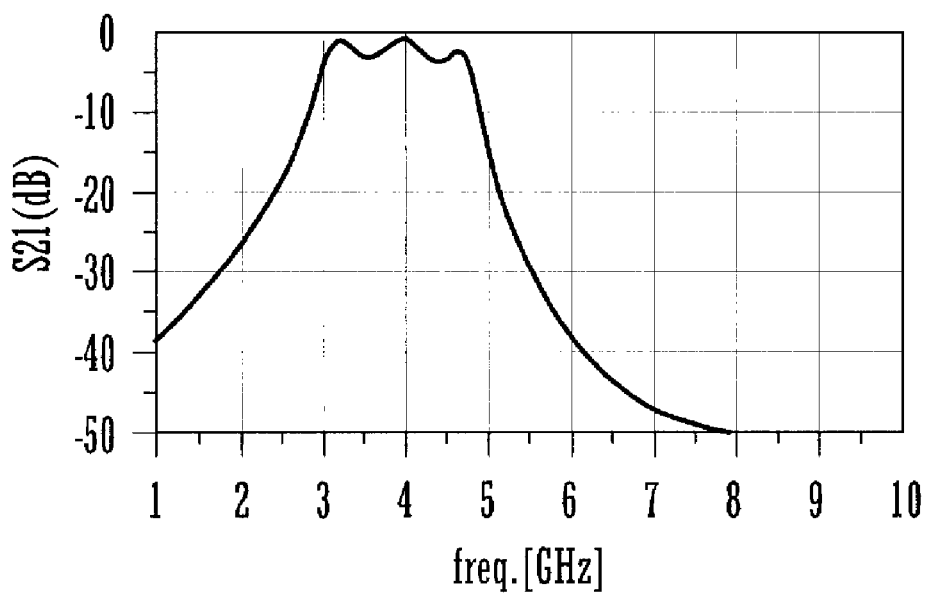
FIGS. 8A and 8B show transfer characteristics obtained when the filter is configured such that LC parallel resonators are inductively coupled so as to have a sequence of polarities of <111> and an adjustment is made so as to obtain a desired passband.
Figure 8B:
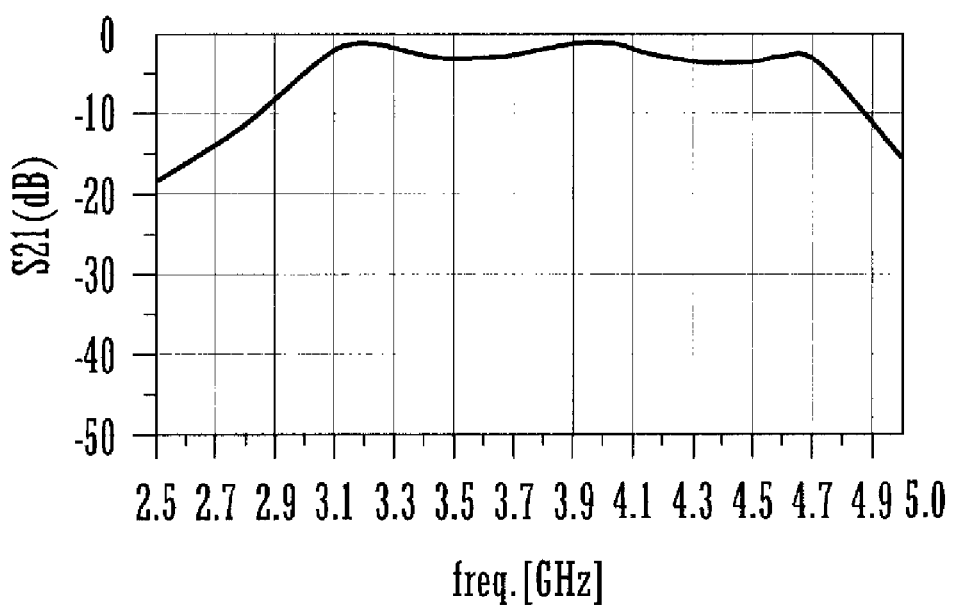

FIGS. 8A and 8B show an example of a characteristic obtained by adjusting the inductance and the capacitance of the three LC parallel resonators so as to obtain a passband of about 3.0 to about 4.8 GHz while maintaining the coupling polarities of the three (three-stage) LC parallel resonators in <111>. As shown in FIGS. 8A and 8B, a large ripple occurs in the passband, and an increase occurs in the insertion loss over the entire range of the passband.

Figure 9A:
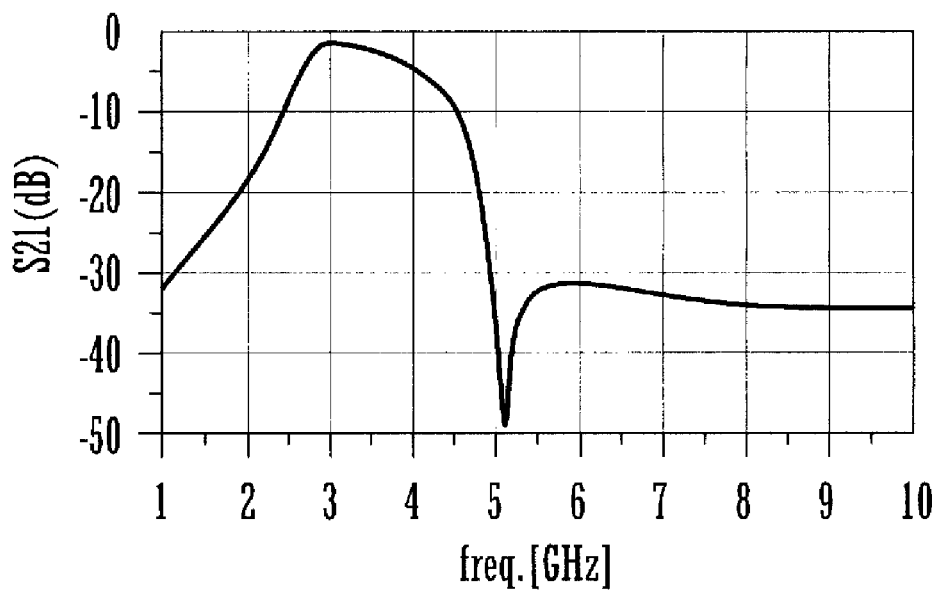
FIGS. 9A and 9B show transfer characteristics obtained when the filter is configured such that LC parallel resonators are inductively coupled so as to have a sequence of polarities of <110>.
Figure 9B:
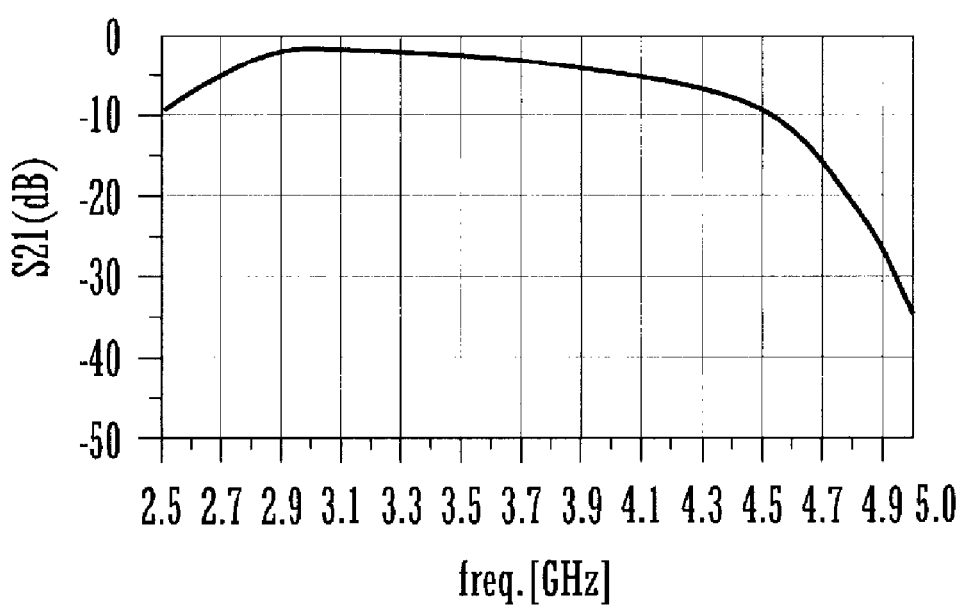

FIGS. 9A and 9B show an example of a characteristic obtained when the three (three stages of) LC parallel resonators are coupled so as to have a polarity sequence of <110>. Compared with the configuration with the polarity sequence of <101> shown in FIGS. 6A and 6B, an attenuation pole occurs close to an upper edge of a passband, which allows it to obtain a low insertion loss over the entire passband although the width of the passband is not very large, and steep attenuation is obtained at the upper edge of the passband.

As described above, by configuring the LC parallel resonators such that loop directions of inductor electrodes are opposite between adjacent LC parallel resonators coupled with each other, it is possible to obtain a low insertion loss over a wide band.

Fourth Preferred Embodiment

Figure 10:
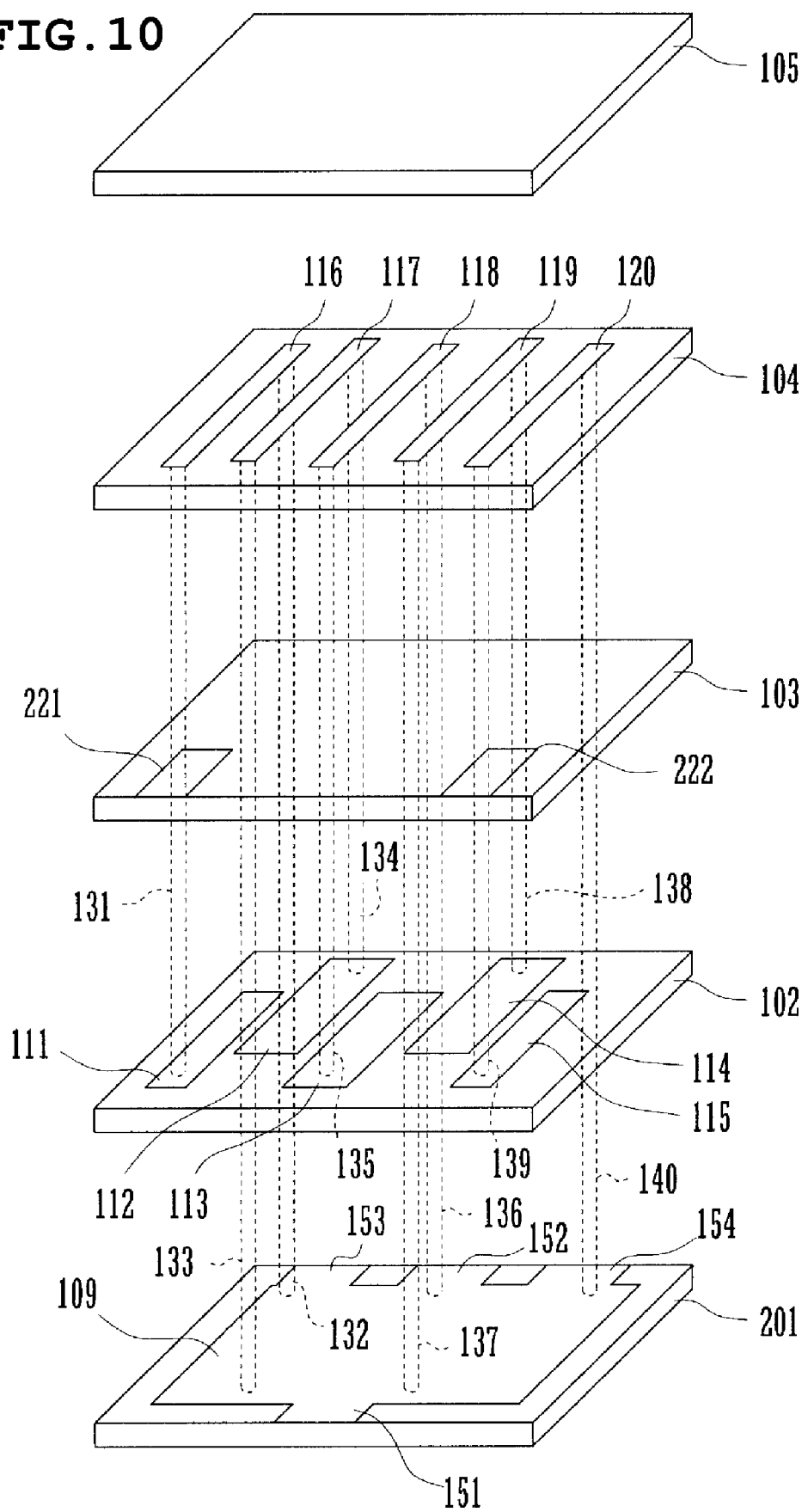
FIG. 10 is an exploded perspective view of a multilayer bandpass filter according to a fourth preferred embodiment of the present invention.
Figure 11:
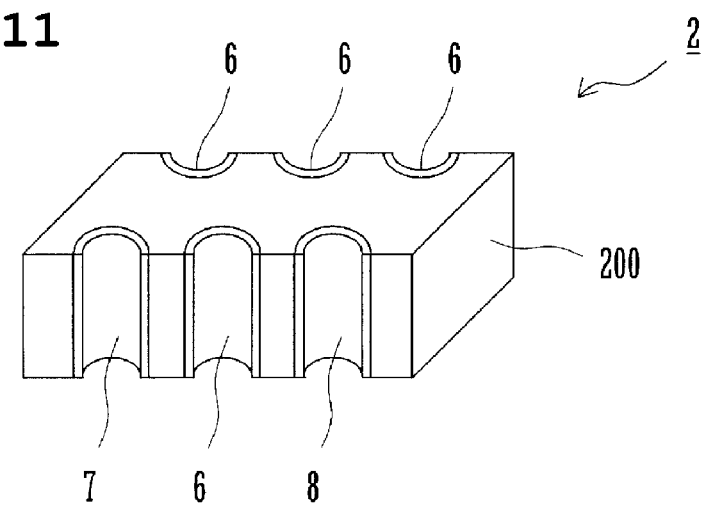
FIG. 11 is an external perspective view of the multilayer bandpass filter according to the fourth preferred embodiment of the present invention.

FIG. 10 is an exploded perspective view of a multilayer bandpass filter according to a fourth preferred embodiment, and FIG. 11 is a perspective view thereof.

This multilayer bandpass filter is different from that according to the first preferred embodiment described above with reference to FIGS. 2A and 2B in that the input/output electrodes, the ground connection electrodes, the input/output terminals, and the ground terminal are disposed at locations different from those according to the first preferred embodiment of the present invention.

In FIG. 10, for convenience of comparison with FIG. 2A, similar parts to those in FIG. 2A are denoted by similar reference numerals. This multilayer bandpass filter is configured in the form of a multilayer structure 200 including a ground electrode formation layer 201, a capacitor electrode formation layer 102, an input/output electrode formation layer 103, a line electrode formation layer 104, and an external layer 105. Input/output terminals and a ground terminal are formed on the multilayer structure 200.

A ground electrode 109 and ground connection electrodes 151 to 154 are provided in the ground electrode formation layer 201. Of these ground connection electrodes, the ground connection electrode 151 extends to the middle of a long side of the ground electrode formation layer 201, and the other three ground connection electrodes 152 to 154 extend to the other long side. Capacitor electrodes 111 to 115 are provided in the capacitor electrode formation layer 102. Input/output electrodes 221 and 222 are provided in the input/output electrode formation layer 103. In the example shown in FIG. 2A, the two input/output electrodes extend to short sides of the input/output electrode formation layer 103. In contrast, in the example shown in FIG. 10, the input/output electrodes 221 and 222 extend to the same long side. Line electrodes 116 to 120 are provided in the line electrode formation layer 104.

A via-electrode 131 is electrically connected to the capacitor electrode 111 and one end of the line electrode 116. The via-electrode 131 is also electrically connected to the input/output electrode 221 in the middle of the via-electrode 131. A via-electrode 139 is electrically connected to the capacitor electrode 115 and one end of the line electrode 120. The via-electrode 139 is also electrically connected to the input/output electrode 222 in the middle of the via-electrode 139.

An equivalent circuit of the multilayer bandpass filter according to the fourth preferred embodiment is similar to that shown in FIG. 3A except that the input terminal IN is connected to the middle of the inductor L1, and the output terminal OUT is connected to the middle of the inductor L5.

In this configuration, because the ground connection electrode 151 is disposed between the two input/output electrodes 221 and 222, and the ground terminal 6 is disposed between the input/output terminals 7 and 8, an undesirable by-path between the input terminal and the output terminal is eliminated. Furthermore, use of via-electrodes for electrical connections between capacitor electrodes and line electrodes makes it possible to arbitrarily change the location where which the input/output electrode extends from the inductor electrode. This makes it possible to obtain arbitrary input/output impedance.

Fifth Preferred Embodiment

Figure 12:
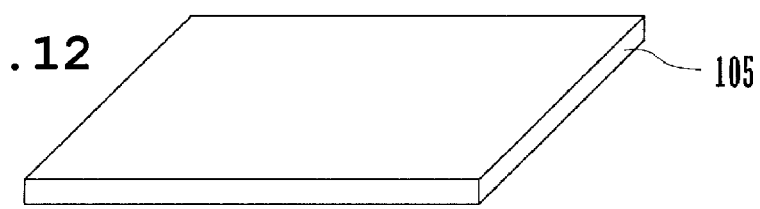
FIG. 12 is an exploded perspective view of a multilayer bandpass filter according to a fifth preferred embodiment of the present invention.
Figure 12:
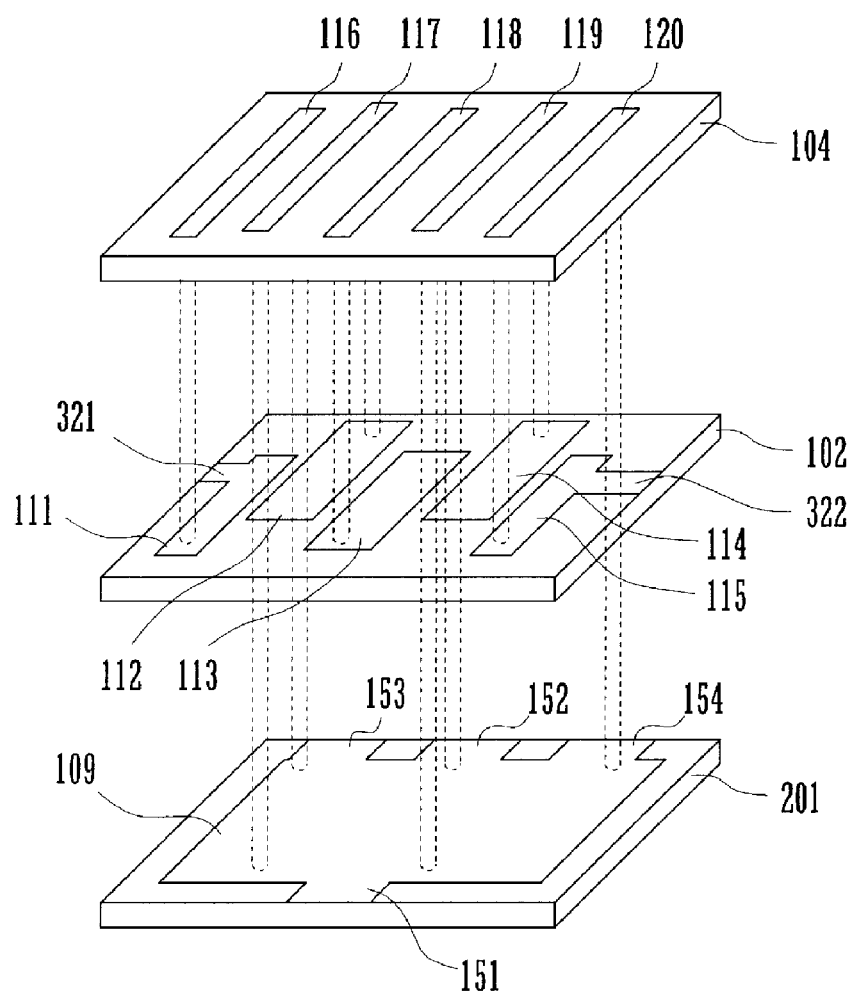
Figure 13:
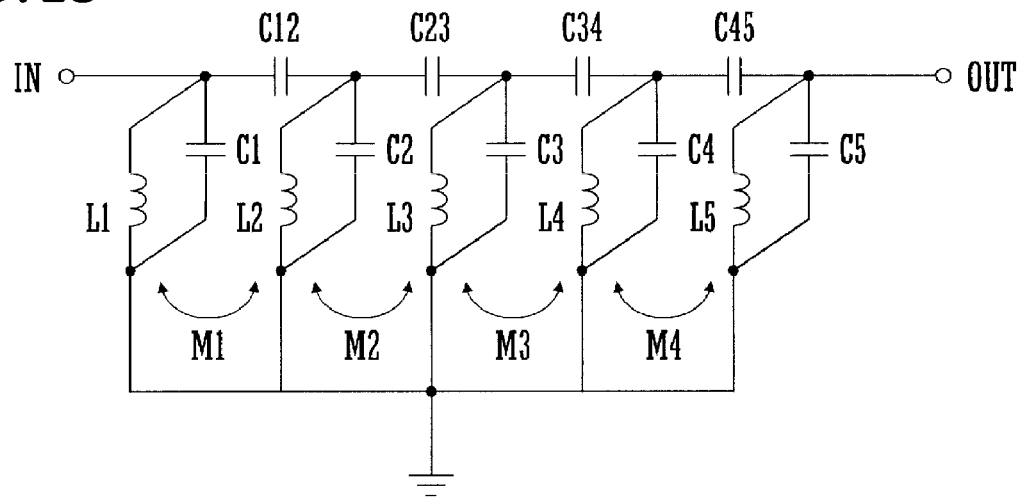
FIG. 13 shows an equivalent circuit of the multilayer bandpass filter according to the fifth preferred embodiment of the present invention.

FIG. 12 is an exploded perspective view of a multilayer bandpass filter according to a fifth preferred embodiment of the present invention, and FIG. 13 shows an equivalent circuit thereof.

In this example, four ground connection electrodes 151 to 154 extend from a ground electrode 109. In a capacitor electrode formation layer 102, capacitor electrodes 111 to 115 are provided, and input/output electrodes 321 and 322 are also arranged in this layer so as to be electrically connected to the capacitor electrode 111 or 115. Thus, in this example, there is no element corresponding to the input/output electrode formation layer 103 shown in FIG. 2A. In this example, the other elements are configured in a similar manner to those according to the first preferred embodiment of the present invention.

The equivalent circuit shown in FIG. 13 is similar to that shown in FIG. 3A. However, electrical characteristics are slightly different because, in the configuration shown in FIG. 2A, the input/output via-electrodes 141 and 142 are disposed between the input/output electrodes 121 and 122 and the capacitor electrodes 111 and 115.

Sixth Preferred Embodiment

Figure 14:
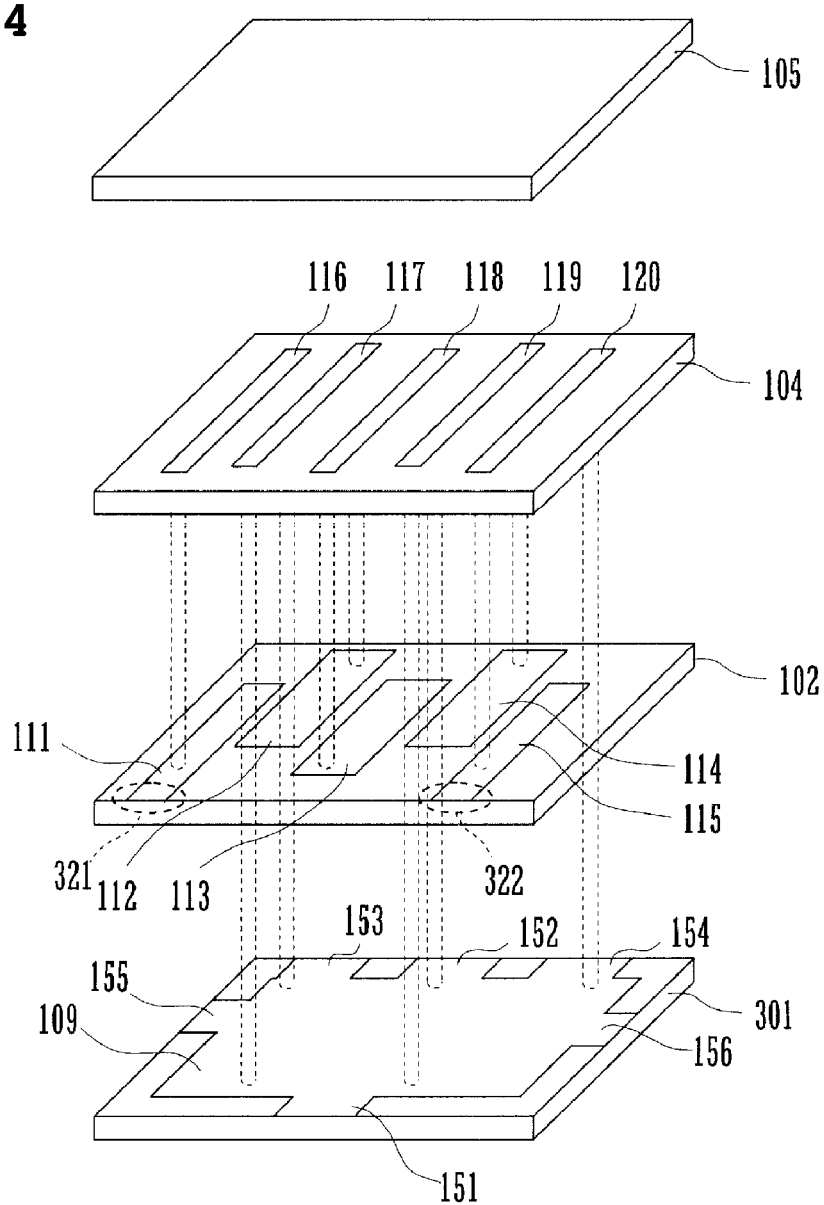
FIG. 14 is an exploded perspective view of a multilayer bandpass filter according to a sixth preferred embodiment of the present invention.
Figure 15:
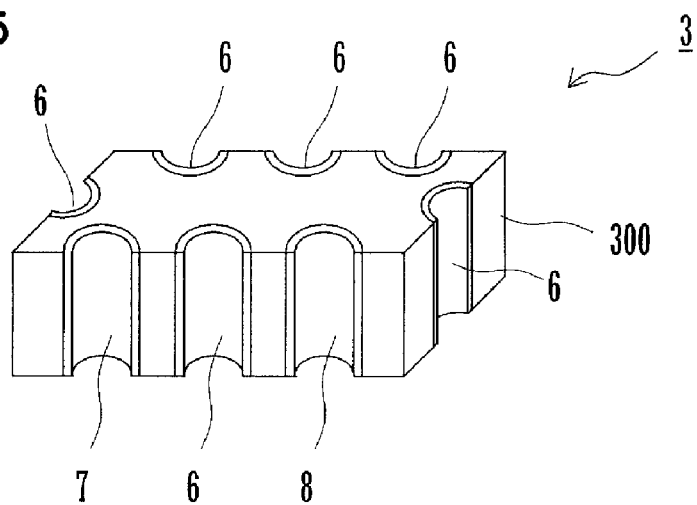
FIG. 15 is an external perspective view of the multilayer bandpass filter according to the sixth preferred embodiment of the present invention.

FIG. 14 is an exploded perspective view of a multilayer bandpass filter according to a sixth preferred embodiment of the present invention, and FIG. 15 is a perspective view thereof.

In this example, six ground connection electrodes 151 to 156 extend from a ground electrode 109. In a capacitor electrode formation layer 102, capacitor electrodes 111 to 115 are provided, and input/output electrodes 321 and 322 are also provided in this layer so as to continuously extend from the capacitor electrode 111 or 115. In this example, the other elements are configured in a similar manner to those according to the fifth preferred embodiment. This configuration allows the input/output electrodes 321 and 322 to be disposed at desired locations.

Seventh Preferred Embodiment

Figure 16:
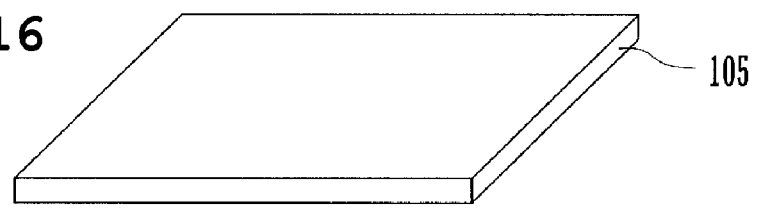
FIG. 16 is an exploded perspective view of a multilayer bandpass filter according to a seventh preferred embodiment of the present invention.
Figure 16:
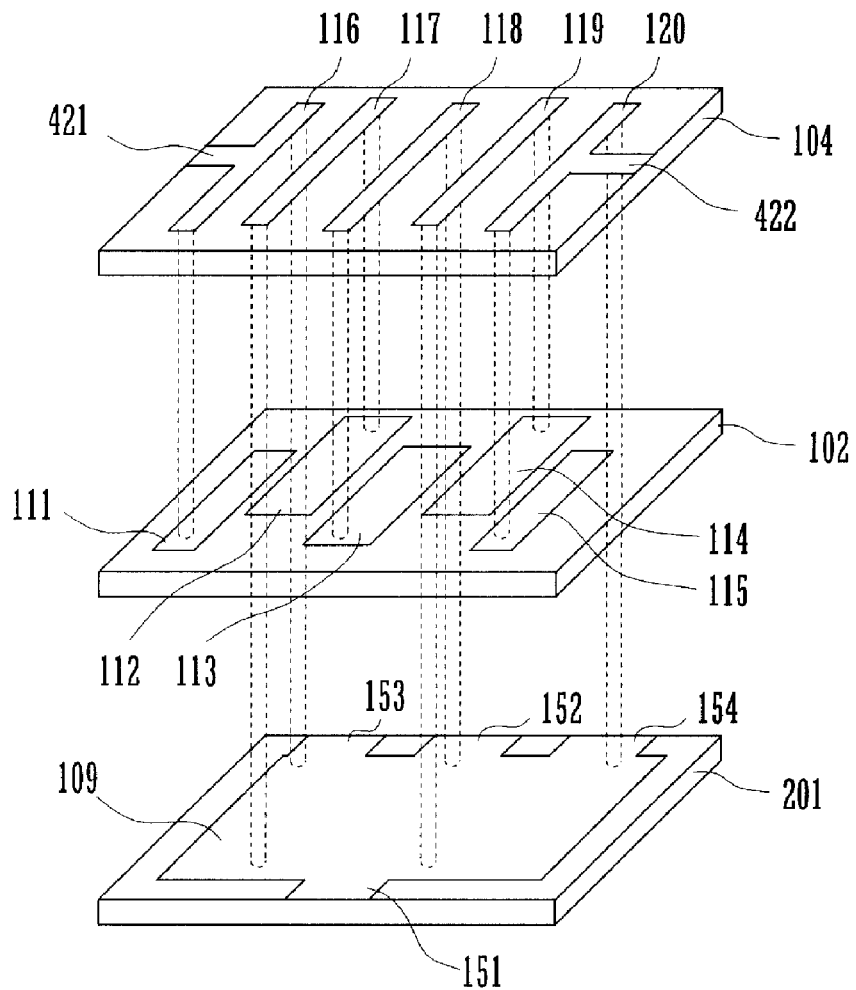
Figure 17:
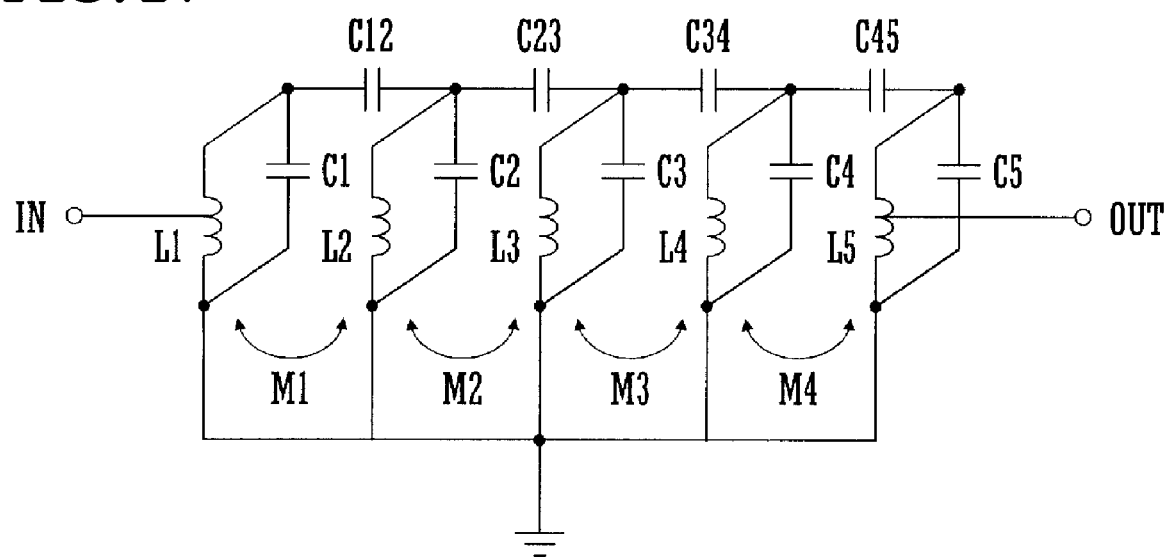
FIG. 17 shows an equivalent circuit of the multilayer bandpass filter according to the seventh preferred embodiment of the present invention.

FIG. 16 is an exploded perspective view of a multilayer bandpass filter according to a seventh preferred embodiment of the present invention, and FIG. 17 is an equivalent circuit diagram thereof.

In a line electrode formation layer 104, line electrodes 116 to 120 are provided. Furthermore, in this line electrode formation layer 104, input/output electrodes 421 and 422 are also connected so as to be electrically connected to the line electrode 116 or 120. In this configuration, because the input/output electrodes 421 and 422 are provided in the line electrode formation layer 104, a dielectric layer dedicated to the input/output electrodes is not required. FIG. 17 shows an equivalent circuit of this multilayer bandpass filter in which the input/output electrodes 421 are 422 extend from the middle of line electrode 116 or 120.

The input/output impedance of the LC parallel resonator at the input end or the output end can be adjusted by properly determining the location where the input/output electrodes 421 and 422 respectively extend from the line electrodes 116 and 120.

Eighth Preferred Embodiment

Figure 18:
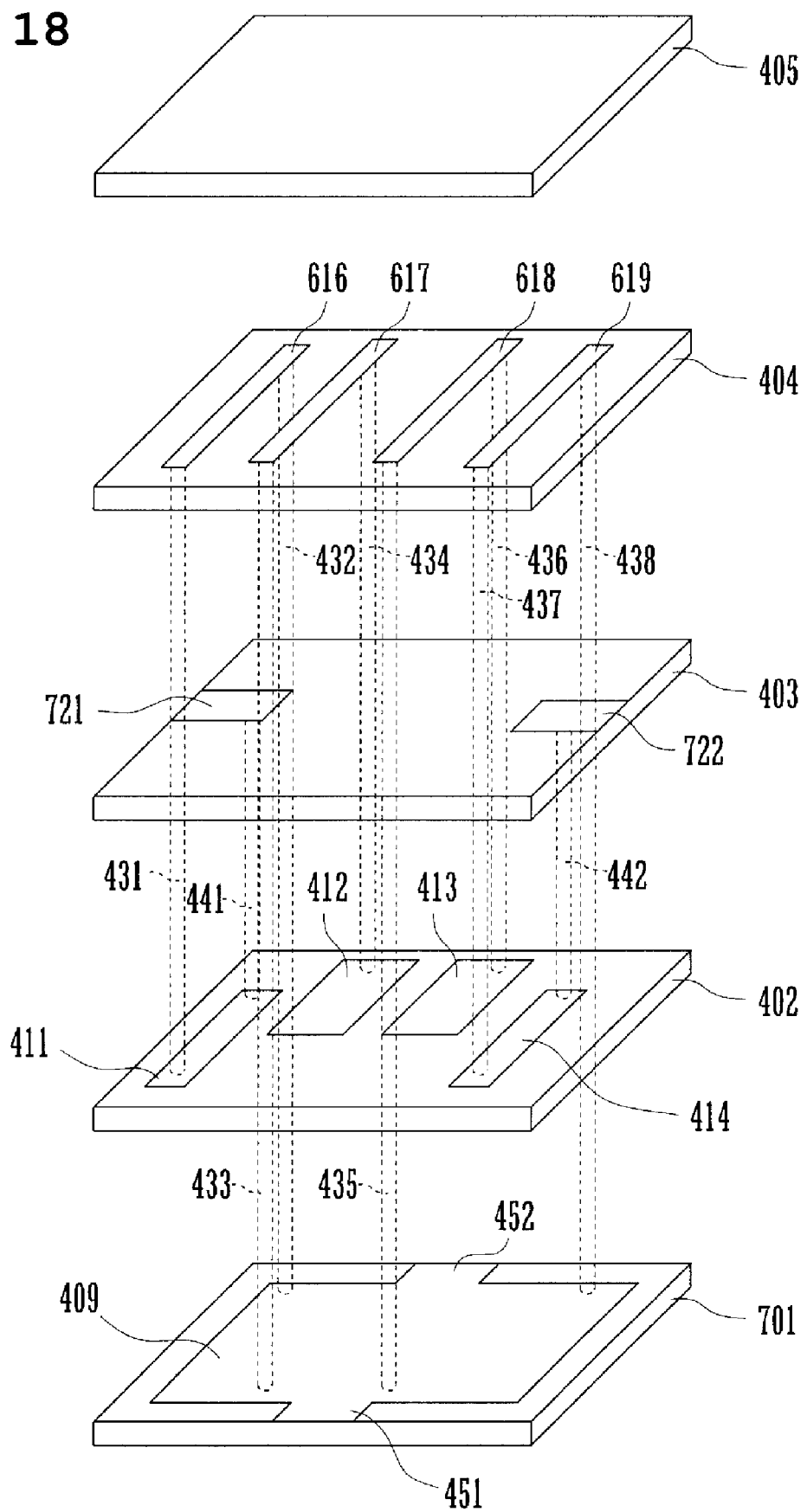
FIG. 18 is an exploded perspective view of a multilayer bandpass filter according to an eighth preferred embodiment of the present invention.

FIG. 18 is an exploded perspective view of a multilayer bandpass filter according to an eighth preferred embodiment. This multilayer bandpass filter is substantially similar in configuration to that shown in FIG. 2A, except that this multilayer bandpass filter does not include the third inductor electrode and the capacitor electrode 113, and shapes, dimensions, and locations of the line electrodes 216 to 220 in the line electrode formation layer 104 are different from those shown in FIG. 2A. The inductance of the LC parallel resonators and coupling strength between adjacent LC parallel resonators can be determined by properly determining shapes, dimensions, and locations of the line electrodes 216 to 220.

This multilayer bandpass filter is configured in the form of a multilayer structure including a ground electrode formation layer 701, a capacitor electrode formation layer 402, an input/output electrode formation layer 403, a line electrode formation layer 404, and an external layer 405. Input/output terminals and a ground terminal are formed on end surfaces of the multilayer structure.

As shown in FIG. 18, input/output electrodes 721 and 722 are provided in the input/output electrode formation layer 403.

Capacitor electrodes 411, 412, 413, and 414 are arranged in the capacitor electrode formation layer 402 so as to oppose the ground electrode 409.

A via-electrode 441 is electrically connected to the input/output electrode 721 and the capacitor electrode 411, and a via-electrode 442 is electrically connected to the input/output electrode 722 and the capacitor electrode 414.

A via-electrode 431 is electrically connected to the capacitor electrode 411 and one end of the line electrode 616, and a via-electrode 432 is electrically connected to the other end of the line electrode 616 and to the ground electrode 409. A via-electrode 433 is electrically connected to the ground electrode 409 and one end of the line electrode 617, and a via-electrode 434 is electrically connected to the other end of the line electrode 617 and to the capacitor electrode 412. A via-electrode 435 is electrically connected to the ground electrode 409 and one end of the line electrode 618, and a via-electrode 436 is electrically connected to the other end of the line electrode 618 and to the capacitor electrode 413. A via-electrode 437 is electrically connected to the capacitor electrode 414 and one end of the line electrode 619, and a via-electrode 438 is electrically connected to the other end of the line electrode 619 and to the ground electrode 409.

The four LC parallel resonators are coupled so as to have a sequence of polarities of <1001>.

Figures 19, 20:
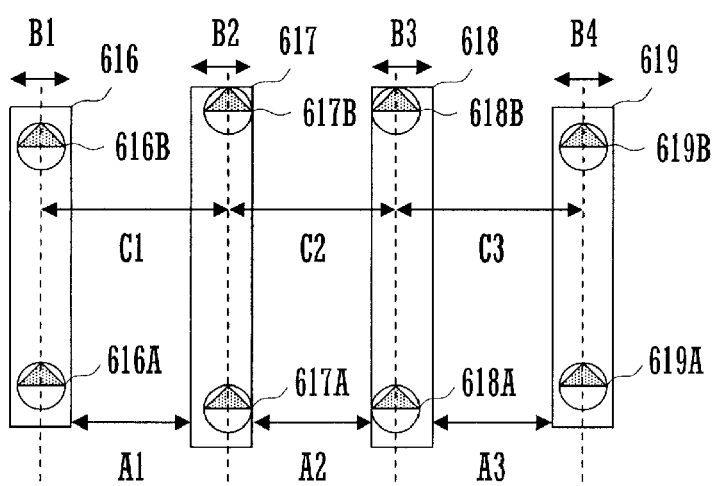
FIG. 19 is a plan view of a line electrode formation layer of the multilayer bandpass filter according to the eighth preferred embodiment of the present invention.
FIG. 20 shows three examples in terms of dimensions of respective line electrodes of the multilayer bandpass filter according to the eighth preferred embodiment of the present invention.

FIG. 19 shows relative positional relationships of line electrodes and via-electrodes electrically connected to line electrodes of the four-stage LC parallel resonator configuration.

In FIG. 19, A1 to A3 denote spaces between adjacent two of the line electrodes 616 to 619. B1 to B4 denote electrode widths of the respective line electrodes 616 to 619. C1 to C3 denote distances between via-electrodes as measured in a direction in which inductor electrodes are arranged.

FIG. 20 shows three examples of sets of dimensions of the respective parts described above, and FIGS. 21A-21C show transfer characteristics (S21 of S parameters) and reflection characteristics (S11 of S parameter) of each of the three bandpass filters. In order to obtain symmetry in an input-output direction, dimensions are set such that A1=A3, C1=C3, B1=B4, and B2=B3.

The dimensions of the capacitor electrode 411 electrically connected to the line electrode 616 via the via-electrode 431 are substantially the same as those of the capacitor electrode 414 electrically connected to the line electrode 619 via the via-electrode 437, and the dimensions of the capacitor electrode 412 electrically connected to the line electrode 617 via the via-electrode 434 are substantially the same as those of the capacitor electrode 413 electrically connected to the line electrode 618 via the via-electrode 436. The dimensions of the capacitor electrodes 411 and 414 may or may not be equal to the dimensions of the capacitor electrodes 412 and 413.

Figure 21A:
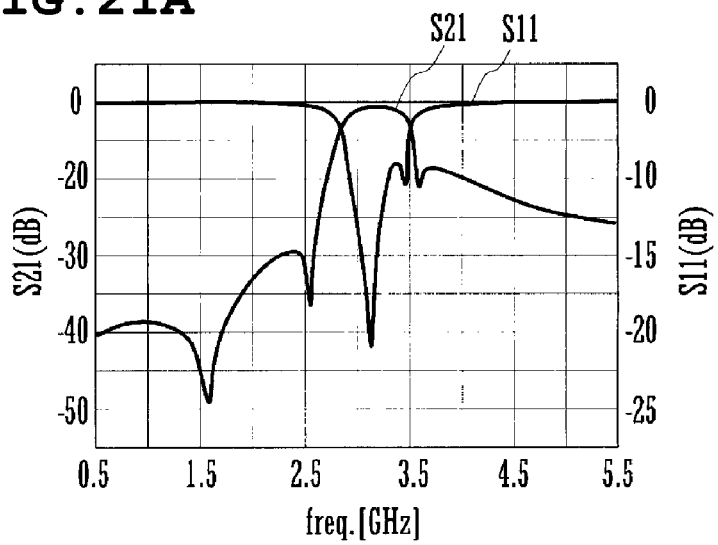
FIGS. 21A-21C show the characteristics of the multilayer bandpass filter for the three examples in terms of the dimensions of the line electrodes.
Figure 21B:
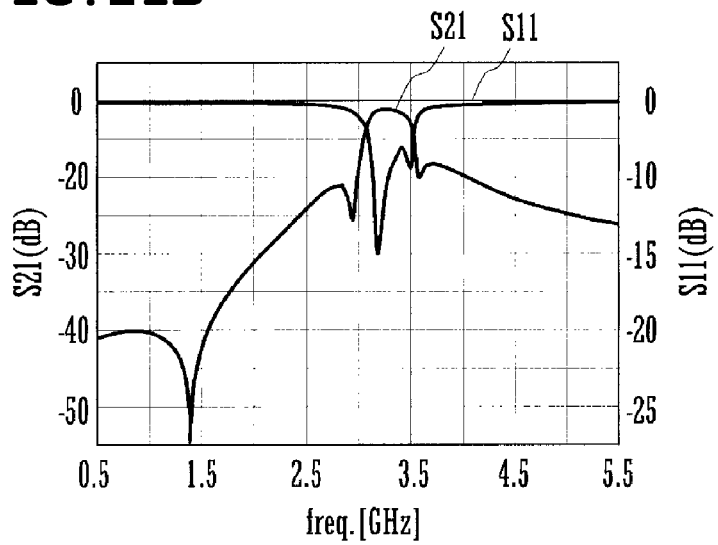
Figure 21C:
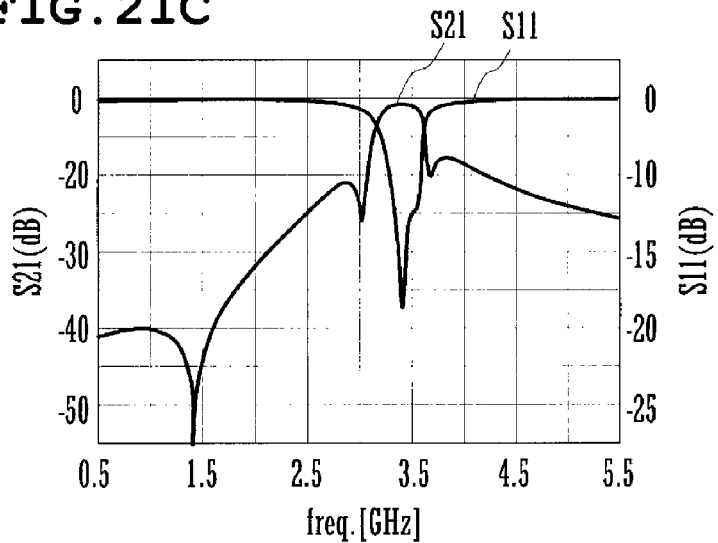

FIG. 21A shows a reference configuration (with which other configurations will be compared). In this specific example, the reference configuration (A) in FIG. 20 has a passband of about 2.8 GHz to about 3.5 GHz. FIG. 21B shows a configuration having a greater dimension for C2 than the reference configuration (A) has. In the configuration (B) in FIG. 20, the passband has a range of about 3.2 to about 3.5 GHz. That is, the passband has a smaller width compared with the reference configuration (A) in FIG. 20. On the other hand, a configuration (C) in FIG. 20 has a similar passband to that of the configuration (B) in FIG. 20, but the configuration (C) in FIG. 20 has a smaller ripple.

Ninth Preferred Embodiment

Figures 22, 23:
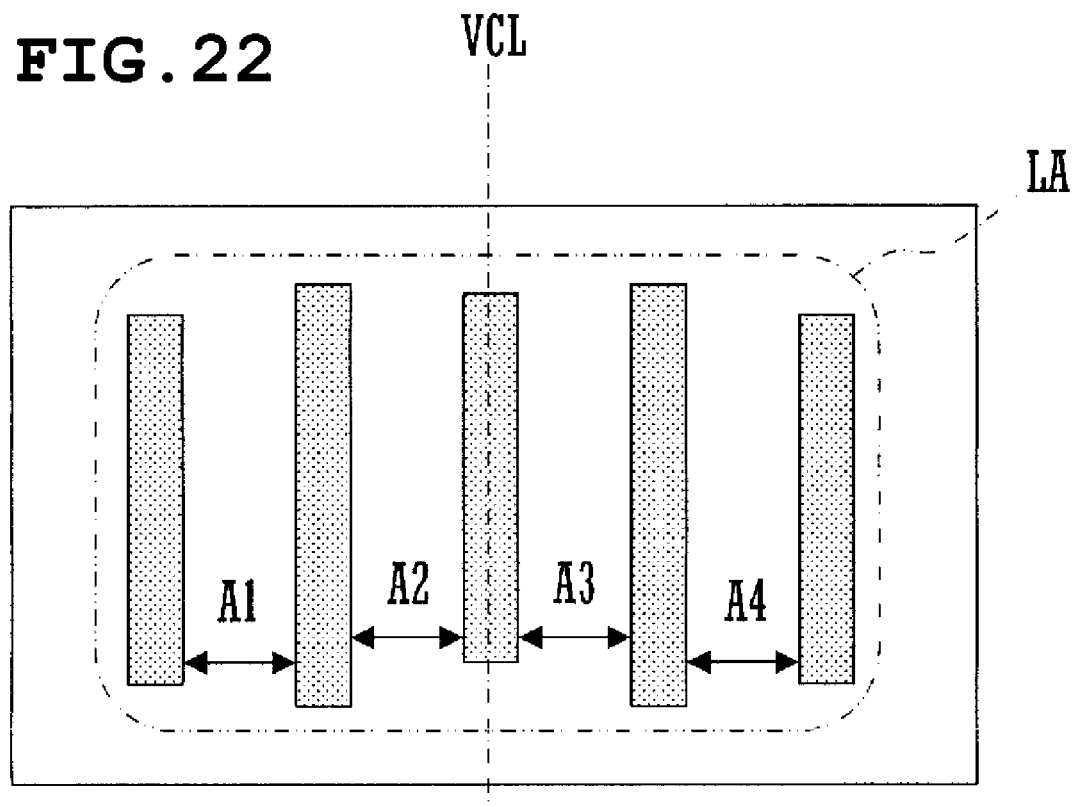
FIG. 22 is a plan view of a line electrode formation layer of a multilayer bandpass filter according to a ninth preferred embodiment of the present invention.
FIG. 23 shows four examples in terms of dimensions of respective line electrodes of the multilayer bandpass filter according to the ninth preferred embodiment of the present invention.

FIG. 22 is a plan view of a line electrode formation layer of a bandpass filter including five LC parallel resonators, in which A1 to A4 denote spaces between adjacent line electrodes. In FIG. 22, LA denotes an area in which the line electrodes are distributed. VLC denotes an imaginary center line passing through the center of the area LA and extending substantially parallel to the line electrodes. In the ninth preferred embodiment, the spaces A1 to A4 between adjacent line electrodes are varied to obtain various filter characteristics.

FIG. 23 shows four examples of sets of dimensions A1 to A4.

FIGS. 24A-24D show transfer characteristics of the filter for respective configurations A1 to A4 shown in FIG. 23. In all configurations, the dimensions A1 to A4 and the length and the width of the five line electrodes are determined such that symmetry about the imaginary center line VCL is obtained.

Figure 24A:
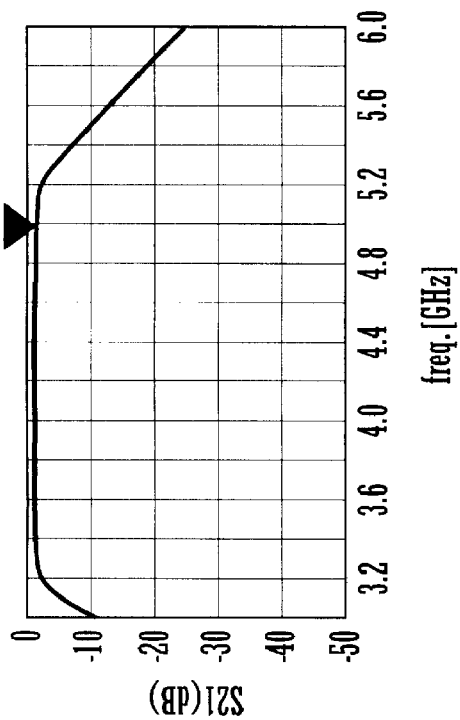
FIGS. 24A-24D show the characteristics of the multilayer bandpass filter for the four examples in terms of the dimensions of the line electrodes.
Figure 24B:
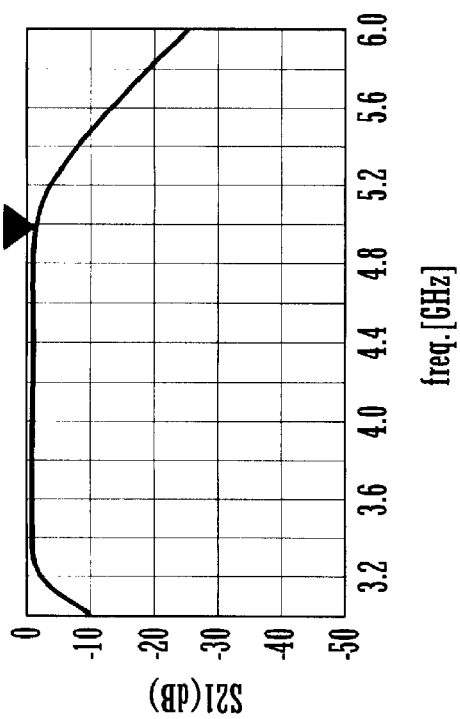

FIG. 24A shows a characteristic of the reference configuration (with which other configurations will be compared). In this specific example, the reference configuration (A) in FIG. 23 has a passband of about 3.2 GHz to about 5.0 GHz. If the dimensions A1 and A4 are increased and the dimensions A2 and A3 are reduced, the upper edge of the passband is moved to a higher frequency as shown in FIG. 24B.

Figure 24C:
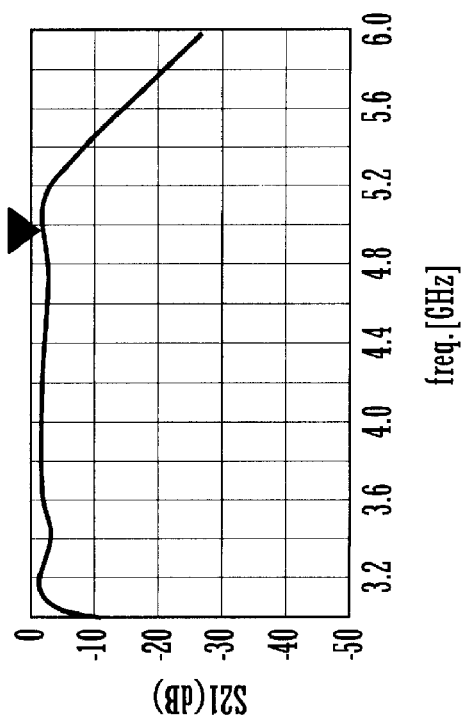
Figure 24D:
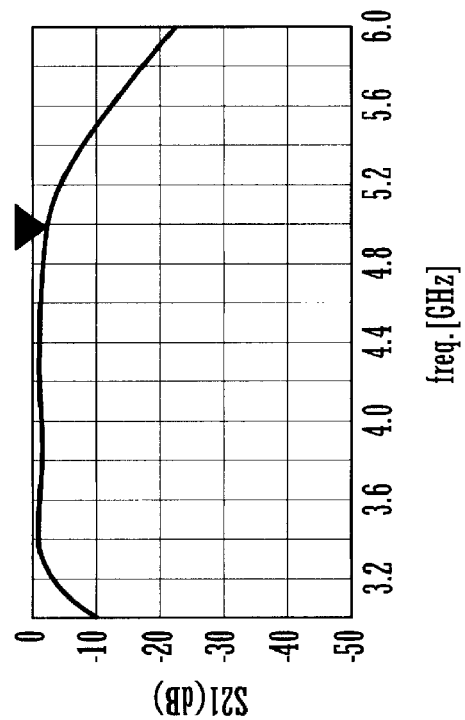

If the dimensions A1 to A4 are all increased, ripples in the passband are increased as shown in FIG. 24C. If the dimensions A1 and A4 are reduced and the dimensions A2 and A3 are increased, the lower edge of the passband is moved to a higher frequency and thus the passband is narrowed to about 3.3 to about 5.0 GHz as shown in FIG. 24D.

Tenth Preferred Embodiment

Figures 25, 26:
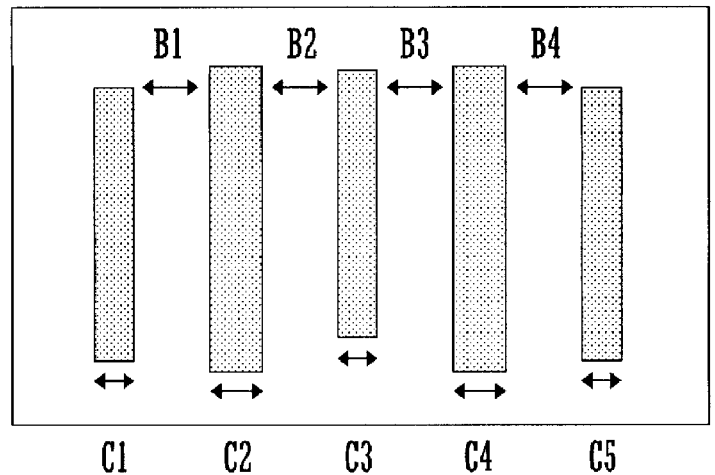
FIG. 25 is a plan view of a line electrode formation layer of a multilayer bandpass filter according to a tenth preferred embodiment of the present invention.
FIG. 26 shows seven examples in terms of dimensions of respective line electrodes of the multilayer bandpass filter according to the tenth preferred embodiment of the present invention.

FIG. 25 is a plan view of a line electrode formation layer of a bandpass filter including five LC parallel resonators, in which B1 to B4 denote spaces between adjacent line electrodes and C1 to C5 denote widths of the line electrodes. In the tenth preferred embodiment, the spaces B1 to B4 between adjacent line electrodes and the widths C1 to C5 are varied to obtain various filter characteristics.

Figure 27A:
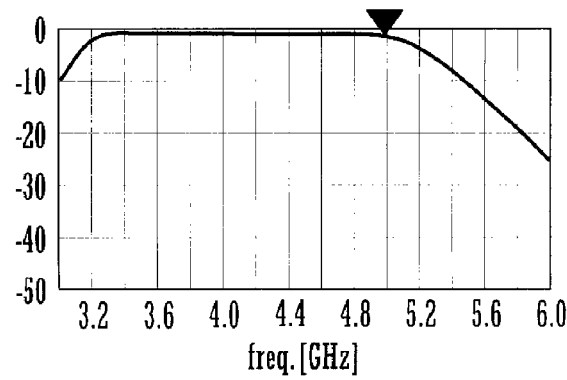
FIGS. 27A-27G show the characteristics of the multilayer bandpass filter for the seven examples in terms of the dimensions of the line electrodes.

FIG. 26 shows seven examples of sets of dimensions B1 to B4 and C1 to C5. FIGS. 27A-27G show transfer characteristics of the filter for the seven respective configurations shown in FIG. 26. FIG. 27A shows a characteristic of the reference configuration (with which other configurations will be compared). In this specific example, the reference configuration (A) has a passband of about 3.2 GHz to about 5.0 GHz.

Figure 27B:
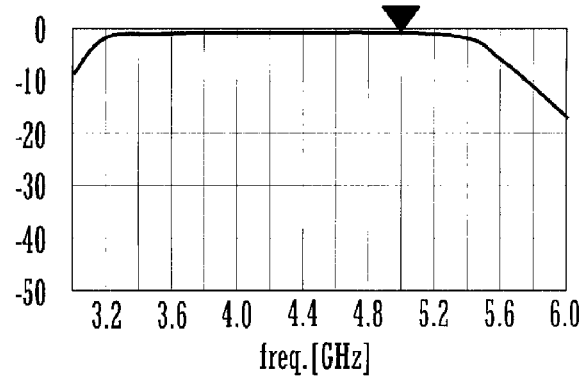

If the dimensions B2 and B3 are reduced and the dimensions C2 and C4 are increased from those of the reference configuration (A), the upper edge of the passband is moved to a higher frequency as shown in FIG. 27B.

Figure 27C:
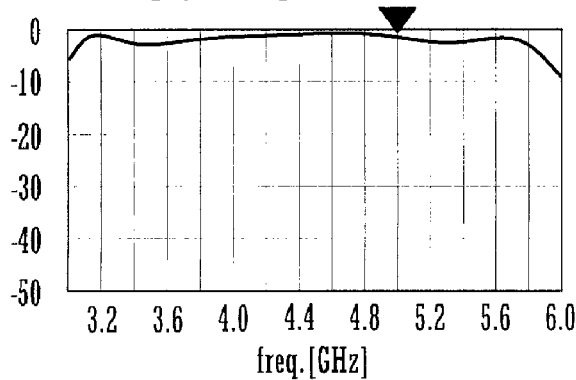

If the dimensions B2 and B3 are further reduced and the dimensions C2 and C4 are further increased from those of the configuration (B), the upper edge of the passband is moved to a still higher frequency and ripples in the passband increase as shown in FIG. 27C.

Figure 27D:
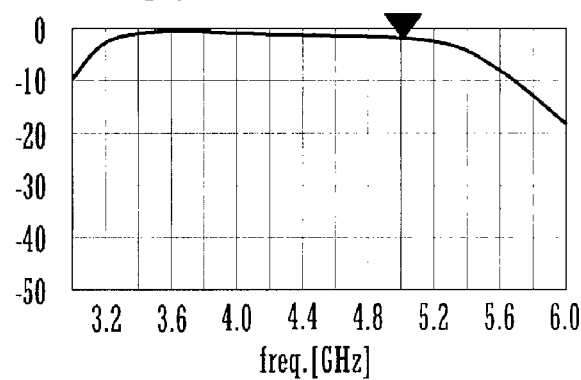

If the dimensions B1 and B4 are reduced and the dimensions C2 and C4 are increased from those of the reference configuration (A), the upper edge of the passband is moved to a higher frequency as shown in FIG. 27D.

Figure 27E:
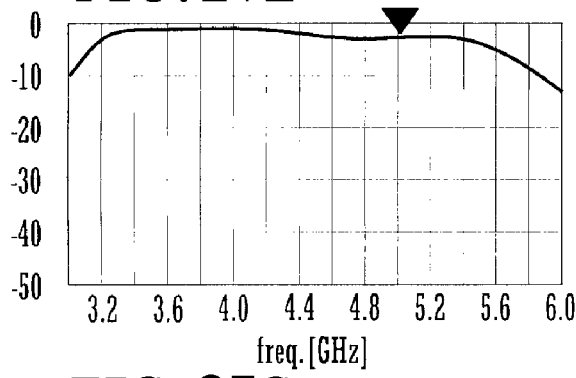

If the dimensions B1 and B4 are further reduced and the dimensions C2 and C4 are further increased from those of the configuration (D), the upper edge of the passband is moved to a still higher frequency and ripples in the passband increase as shown in FIG. 27E.

Figure 27F:
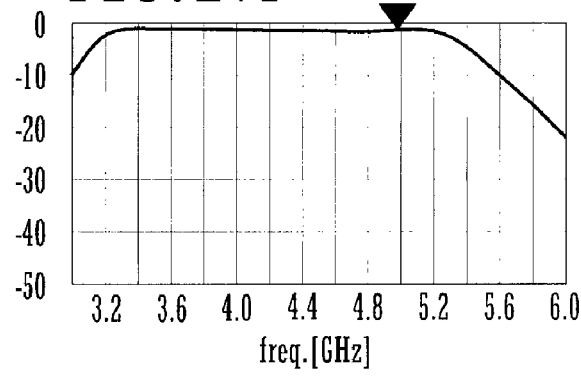
Figure 27G:
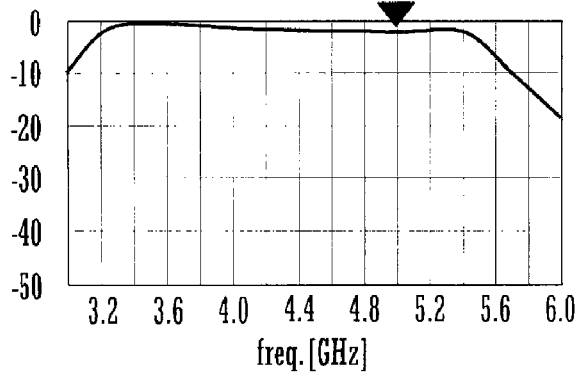

As shown in (F) and (G) in FIG. 26 and FIGS. 27F and 27G, the passband can be expanded by reducing the dimensions B2 and B3 and increasing the dimension C3.

Eleventh Preferred Embodiment

Figure 28:
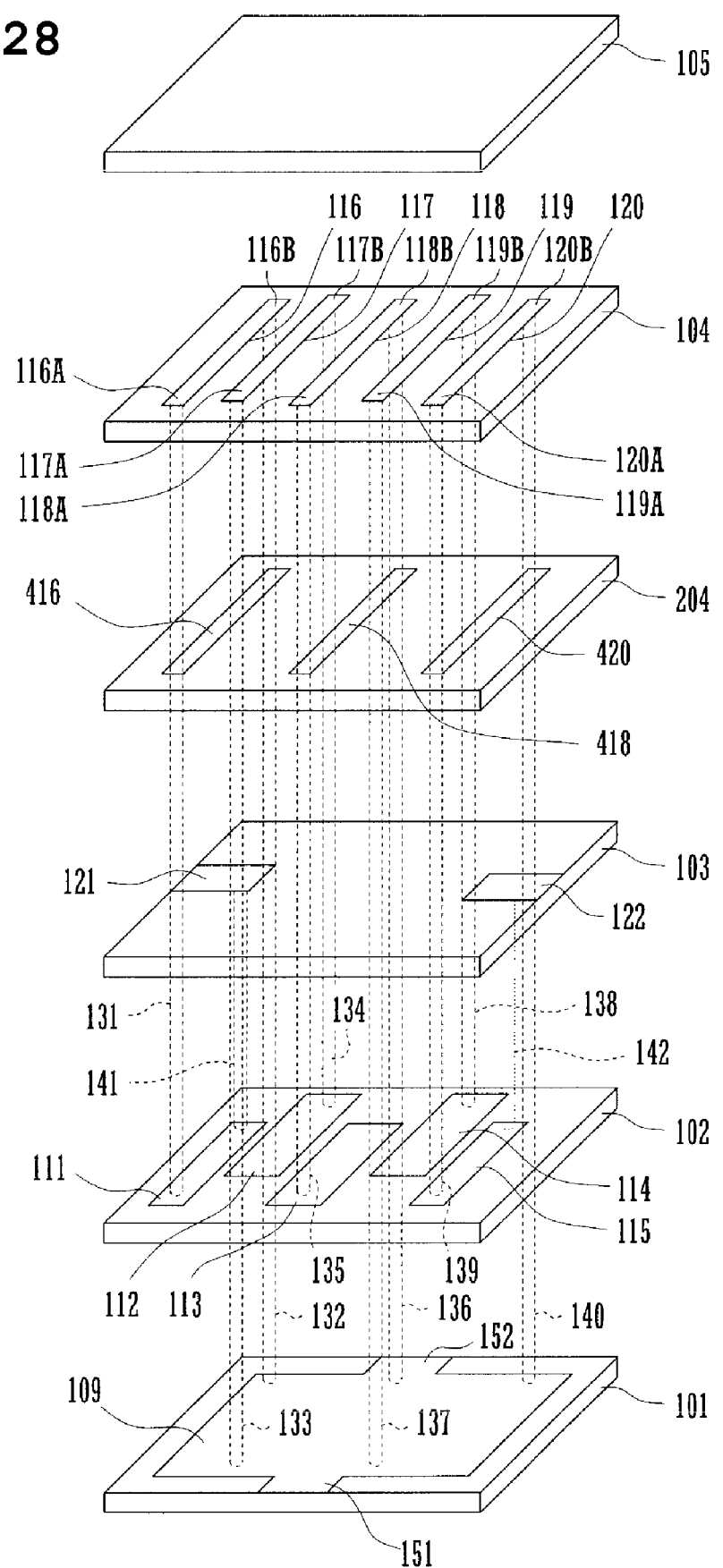
FIG. 28 is an exploded perspective view of a multilayer bandpass filter according to an eleventh preferred embodiment of the present invention.

FIG. 28 is an exploded perspective view of a multilayer bandpass filter according to an eleventh preferred embodiment. In this preferred embodiment, the multilayer bandpass filter is configured so as to include two line electrode formation layers 104 and 204. In one line electrode formation layer 104, line electrodes 116 to 120 are provided. In the other line electrode formation layer 204, line electrodes 416, 418, and 420 are provided. A via-electrode 131 is electrically connected to one end of the line electrode 116 and one end of the line electrode 416. A via-electrode 132 is electrically connected to the other end of the line electrode 116 and the other end of the line electrode 416. A via-electrode 135 is electrically connected to one end of the line electrode 118 and one end of the line electrode 418. A via-electrode 136 is electrically connected to the other end of the line electrode 118 and the other end of the line electrode 418. Similarly, a via-electrode 139 is electrically connected to one end of the line electrode 120 and one end of the line electrode 420, and a via-electrode 140 is electrically connected to the other end of the line electrode 120 and the other end of the line electrode 420.

Thus, the line electrodes 116, 118, and 120 are connected in parallel to the respective line electrodes 416, 418, and 420 via respective via-electrodes. As described above, line electrodes which are portions of inductor electrodes can be provided over a plurality of layers to obtain desired inductance. Furthermore, the insertion loss can be reduced by reducing the conductor loss of the line electrodes and increasing the Q values of the inductors.

Twelfth Preferred Embodiment

Figure 29:
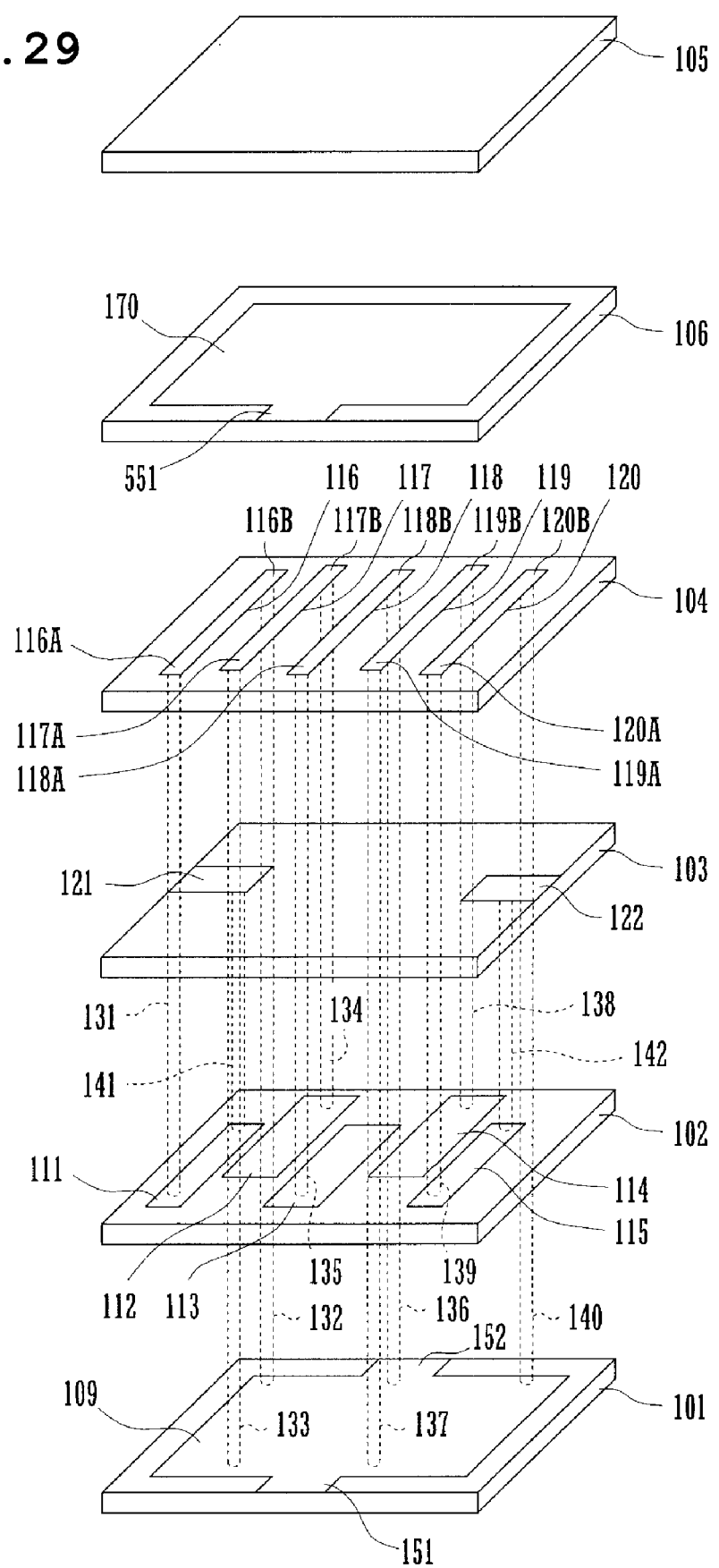
FIG. 29 is an exploded perspective view of a multilayer bandpass filter according to a twelfth preferred embodiment of the present invention.
Figure 30:
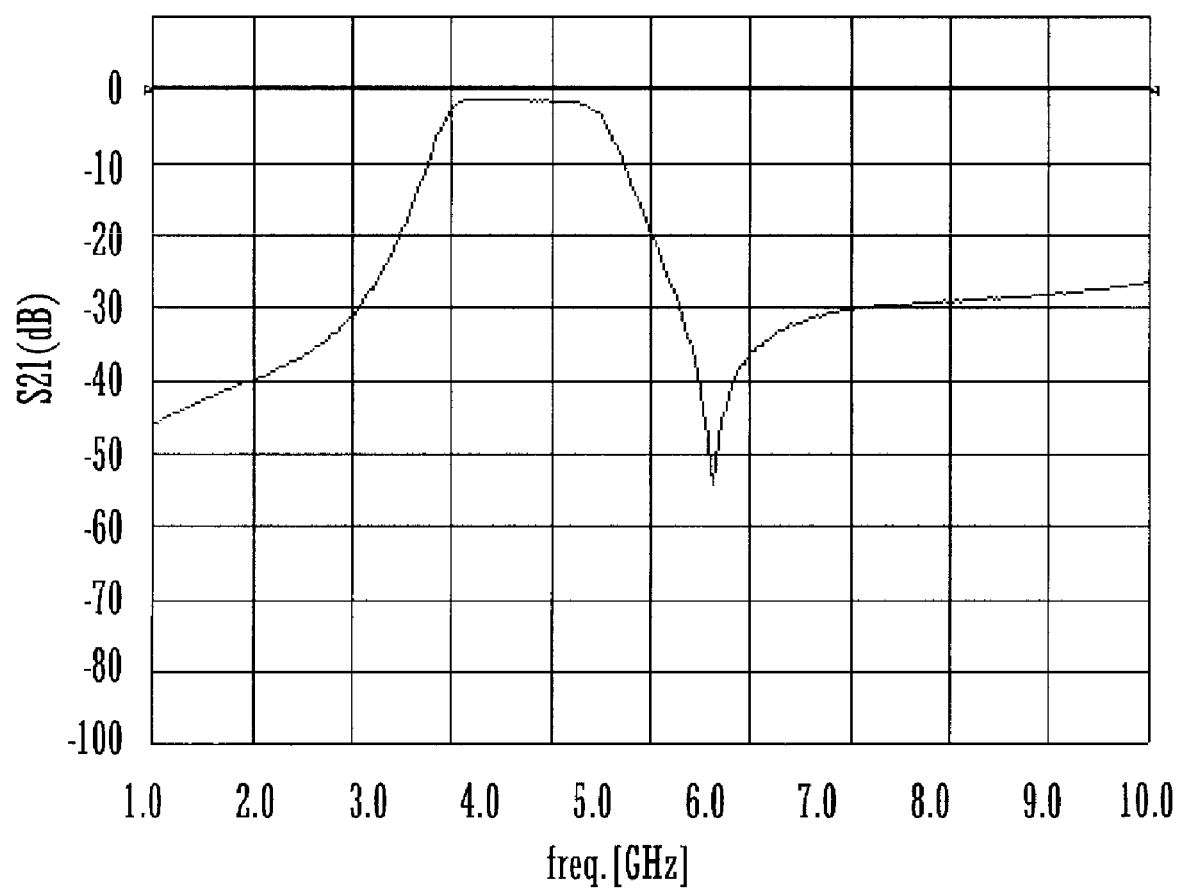
FIG. 30 shows an equivalent circuit of the multilayer bandpass filter according to the twelfth preferred embodiment of the present invention.

FIG. 29 is an exploded perspective view of a multilayer bandpass filter having one of two configurations according to a twelfth preferred embodiment, and FIG. 30 shows a transfer characteristic thereof.

This multilayer bandpass filter is configured in the form of a multilayer structure including a ground electrode formation layer 101, a capacitor electrode formation layer 102, an input/output electrode formation layer 103, a line electrode formation layer 104, a transverse electrode formation layer 106 and an external layer 105. Input/output terminals and a ground terminal are formed on end surfaces of the multilayer structure.

In this preferred embodiment, unlike the multilayer bandpass filter shown in FIG. 2A, a transverse electrode formation layer 106 is provided in which a transverse electrode 170 and a ground connection electrode 551 are provided. The ground connection electrode 551 is electrically connected together with a ground connection electrode 151 provided in the ground electrode formation layer 101 to a ground terminal provided on a side surface of the multilayer structure.

As described above, the transverse electrode 170 extends across the inductor electrodes (and more particularly across the line electrodes 116 to 120 in this specific example) in a state in which the transverse electrode 170 is electrically isolated from the inductor electrodes, and the transverse electrode 170 is grounded.

Figure 31:
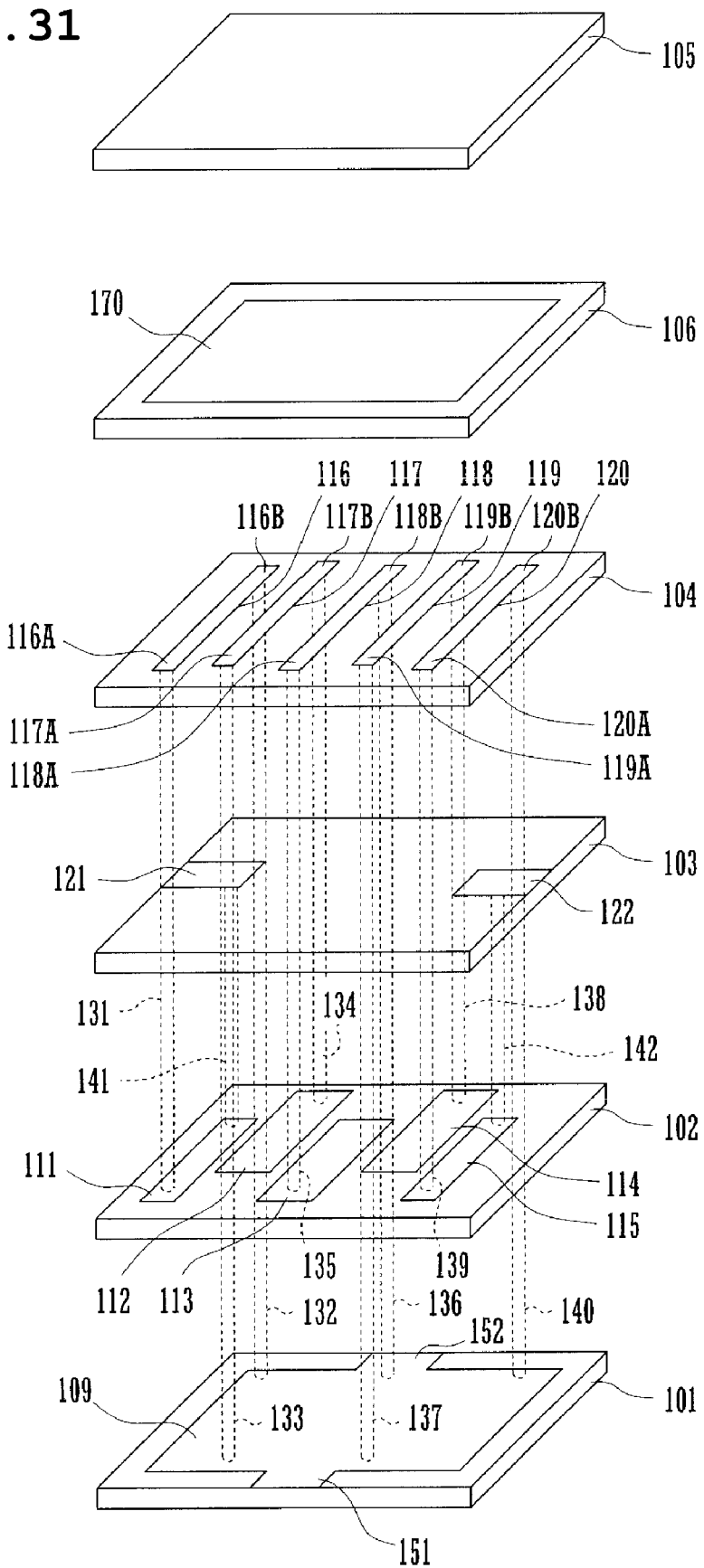
FIG. 31 shows an exploded perspective view of the multilayer bandpass filter according to the twelfth preferred embodiment of the present invention.
Figure 32B:
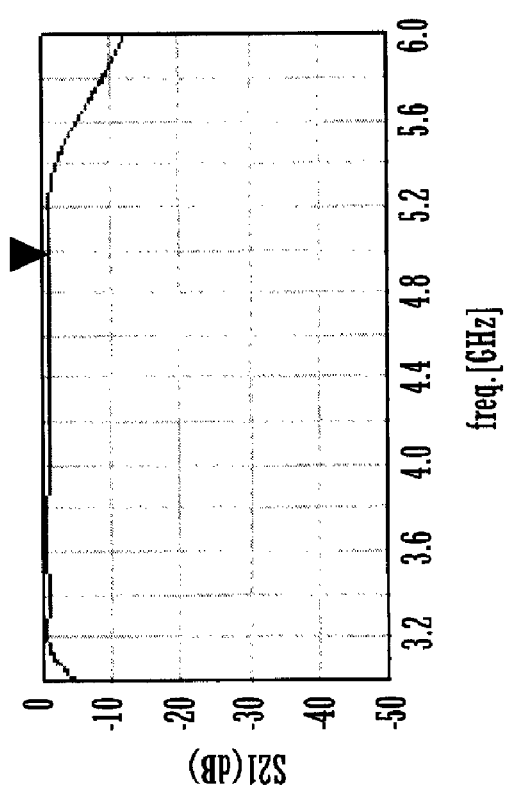
FIGS. 32A and 32B show transfer characteristics of the multilayer bandpass filter configured so as not to have a transverse electrode according to the twelfth preferred embodiment of the present invention.
Figure 32A:
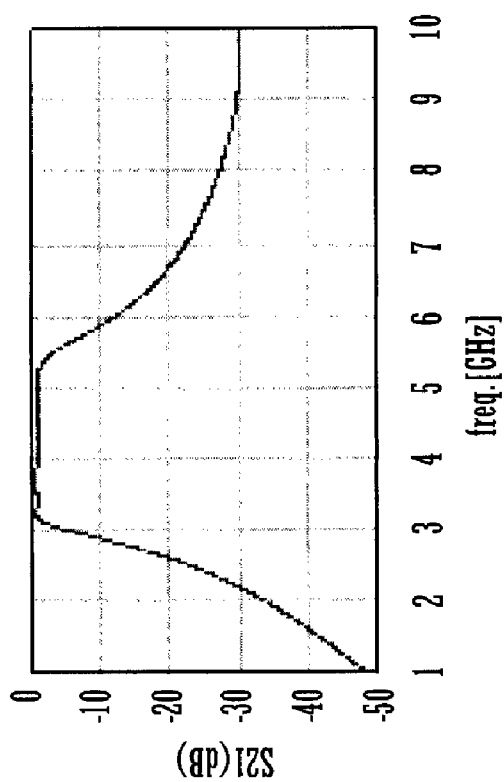
Figure 34B:
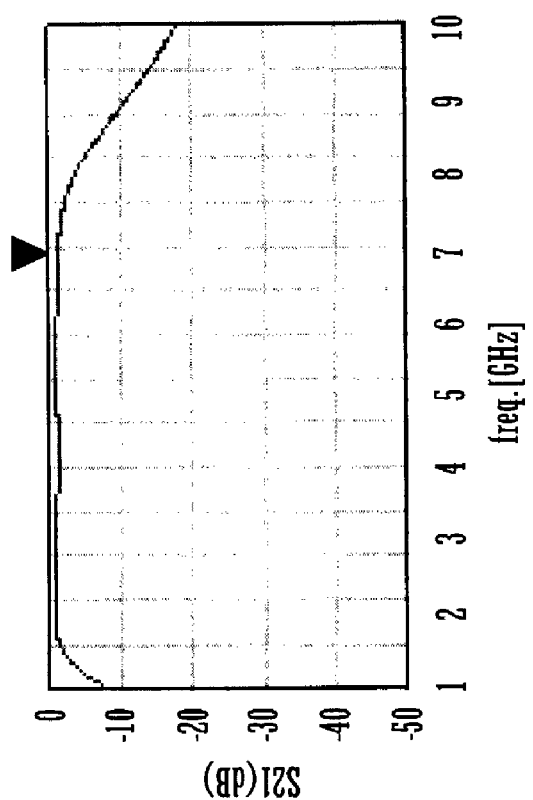
FIGS. 34A and 34B show transfer characteristics of the multilayer bandpass filter configured so as to have a grounded transverse electrode according to the twelfth preferred embodiment of the present invention.
Figure 34A:
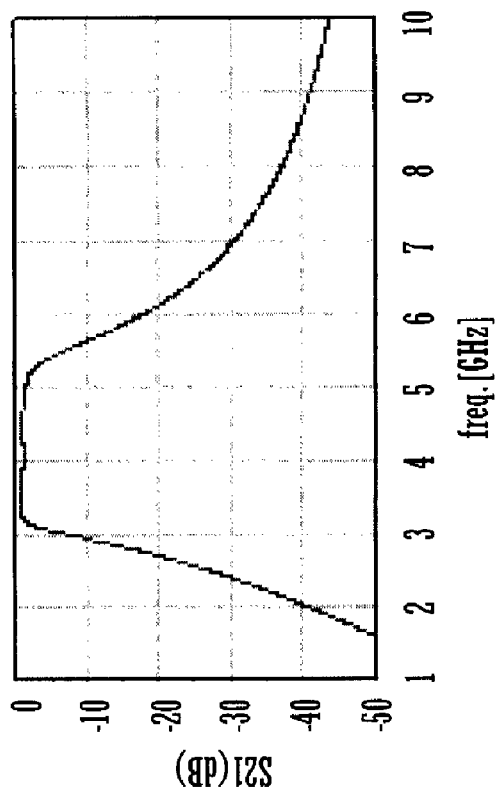

FIG. 31 is an exploded perspective view of a multilayer bandpass filter in which a transverse electrode formation layer has a different configuration. In this example, a transverse electrode 170 is arranged in a transverse electrode formation layer 106 such that the transverse electrode 170 is not grounded. The characteristics of the filter vary depending on whether the transverse electrode 170 is grounded or not, and thus, the transverse electrode 170 may or may not be grounded depending on the desired characteristics. Note that the other electrode patterns may be maintained unchanged.

FIGS. 32A to 34B show the dependence of the filter characteristics on whether there is a transverse electrode and whether the transverse electrode is grounded. In these examples, the filter has a 3-stage LC parallel resonator configuration. In the example shown in FIGS. 32A and 32B, there is no transverse electrode, while there is an ungrounded transverse electrode in the example shown in FIGS. 33A and 33B. In the example shown in FIGS. 34A and 34B, there is a grounded transverse electrode. As clearly seen from a comparison between FIGS. 32A and 32B and FIGS. 33A and 33B, the provision of the ungrounded transverse electrode results in an increase in the width of the passband and an increase in steepness of attenuation at a boundary between the upper edge of the passband and a rejection band. The provision of the grounded transverse electrode results in a reduction in the width of the passband and an increase in steepness of attenuation at boundaries between the passband and rejection bands.

Although not shown in the figures, the characteristic in the passband can also be changed by changing the shape and/or the size of the transverse electrode and/or by changing the thickness of the dielectric transverse electrode formation layer.

Thirteenth Preferred Embodiment

Figure 35:
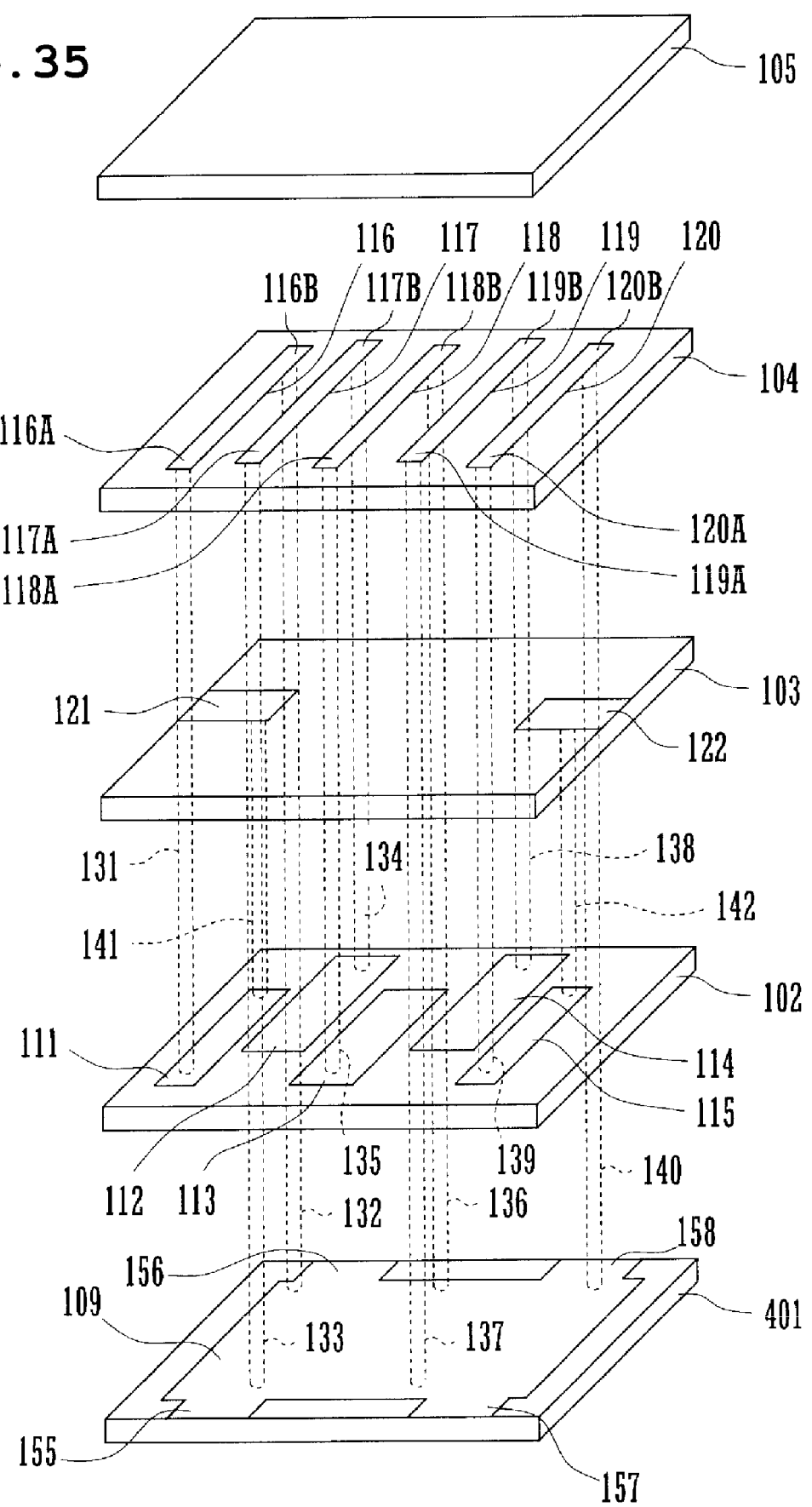
FIG. 35 is an exploded perspective view of a multilayer bandpass filter according to a thirteenth preferred embodiment of the present invention.

FIG. 35 is an exploded perspective view of a multilayer bandpass filter according to a thirteenth preferred embodiment.

In the preferred thirteenth embodiment, unlike the configuration shown in FIG. 2A, the inductance between a ground electrode 109 and a ground terminal provided on a side surface of a multilayer structure is determined by intentionally setting the number, the widths, and the locations of ground connection electrodes 155 to 158 provided in a ground electrode formation layer 401.

Figure 36:
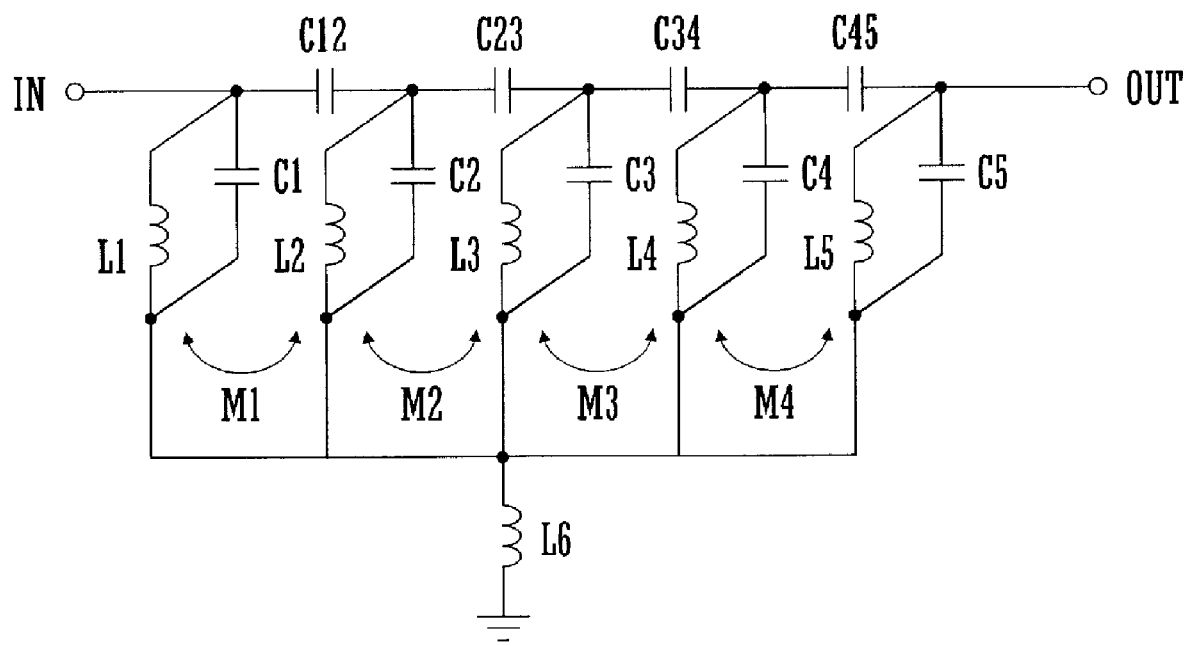
FIG. 36 shows an equivalent circuit of the multilayer bandpass filter according to the thirteenth preferred embodiment of the present invention.

FIG. 36 shows an equivalent circuit of the multilayer bandpass filter described above. In FIG. 36, an inductor L6 is a symbolic expression of total inductance on the inductor electrodes 155 to 158. The value of the inductance L6 can be determined by properly determining the number, the widths, and the lengths of the ground connection electrodes 155 to 158.

Note that in FIGS. 3A, 5, 13, and 17 and also in FIGS. 41A, 41B, 43A, 46A, 47A, 49, and 53 which will be referred to in following explanations, inductance components occurring on ground connection electrodes are not shown.

Figure 37A:
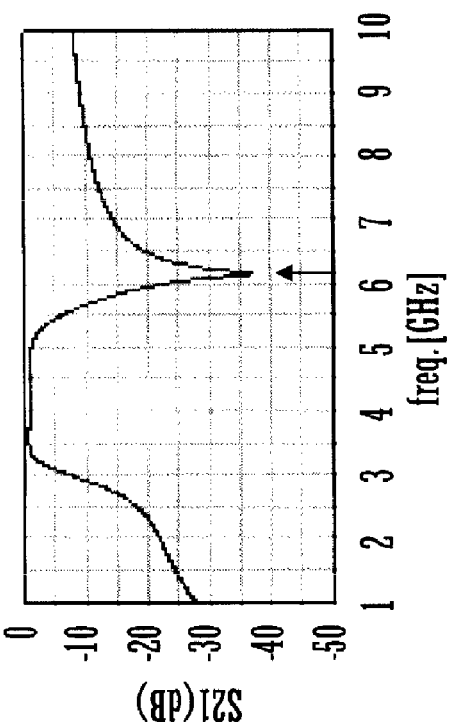
FIGS. 37A-37C show transfer characteristics of the multilayer bandpass filter according to the thirteenth preferred embodiment of the present invention.
Figure 37B:
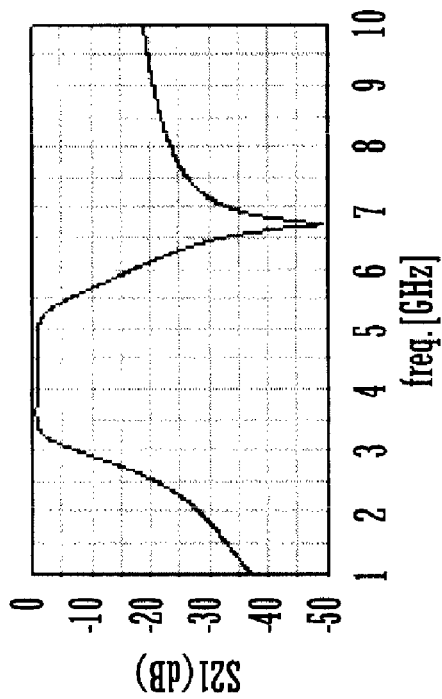
Figure 37C:
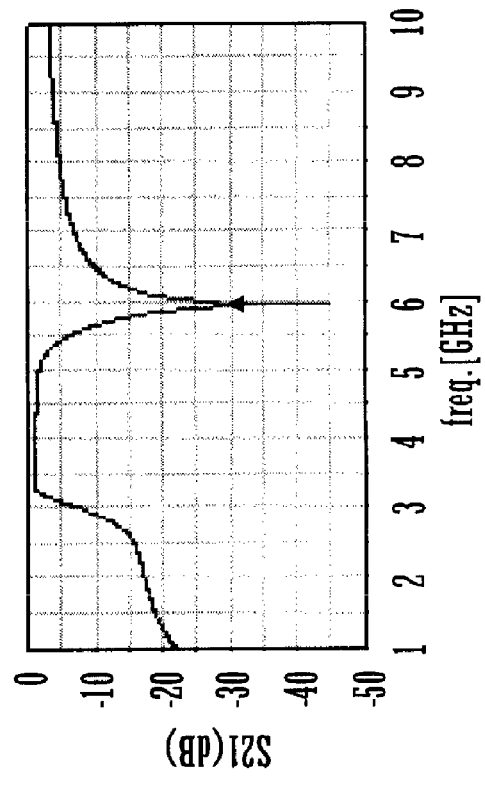

FIGS. 37A-37C show transfer characteristics of the filter for three different values of the inductor L6. FIG. 37A shows a characteristic for L6=0.03 nH, FIG. 37B for L6=0.10 nH, and FIG. 37C for L6=0.20 nH.

It can be seen from FIGS. 37A-37C that the attenuation at an attenuation pole at a location close to the upper edge of the passband increases with decreasing inductance of the inductor L6. On the other hand, the steepness of the attenuation at the upper edge of the passband increases with increasing inductance of the inductor L6.

Fourteenth Preferred Embodiment

Figure 38:
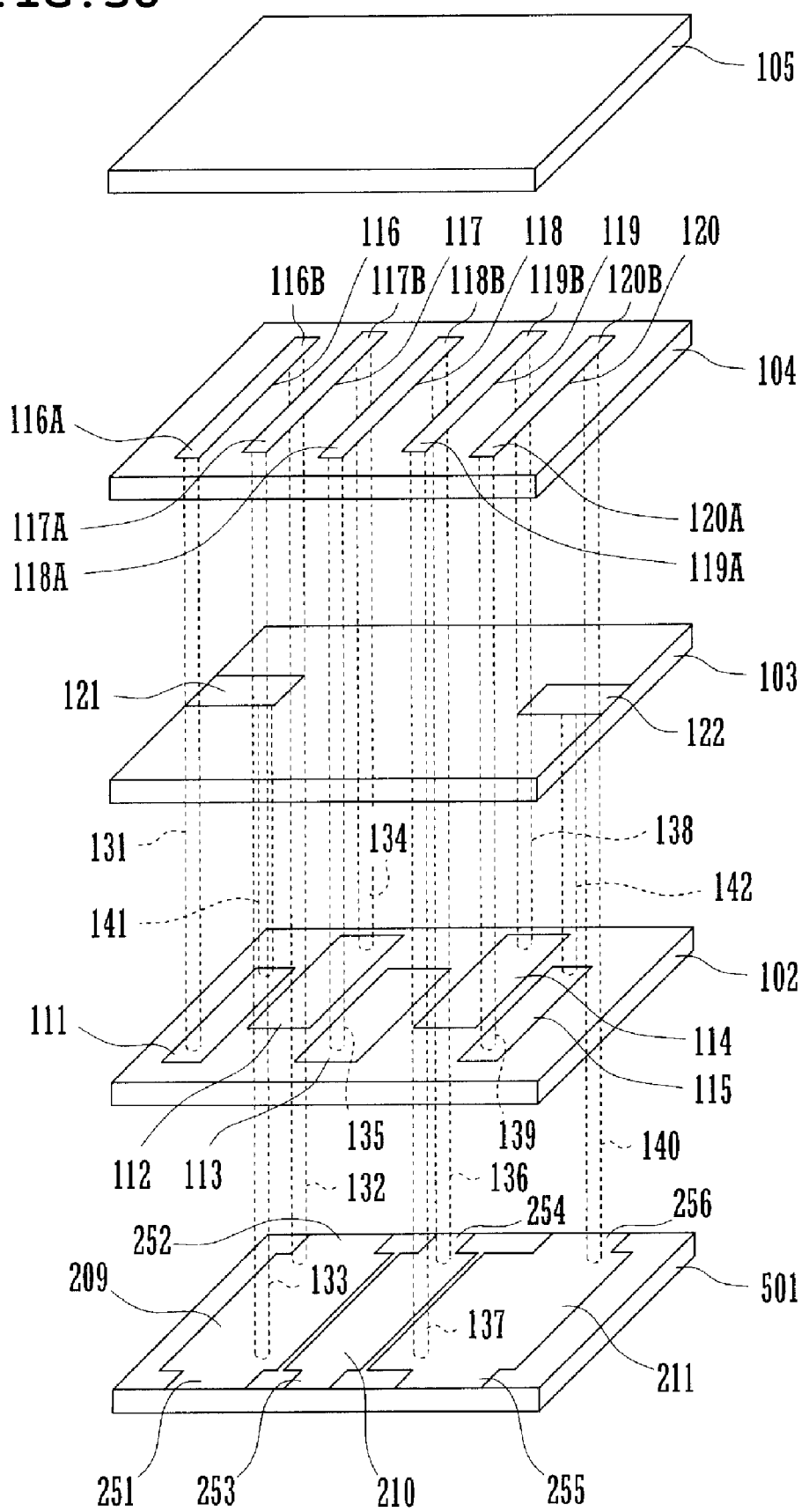
FIG. 38 is an exploded perspective view of a multilayer bandpass filter according to a fourteenth preferred embodiment of the present invention.

FIG. 38 is an exploded perspective view of a multilayer bandpass filter according to a fourteenth preferred embodiment.

In this example, three ground electrodes 209 to 211 isolated from each other and ground connection electrodes 251 to 256 extending from the respective ground electrodes 209 to 211 are provided in a ground electrode formation layer 501.

In the capacitor electrode formation layer 102, capacitor electrodes 111 and 112 are arranged so as to oppose the ground electrode 209, a capacitor electrode 113 is arranged so as to oppose the ground electrode 210, and capacitor electrodes 114 and 115 are arranged so as to oppose the ground electrode 211. Via-electrodes 132 and 133 are electrically connected to the ground electrode 209, a via-electrode 136 is electrically connected to the ground electrode 210, via-electrodes 137 and 140 are electrically connected to the ground electrode 211.

Figure 39:
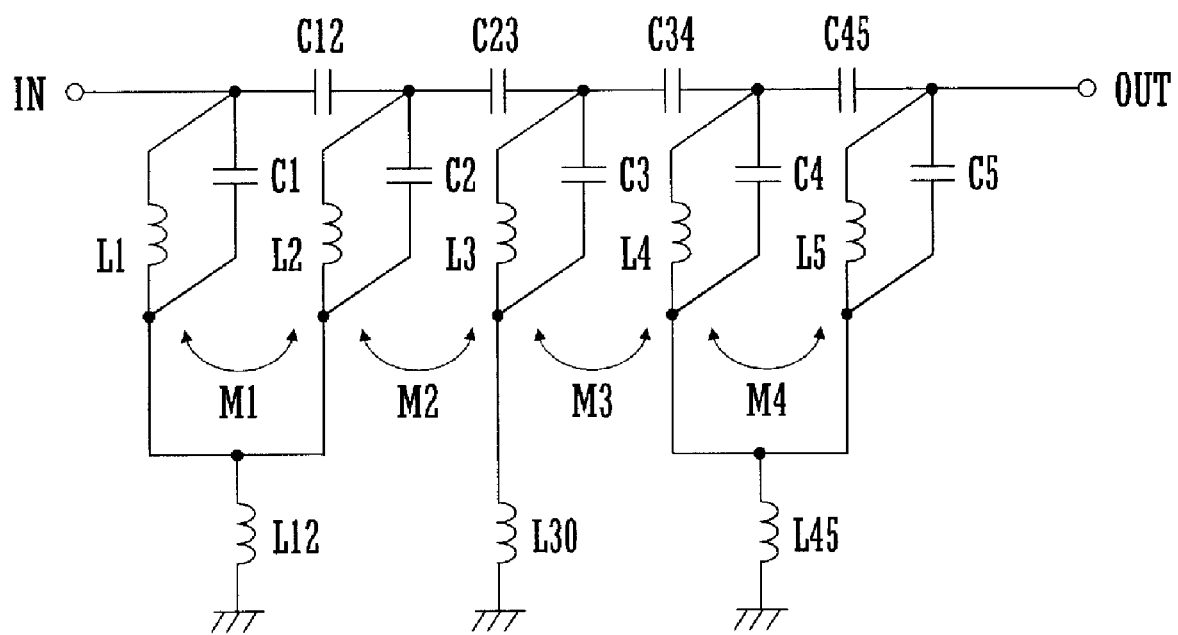
FIG. 39 is an equivalent circuit of the multilayer bandpass filter according to the fourteenth preferred embodiment of the present invention.

FIG. 39 shows an equivalent circuit of the multilayer bandpass filter. An inductor L12 is a symbolic expression of inductance on the inductor electrodes 251 and 252. An inductor L30 is a symbolic expression of total inductance on the inductor electrodes 253 and 254. An inductor L45 is a symbolic expression of inductance on the inductor electrodes 255 and 256.

In this configuration, as described above, the ground electrode is divided into a plurality of portions opposing particular capacitor electrodes and being electrically connected to particular via-electrodes thereby achieving a bandpass filter having characteristics different from those obtained by a bandpass filter having a single common ground electrode.

Fifteenth Preferred Embodiment

Figure 40:
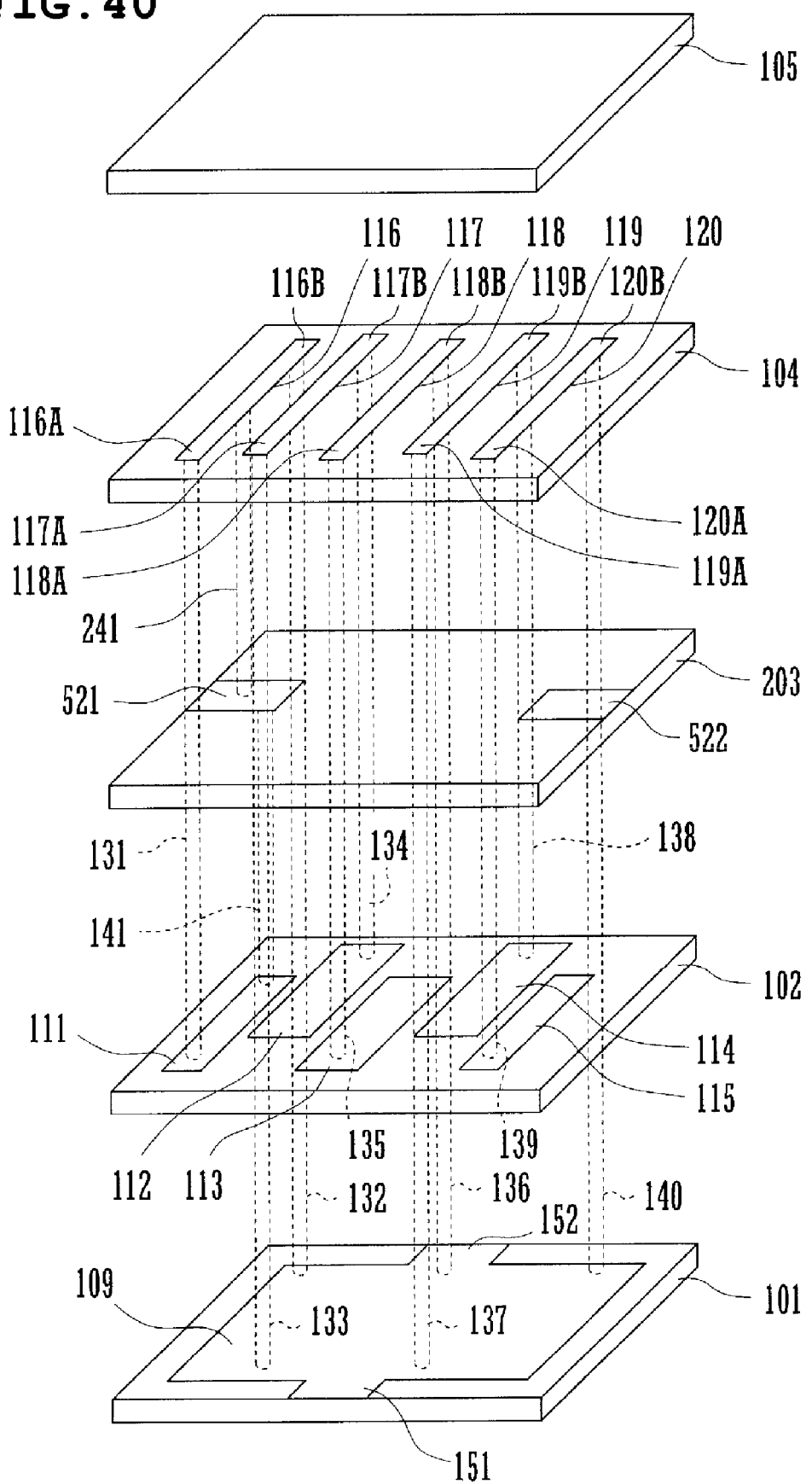
FIG. 40 is an exploded perspective view of a multilayer bandpass filter according to a fifteenth preferred embodiment of the present invention.
Figure 41A:
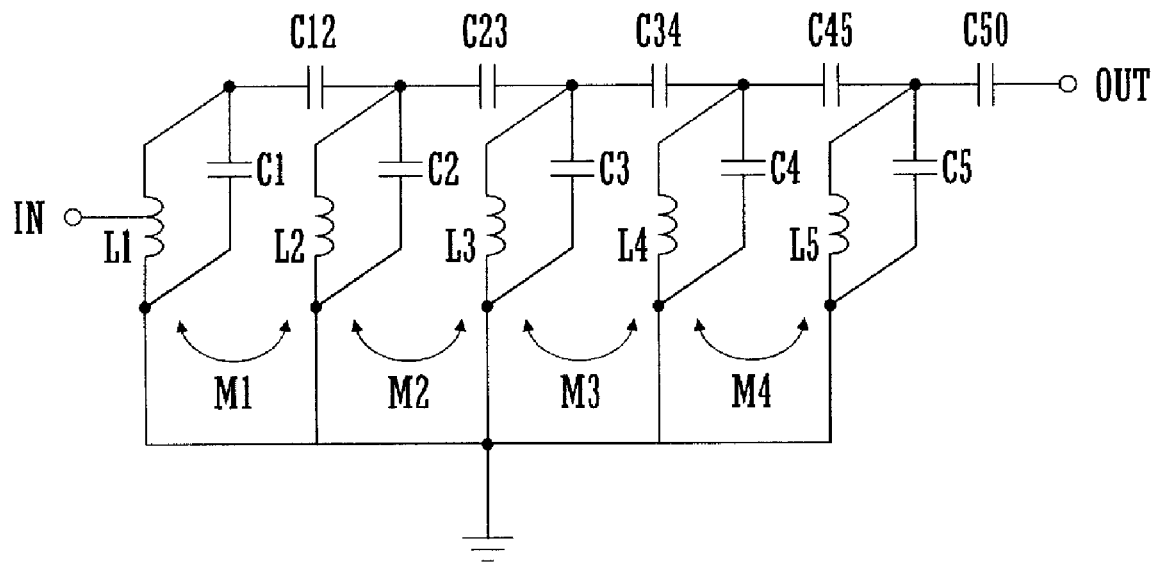
FIGS. 41A and 41B show equivalent circuits of the multilayer bandpass filter according to the fifteenth filter embodiment of the present invention.
Figure 41B:
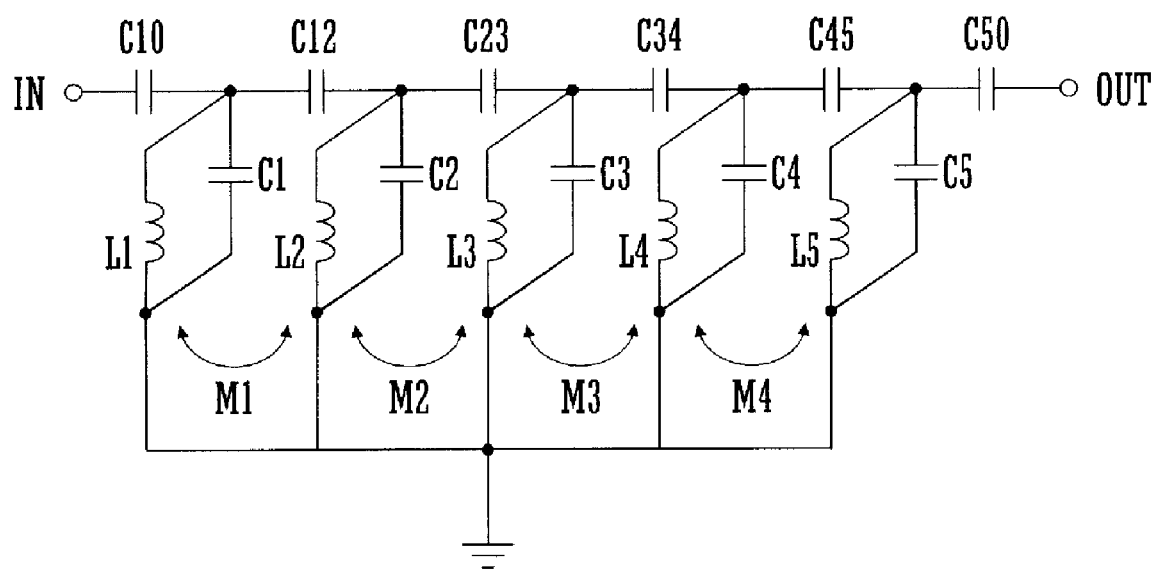

FIG. 40 is an exploded perspective view of a multilayer bandpass filter according to a fifteenth preferred embodiment, and FIGS. 41A and 41B show equivalent circuits of this multilayer bandpass filter. In the example shown in FIG. 2A, the input/output electrode 121 provided in the input/output electrode formation layer 103 is electrically connected to the capacitor electrode 111 provided in the capacitor electrode formation layer 102 via the via-electrode 141. In contrast, in the example shown in FIG. 40, there is provided a via-electrode 241 whereby an input/output electrode 521 is electrically connected to a middle point of a line electrode 116.

In the example shown in FIG. 2A, the capacitor electrode 115 is electrically connected to the input/output electrode 122 via the via-electrode 142. In contrast, in the example shown in FIG. 40, an input/output electrode 522 is arranged such that capacitance occurs between the input/output electrode 522 and a capacitor electrode 115.

FIG. 41A shows an equivalent circuit of the multilayer bandpass filter shown in FIG. 40. In FIG. 41A, an inductor L1 represents the total inductance occurring on via-electrodes 131 and 132 and the line electrode 116. A capacitor C50 is a symbolic expression of capacitance occurring between the capacitor electrode 115 and the input/output electrode 522. In this configuration of the filter, as shown in FIG. 41A, a signal is input by inductance division (the input is inductively coupled) and a signal is output via a capacitor. In circuit design of a multilayer bandpass filter, when high input/output impedance is required, an input/output terminal is coupled to the filter by inductance division, and when low input/output impedance is required, the input/output terminal is capacitively coupled to the filter, thereby achieving input/output impedance matching.

In FIG. 40, if the via-electrode 241 is deleted, coupling to an external circuit is achieved via capacitance occurring via the input/output electrode 521 and the capacitor electrode 111. In this case, an equivalent circuit of the multilayer bandpass filter is represented as shown in FIG. 41B. In FIG. 41B, a capacitor C10 is a symbolic expression of capacitance between the input/output electrodes 521 and the capacitor electrode 111.

As described above, coupling to an external circuit may be achieved via capacitance for both the input and the output. The input/output coupling form may be easily changed simply by forming/deleting a via-electrode.

Sixteenth Preferred Embodiment

Figure 42:
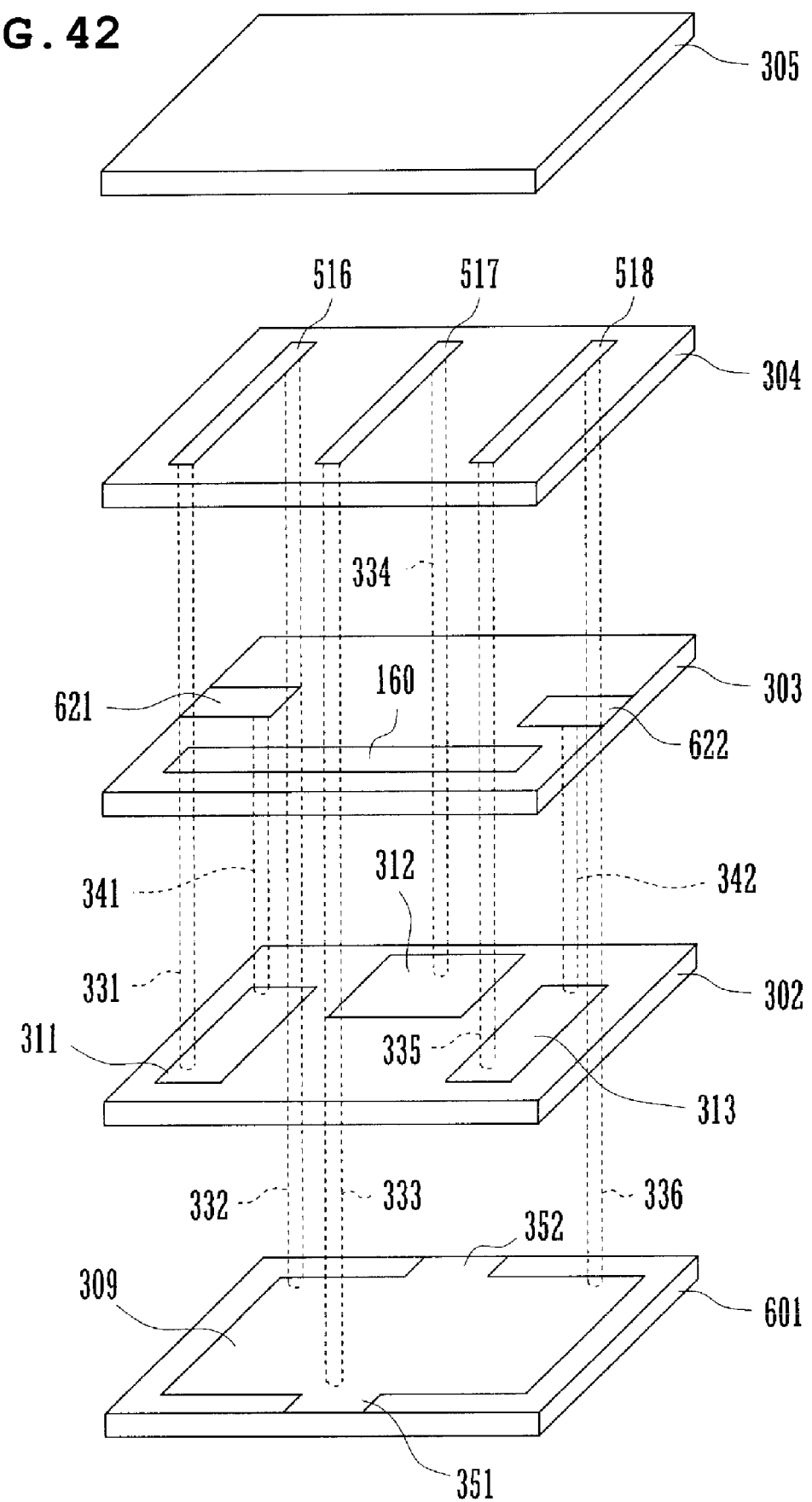
FIG. 42 is an exploded perspective view of a multilayer bandpass filter according to a sixteenth preferred embodiment of the present invention.
Figure 43A:
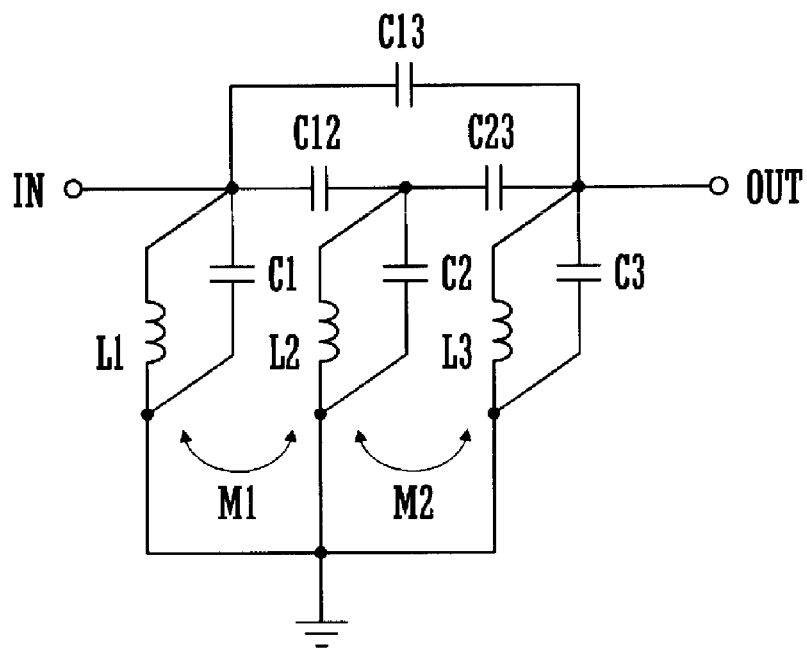
FIGS. 43A and 43B show an equivalent circuit and a transfer characteristic of the multilayer bandpass filter according to the sixteenth preferred embodiment of the present invention.
Figure 43B:
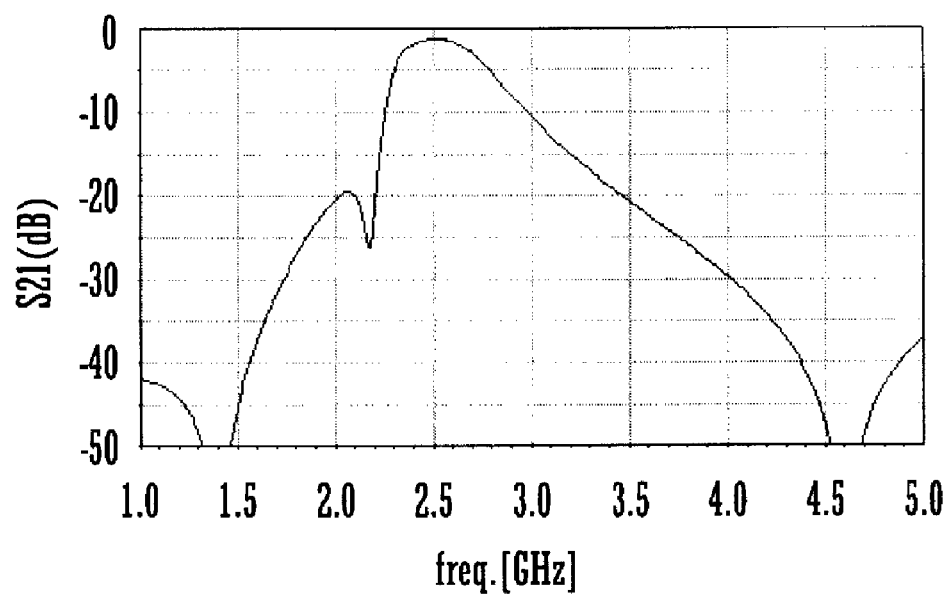

FIG. 42 is an exploded perspective view of a multilayer bandpass filter according to a sixteenth preferred embodiment, FIG. 43A shows an equivalent circuit thereof, and FIG. 43B shows a transfer characteristic and a reflection characteristic thereof.

This multilayer bandpass filter is configured in the form of a multilayer structure including a ground electrode formation layer 601, a capacitor electrode formation layer 302, an input/output electrode formation layer 303, a line electrode formation layer 304, and an external layer 305. Input/output terminals and a ground terminal are provided on end surfaces of the multilayer structure.

As shown in FIG. 42, input/output electrodes 621 and 622 and an input-output capacitor electrode 160 are provided in the input/output electrode formation layer 303. The input-output capacitor electrode 160 causes capacitance to occur between the two input/output electrodes 621 and 622, thereby capacitively coupling the input/output electrodes 621 and 622.

Capacitor electrodes 311, 312, and 313 are arranged in the capacitor electrode formation layer 302 so as to oppose the ground electrode 309. A via-electrode 341 is electrically connected to the input/output electrode 621 and the capacitor electrode 311, and a via-electrode 342 is electrically connected to the input/output electrode 622 and the capacitor electrode 313.

A via-electrode 331 is electrically connected to the capacitor electrode 311 and one end of the line electrode 516, and a via-electrode 332 is electrically connected to the other end of the line electrode 516 and to the ground electrode 309. A via-electrode 333 is electrically connected to the ground electrode 309 and one end of the line electrode 517, and a via-electrode 334 is electrically connected to the other end of the line electrode 517 and to the capacitor electrode 312. A via-electrode 335 is electrically connected to the capacitor electrode 313 and one end of the line electrode 518, and a via-electrode 336 is electrically connected to the other end of the line electrode 518 and to the ground electrode 309.

The three LC parallel resonators are coupled so as to have a sequence of polarities of <101>.

Thus, an equivalent circuit of the multilayer bandpass filter is expressed as shown in FIG. 43A. A capacitor C13 is a symbolic expression of capacitance which appears between the input/output electrodes 621 and 622 as a result of formation of the input-output capacitor electrode 160.

Figure 44A:
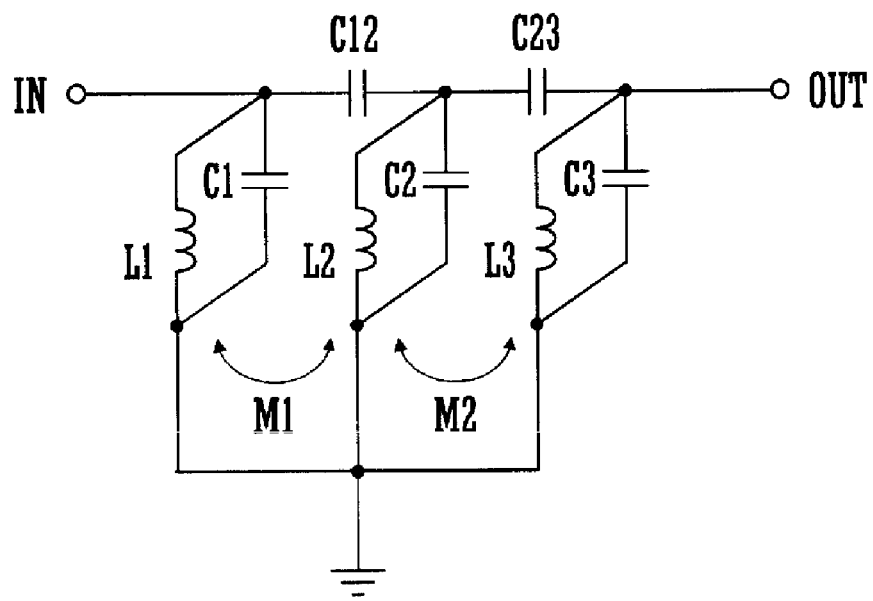
FIGS. 44A and 44B show, for the purpose of comparison with the sixteenth preferred embodiment of the present invention, an equivalent circuit of a multilayer bandpass filter configured differently and a filter characteristic thereof.

As described above, by coupling three resonators so as to have a polarity sequence of <101> and by capacitively coupling the first-stage resonator and the third-stage resonator, the transfer characteristic shown in FIG. 43B is obtained. For the purpose of comparison, FIG. 44A shows an equivalent circuit of a configuration having no input-output capacitor electrode, and FIG. 44B shows a filter characteristic of this configuration.

Figure 44B:
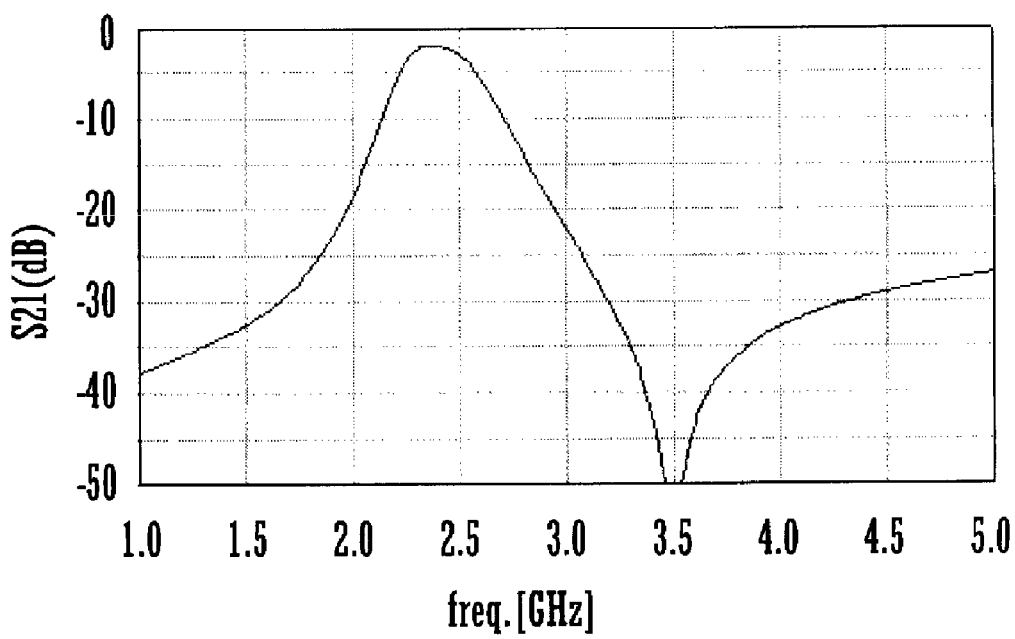

As seen from comparison between FIG. 43B and FIG. 44B, the provision of the input-output capacitor electrode causes two attenuation poles to appear close to the lower edge of the passband, which results in an increase in steepness of attenuation at the edge of the passband, although the attenuation pole in the rejection band adjacent to the upper edge of the passband moves to a higher frequency.

As described above, jumping coupling between resonators which are not directly adjacent to each other is easily achieved simply by forming the input-output capacitor electrode in the input/output electrode formation layer. Thus, depending on the desired filter characteristics, the presence/absence of the input-output capacitor electrode and the shape and the location thereof may be determined.

Seventeenth Preferred Embodiment

In a seventeenth preferred embodiment described below, a multilayer bandpass filter has a four-stage LC parallel resonator configuration having an input-output capacitor electrode.

Figure 45:
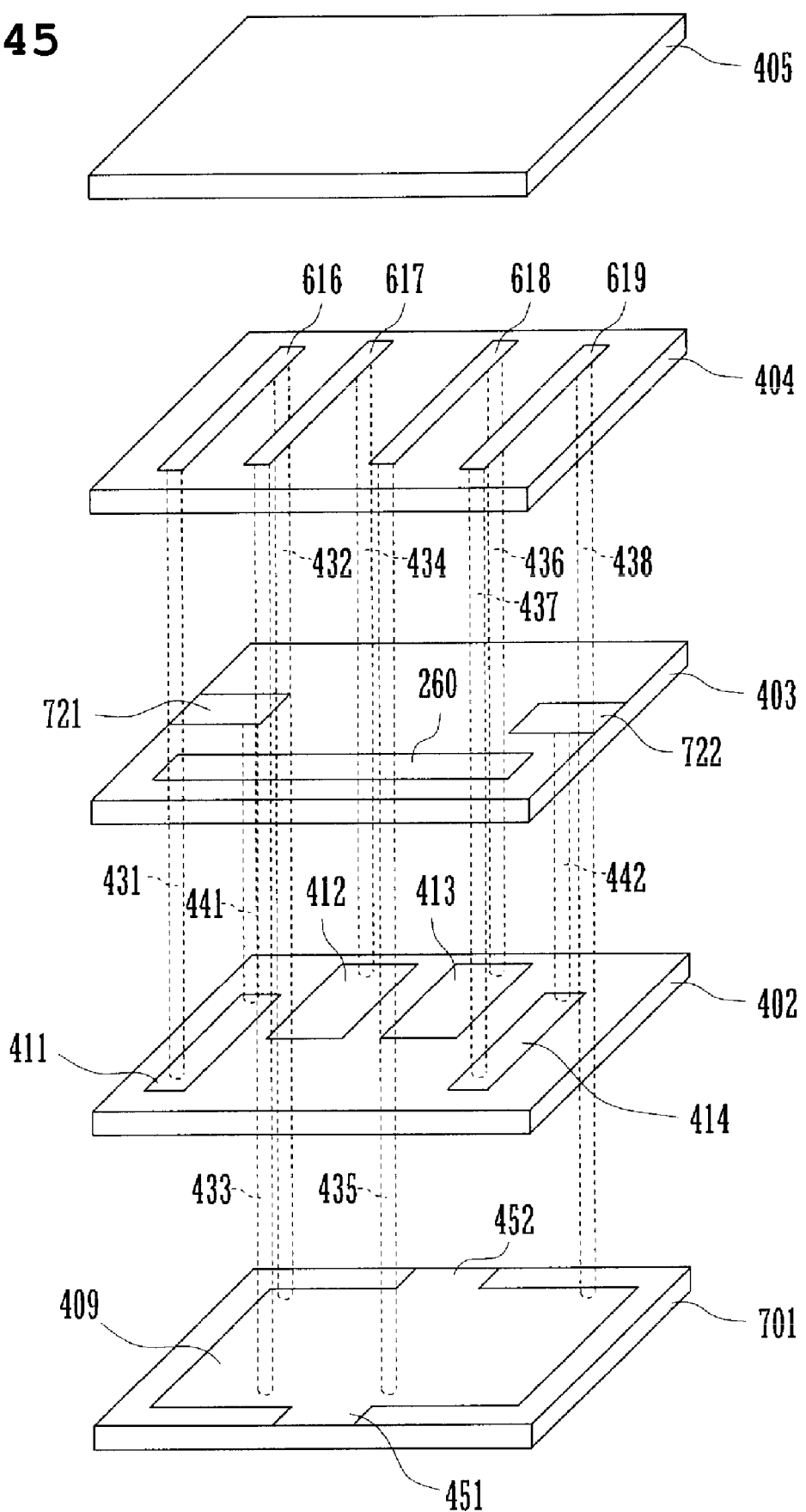
FIG. 45 is an exploded perspective view of a multilayer bandpass filter according to a seventeenth preferred embodiment of the present invention.
Figure 46B:
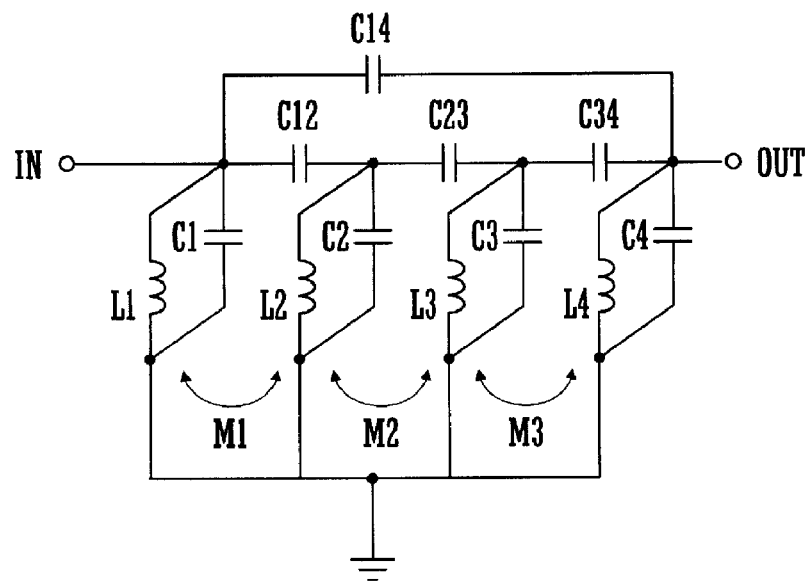
FIGS. 46A and 46B show an equivalent circuit and a transfer characteristic of the multilayer bandpass filter according to the seventeenth preferred embodiment of the present invention.
Figure 46A:
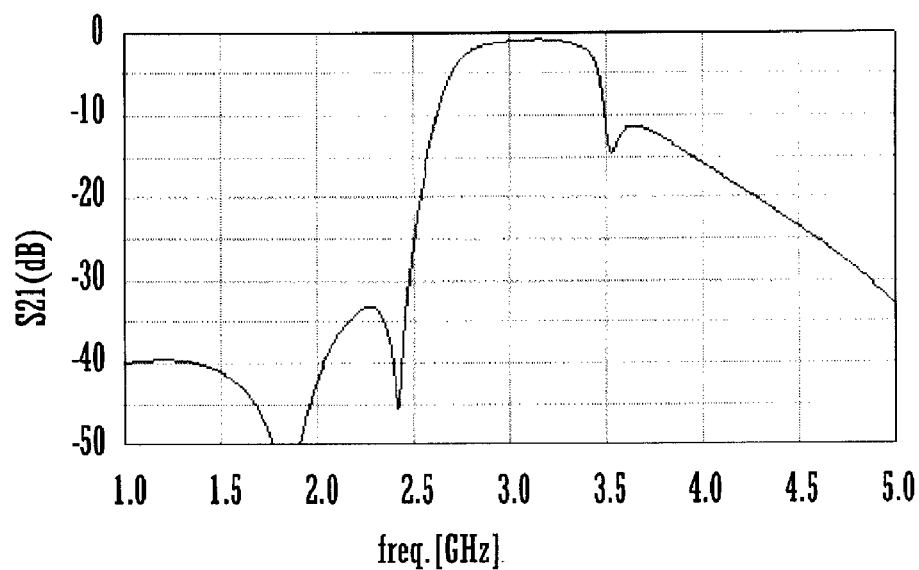

FIG. 45 is an exploded perspective view of the multilayer bandpass filter according to the seventeenth preferred embodiment, FIG. 46A shows an equivalent circuit thereof, and FIG. 46B shows a transfer characteristic and a reflection characteristic thereof.

This multilayer bandpass filter is configured in a multilayer structure including a ground electrode formation layer 701, a capacitor electrode formation layer 402, an input/output electrode formation layer 403, a line electrode formation layer 404, and an external layer 405. Input/output terminals and a ground terminal are formed on end surfaces of the multilayer structure.

As shown in FIG. 45, input/output electrodes 721 and 722 and an input-output capacitor electrode 260 are provided in the input/output electrode formation layer 403. The input-output capacitor electrode 260 causes capacitance to occur between the two input/output electrodes 721 and 722, thereby capacitively coupling the input/output electrodes 721 and 722.

Capacitor electrodes 411, 412, 413, and 414 are arranged in the capacitor electrode formation layer 402 so as to oppose the ground electrode 409.

A via-electrode 441 is electrically connected to the input/output electrode 721 and the capacitor electrode 411, and a via-electrode 442 is electrically connected to the input/output electrode 722 and the capacitor electrode 414.

A via-electrode 431 is electrically connected to the capacitor electrode 411 and one end of the line electrode 616, and a via-electrode 432 is electrically connected to the other end of the line electrode 616 and to the ground electrode 409. A via-electrode 433 is electrically connected to the ground electrode 409 and one end of the line electrode 617, and a via-electrode 434 is electrically connected to the other end of the line electrode 617 and to the capacitor electrode 412. A via-electrode 435 is electrically connected to the ground electrode 409 and one end of the line electrode 618, and a via-electrode 436 is electrically connected to the other end of the line electrode 618 and to the capacitor electrode 413. A via-electrode 437 is electrically connected to the capacitor electrode 414 and one end of the line electrode 619, and a via-electrode 438 is electrically connected to the other end of the line electrode 619 and to the ground electrode 409. The four LC parallel resonators are coupled so as to have a polarity sequence of <1001>.

Thus, an equivalent circuit of the multilayer bandpass filter is shown in FIG. 46A. A capacitor C14 is a symbolic expression of capacitance between the input/output electrodes 721 and 722 as a result of formation of the input-output capacitor electrode 260.

In this configuration, by coupling the four resonators so as to have the polarity sequence of <1001>, and by capacitively coupling the first-stage resonator and the fourth-stage resonator, the transfer characteristic shown in FIG. 46B is obtained. For the purpose of comparison, FIG. 47A shows an equivalent circuit of a configuration having no input-output capacitor electrode, and FIG. 47B shows a filter characteristic of this configuration.

Figure 47B:
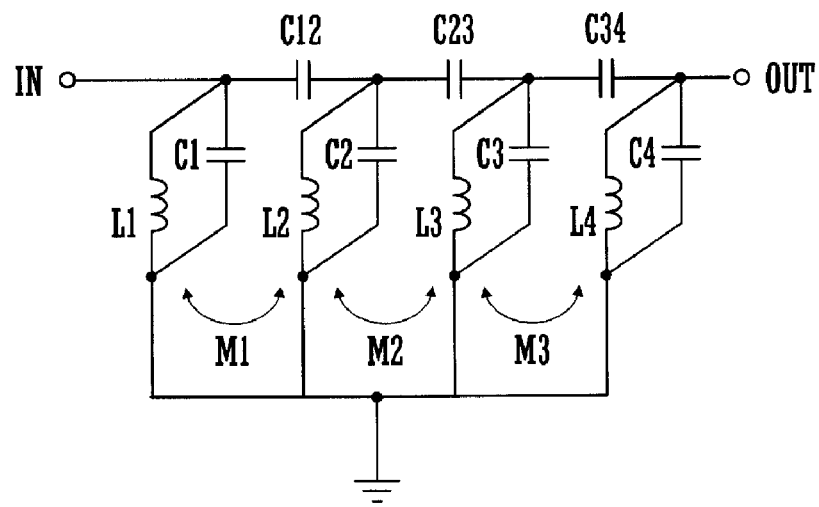
FIGS. 47A and 47B show, for the purpose of comparison with the seventeenth preferred embodiment of the present invention, an equivalent circuit of a multilayer bandpass filter configured differently and a filter characteristic thereof.
Figure 47A:
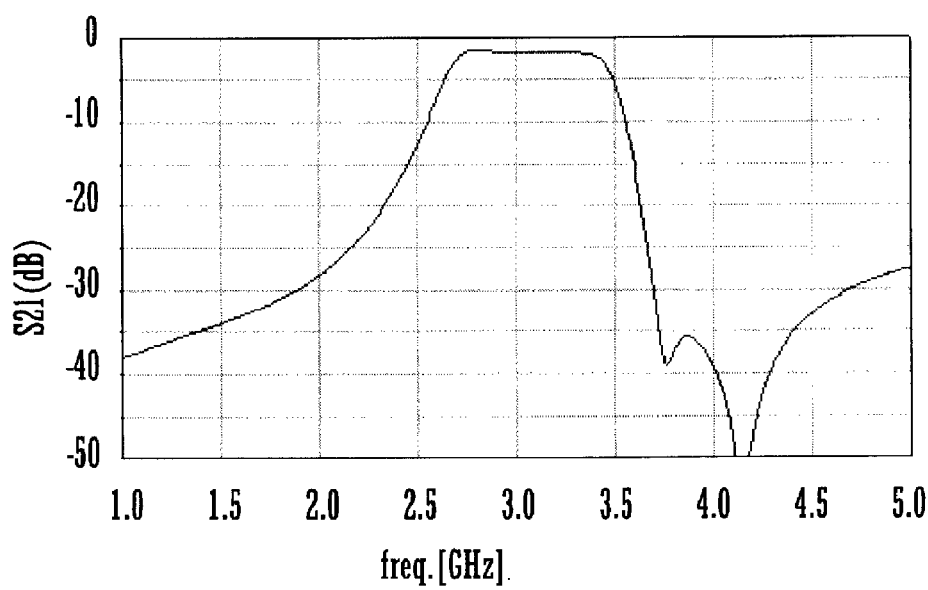

As seen from comparison between FIG. 46B and FIG. 47B, the provision of the input-output capacitor electrode causes an attenuation pole to appear close to the upper edge of the passband and two attenuation poles to appear close to the lower edge of the passband, which results in an increase in steepness of attenuation at the both edges of the passband.

Eighteenth Preferred Embodiment

In an eighteenth preferred embodiment described below, a multilayer bandpass filter has a four-stage LC parallel resonator configuration having an input-output capacitor electrode.

Figure 48:
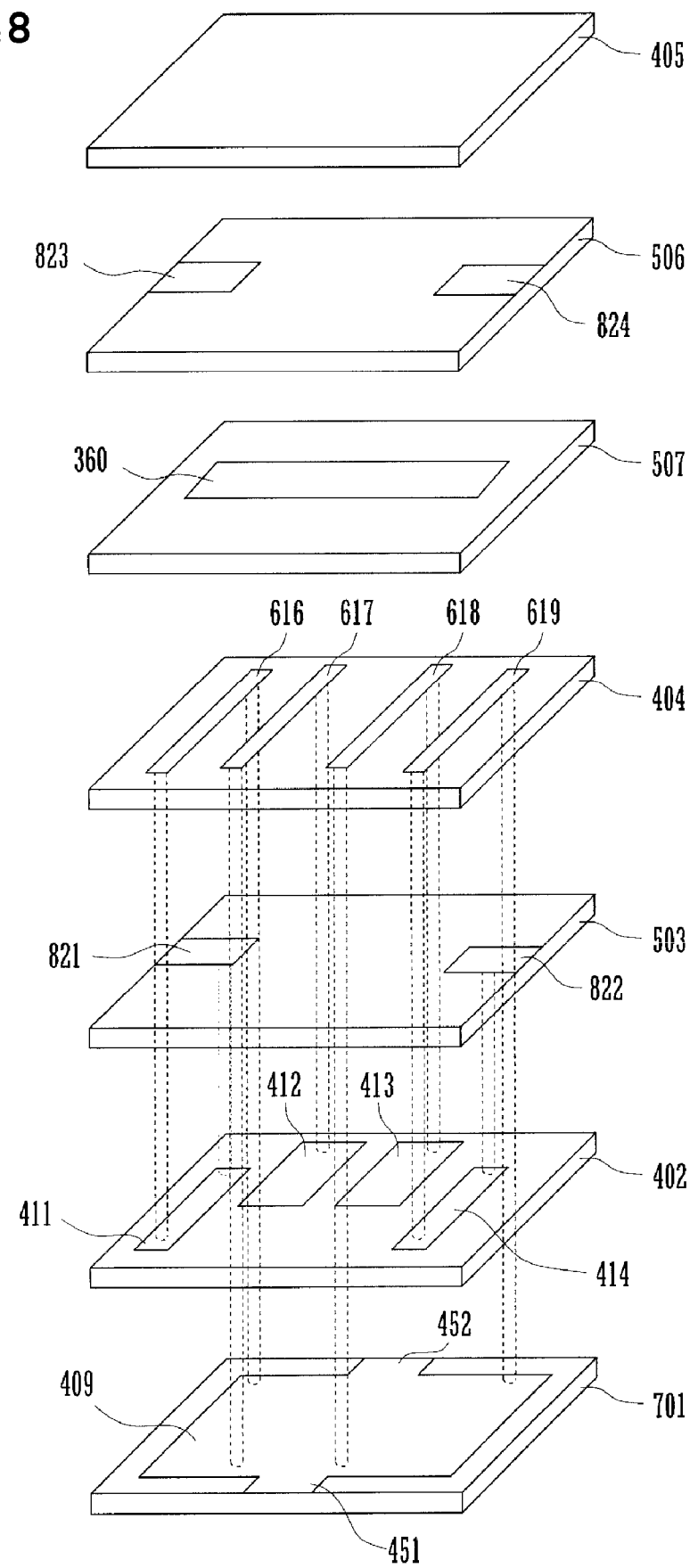
FIG. 48 is an exploded perspective view of a multilayer bandpass filter according to an eighteenth preferred embodiment of the present invention.
Figure 49:
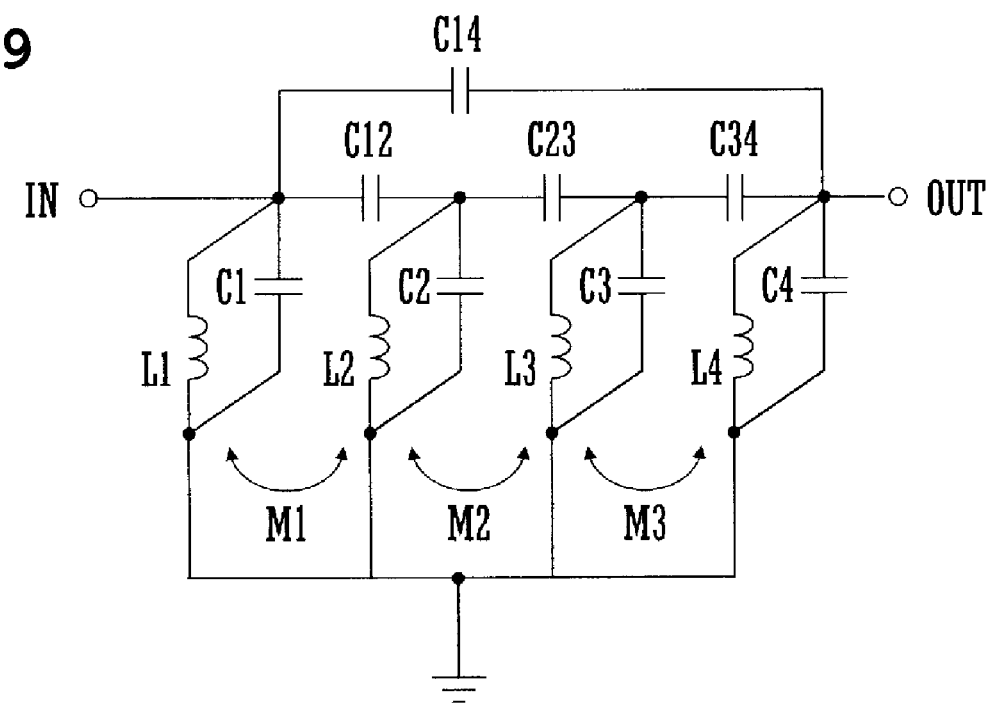
FIG. 49 shows an equivalent circuit of the multilayer bandpass filter according to the eighteenth preferred embodiment of the present invention.

FIG. 48 is an exploded perspective view of the multilayer bandpass filter according to the eighteenth preferred embodiment of the present invention, and FIG. 49 is an equivalent circuit diagram thereof.

This multilayer bandpass filter is configured in a multilayer structure including a ground electrode formation layer 701, a capacitor electrode formation layer 402, input/output electrode formation layers 503 and 506, a line electrode formation layer 404, an input-output capacitor electrode formation layer 507, and an external layer 405. Input/output terminals and a ground terminal are formed on end surfaces of the multilayer structure.

In this example, input/output electrodes 823 and 824 are provided in the input/output electrode formation layer 506, and input/output electrodes 821 and 822 are provided in the input/output electrode formation layer 503. In addition to the two input/output electrode formation layers 506 and 503, an input-output capacitor electrode 360 is provided in an input-output capacitor electrode formation layer 507. The input-output capacitor electrode 360 causes capacitance between the input/output electrode 823 and the input-output capacitor electrode 360 and between the input-output capacitor electrode 360 and the input/output electrode 824 thereby capacitively coupling the input terminal and the output terminal. The input-output capacitor electrode 360 also functions as a transverse electrode extending across the line electrodes 616 to 619. In this example, the other elements are configured in a similar manner to those according to the seventeenth preferred embodiment.

The input/output electrodes 821 and 823 are connected to a terminal electrode arranged on one side surface of a multilayer structure, and the input/output electrodes 822 and 824 are connected to a terminal electrode arranged on another side surface of a multilayer structure.

In FIG. 49, a capacitor C14 is a symbolic expression of total capacitance between the input/output electrodes 823 and 824 via the input-output capacitor electrode 360 as a result of formation of the input-output capacitor electrode 360. The effects of the input-output capacitor electrode 360 functioning as the transverse electrode appear in the form of distributed constants, and they are not shown in FIG. 49.

Nineteenth Preferred Embodiment

In a nineteenth preferred embodiment described below, a multilayer bandpass filter has a four-stage LC parallel resonator configuration having an input-output capacitor electrode and an internal ground electrode disposed in a layer other than the bottom layer.

Figure 50:
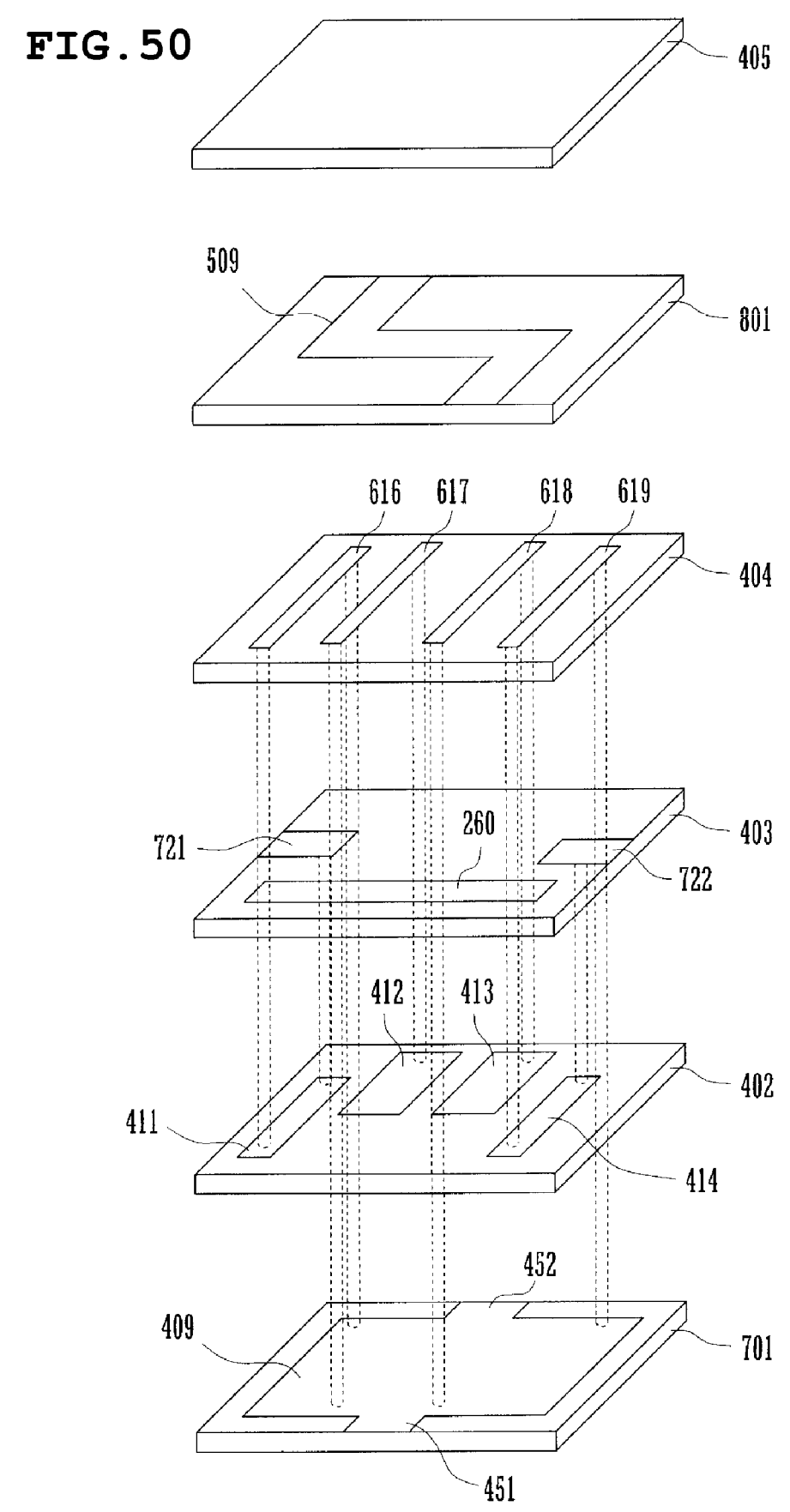

FIG. 50 is an exploded perspective view of a multilayer bandpass filter according to a nineteenth preferred embodiment. In this multilayer bandpass filter, a ground electrode formation layer 701, a capacitor electrode formation layer 402, an input/output electrode formation layer 403, and a line electrode formation layer 404 are formed in a similar manner to the configuration shown in FIG. 45. In the configuration shown in FIG. 50, the multilayer bandpass filter further includes a ground electrode formation layer 801 disposed between the line electrode formation layer 404 and an external layer 405. In the ground electrode formation layer 801, a crank-shaped ground electrode 509 is provided. Of portions of the crank-shaped ground electrode 509, portions which are substantially parallel to each other are arranged so as to partially oppose the respective line electrodes 617 and 618 and so as to extend substantially parallel to the line electrodes 617 and 618, whereby distributed capacitance occurs on inductors of the second-stage LC parallel resonator and the third-stage LC parallel resonator with respect to the ground.

As described above, by inserting a ground electrode formation layer in a basic structure including a plurality of LC parallel resonators inductively coupled with each other, it is possible to add an additional circuit element to the basis structure, whereby it is possible to modify the filter characteristic in various manners.

Twentieth Preferred Embodiment

In a twentieth preferred embodiment described below, a multilayer bandpass filter has a five-stage LC parallel resonator configuration using chip inductors.

Figure 51A:
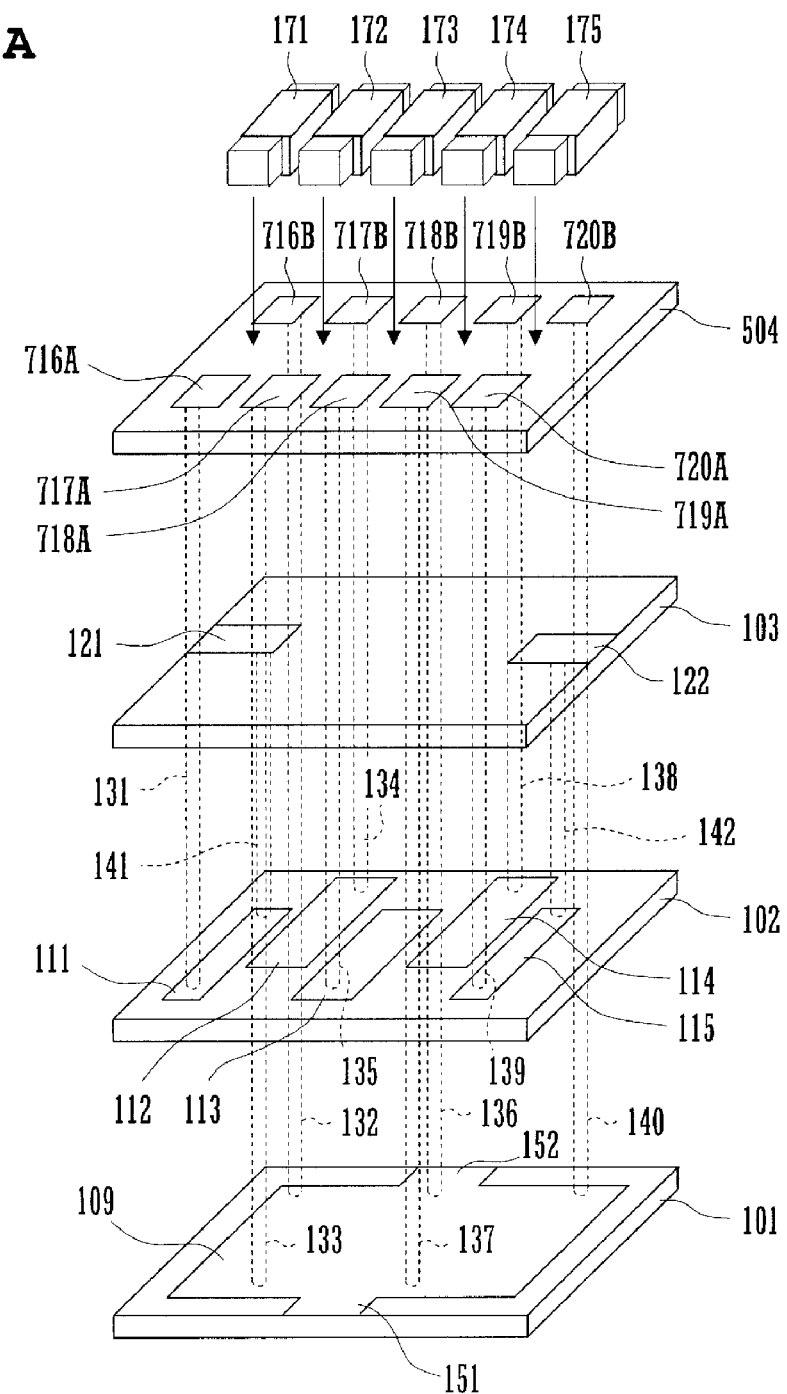
FIGS. 51A and 51B show an exploded perspective view and an external perspective view of a multilayer bandpass filter according to a twentieth preferred embodiment of the present invention.
Figure 51B:
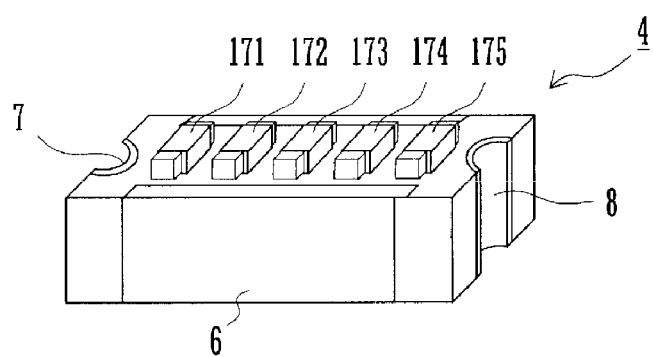

FIG. 51A is an exploded perspective view of the multilayer bandpass filter according to the twentieth preferred embodiment, and FIG. 51B is a perspective view showing an appearance of the multilayer bandpass filter.

This multilayer bandpass filter has a multilayer structure including a ground electrode formation layer 101, a capacitor electrode formation layer 102, an input/output electrode formation layer 103, and a line electrode formation layer 504. Furthermore, input/output terminals 7 and 8 and a ground terminal 6 are provided on the multilayer structure, and chip inductors 171 to 175 are mounted on the multilayer structure.

As shown in FIG. 51A, chip-inductor connection electrodes (716A, 716B) to (720A, 720B) are provided in the line electrode formation layer 504.

Via-electrodes are arranged between the line electrode formation layer 504 and the capacitor electrode formation layer 102 and between the line electrode formation layer 504 and the ground electrode formation layer 101 in a similar manner to the configuration shown in FIG. 2A. Thus, an equivalent circuit of this configuration having the chip inductors 171 to 175 mounted on the multilayer structure is similar to that shown in FIG. 3A.

By properly setting the values of the chip inductors 171 to 175, it is possible to easily set the filter characteristics without changing the multilayer structure of the filter.

Use of the chip inductors makes it possible to achieve high inductance for inductors of the respective LC parallel resonators, and thus, it is possible to achieve a small-sized bandpass filter suitable for use in relatively low frequency bands.

Twenty-First Preferred Embodiment

In the preferred embodiments described above, the inductor electrodes and the capacitor electrodes are preferably arranged in a direction that is substantially perpendicular to a direction in which the dielectric layers and the electrode layers are placed one on another. In a twenty-first preferred embodiment described below, inductor electrodes and capacitor electrodes are arranged in the same direction as a direction in which dielectric layers and electrode layers are placed one on another.

Figure 52A:
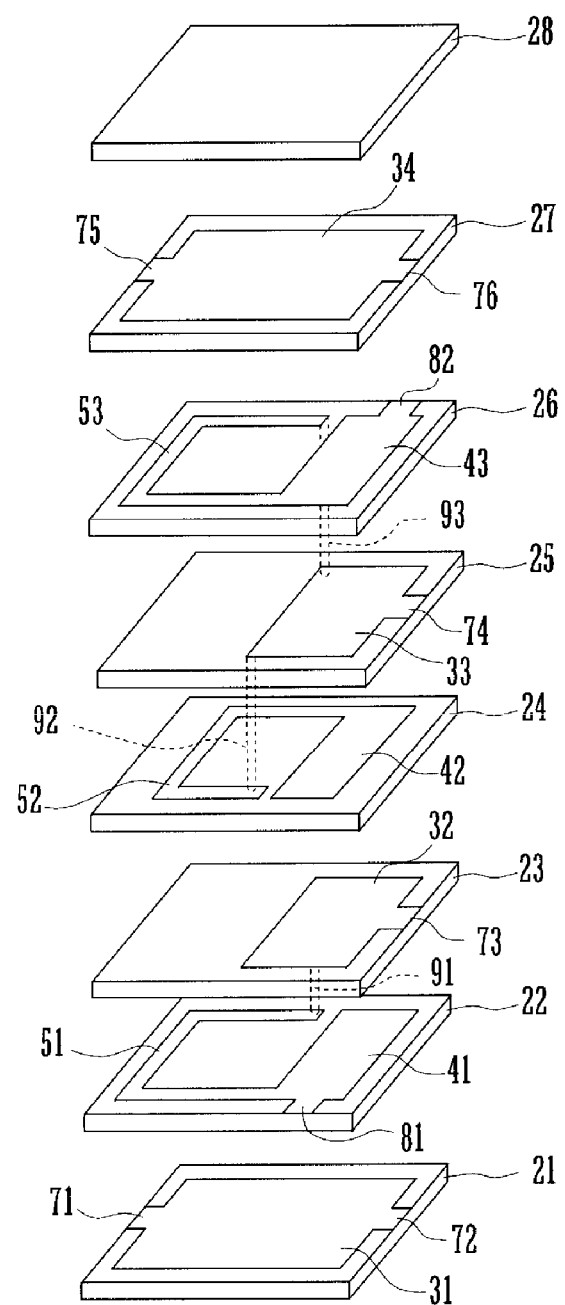
FIGS. 52A and 52B show an exploded perspective view and an external perspective view of a multilayer bandpass filter according to a twenty-first preferred embodiment of the present invention.

FIG. 52A is an exploded perspective view of a multilayer bandpass filter according to the twenty-first preferred embodiment.

This multilayer bandpass filter has a multilayer structure 200 including ground electrode formation layers 21, 23, 25, and 27, inductor/capacitor electrode formation layers 22, 24, and 26, and an external layer 28. Furthermore, input/output terminals 70 and 80 and ground terminals 60 and 61 are provided on side surfaces of the multilayer structure 200.

In the ground electrode formation layer 21, a ground electrode 31 and ground connection electrodes 71 and 72 are provided. A ground electrode 32 and a ground connection electrode 73 are provided in the ground electrode formation layer 23. A ground electrode 33 and a ground connection electrode 74 are provided in the ground electrode formation layer 25. A ground electrode 34 and ground connection electrodes 75 and 76 are provided in the ground electrode formation layer 27.

Capacitor electrodes 41, 42, and 43 and inductor electrodes 51, 52, and 53 are provided in the inductor/capacitor electrode formation layers 22, 24, and 26. Furthermore, a via-electrode 91 electrically connected to one end of the inductor electrode 51 and the ground electrode 32, a via-electrode 92 electrically connected to one end of the inductor electrode 52 and the ground electrode 33, and a via-electrode 93 electrically connected to one end of the inductor electrode 53 and the ground electrode 33 are provided.

Figure 52B:
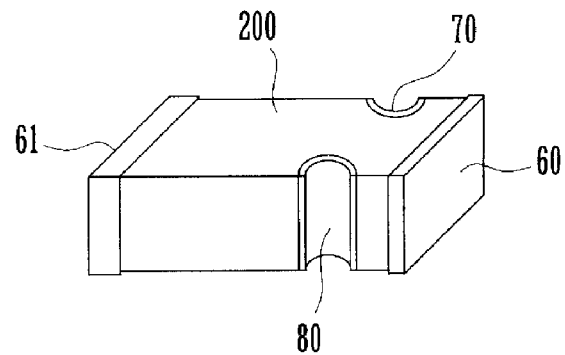
Figure 53:
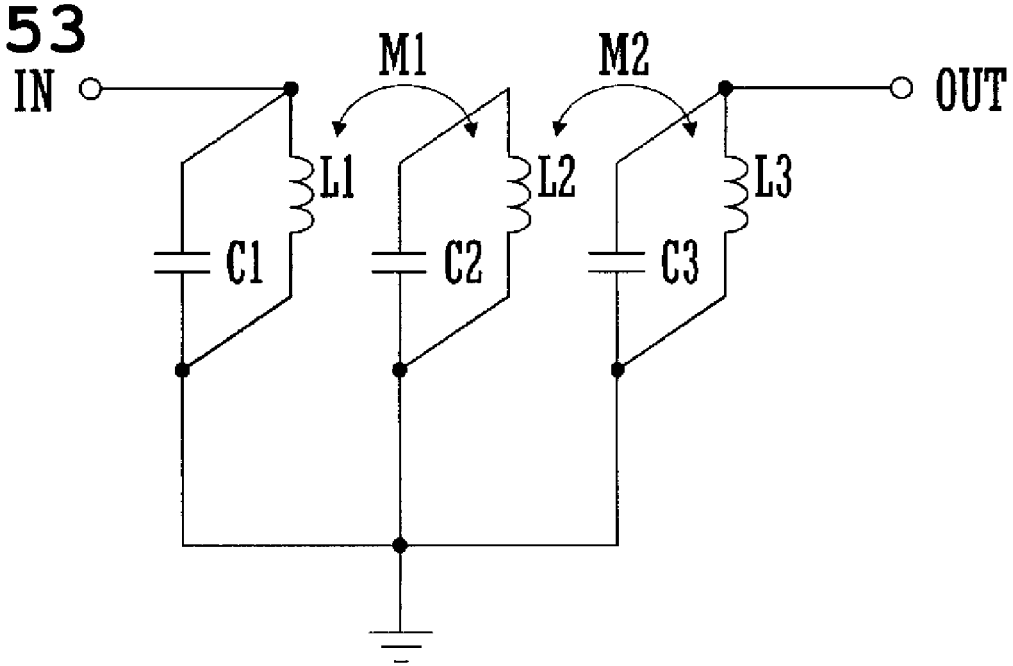
FIG. 53 shows an equivalent circuit of the multilayer bandpass filter according to the twenty-first preferred embodiment of the present invention.

FIG. 53 shows an equivalent circuit of the multilayer bandpass filter configured in the above-described manner. In FIG. 53, capacitors C1 to C3 are symbolic expressions of capacitance between the respective capacitor electrodes 41 to 43 and the ground electrodes 31 to 34. Inductors L1 to L3 are symbolic expressions of inductance on the inductor electrodes 51 to 53. As shown in FIG. 52, the loop direction of the inductor electrode 52 is opposite to the loop directions of the inductor electrodes 51 and 53, and thus, inductive coupling M1 and inductive coupling M2 shown in FIG. 53 are opposite in polarity to each other, that is, coupling is in a polarity sequence of <101>. The ground terminal 61 extends transversely across a portion of the inductor electrodes 51 to 53, and thus, the ground terminal 61 also functions as a transverse electrode.

In the preferred embodiments described above, the capacitor electrodes are provided in the capacitor electrode formation layer thereby obtaining capacitors of the respective LC parallel resonators. Alternatively, chip capacitors may be mounted on a multilayer structure of dielectric layers and electrode layers.

In the preferred embodiments described above, capacitance is produced between the common ground electrode and the capacitor electrodes. Alternatively, instead of the ground electrode, another capacitor electrode may be provided and capacitance may be produced between two opposing capacitor electrodes.

Twenty-Second Preferred Embodiment

Figure 54:
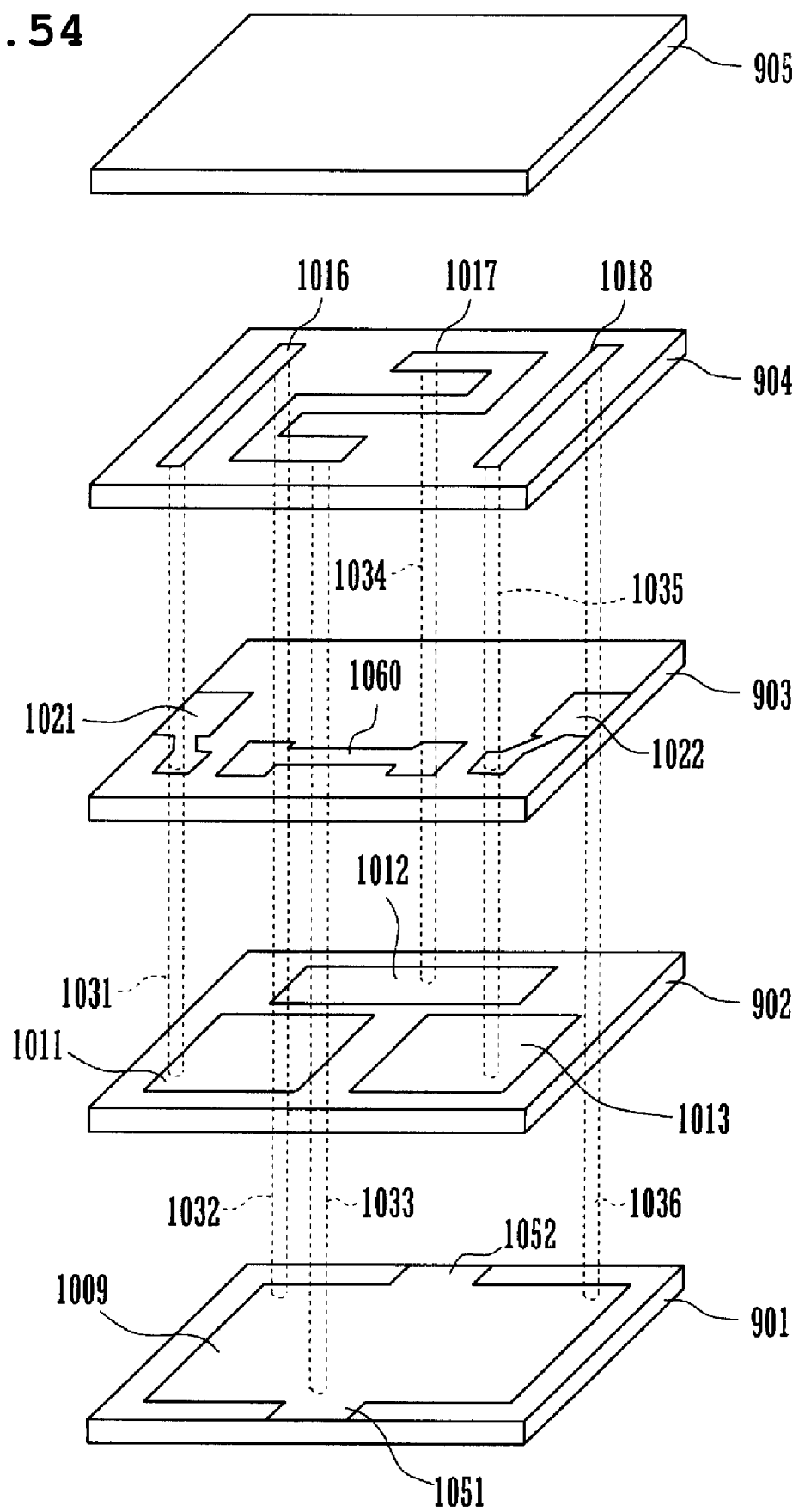
FIG. 54 is an exploded perspective view of a multilayer bandpass filter according to a twenty-second preferred embodiment of the present invention.
Figure 55A:
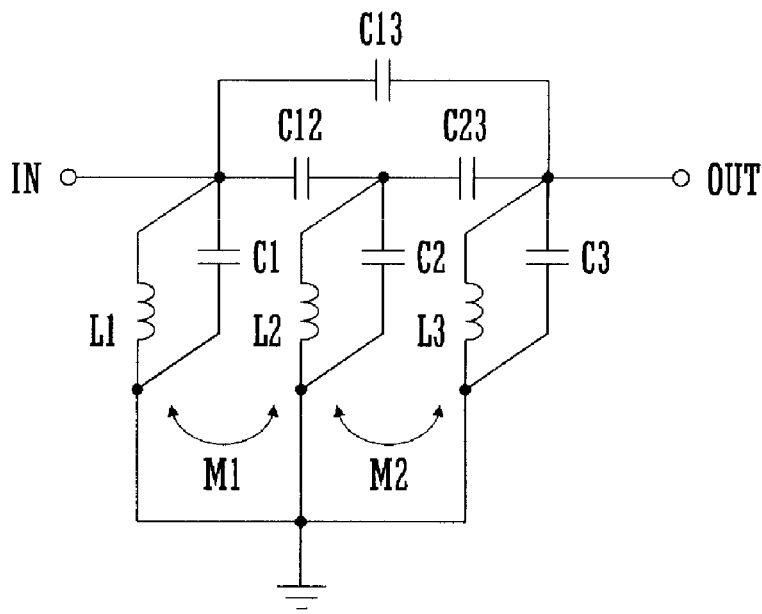
FIGS. 55A and 55B show an equivalent circuit and a characteristic of the multilayer bandpass filter according to the preferred twenty-second embodiment of the present invention.
Figure 55B:
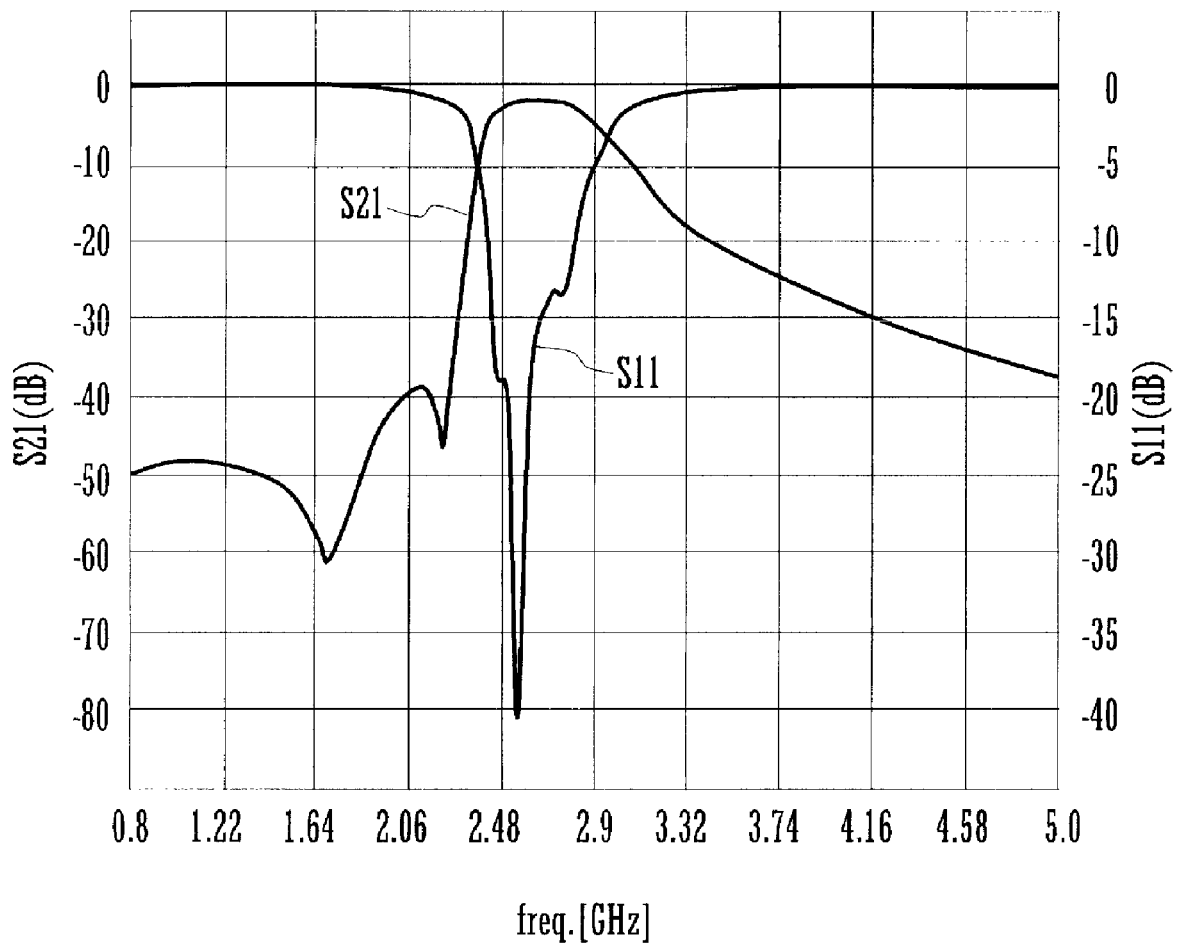

FIG. 54 is an exploded perspective view of a multilayer bandpass filter according to a twenty-second preferred embodiment, FIG. 55A shows an equivalent circuit thereof, and FIG. 55B shows a transfer characteristic and a reflection characteristic thereof.

This multilayer bandpass filter is configured as a multilayer structure including a ground electrode formation layer 901, a capacitor electrode formation layers 902, an input/output electrode formation layer 903, a line electrode formation layer 904, and an external layer 905. Input/output terminals and a ground terminal are provided on end surfaces of the multilayer structure. This multilayer bandpass filter has an appearance similar to that shown in FIG. 2B.

As shown in FIG. 54, input/output electrodes 1021 and 1022 and an input-output capacitor electrode 1060 are provided in the input/output electrode formation layer 903. The input-output capacitor electrode 1060 causes capacitance to occur between the two input/output electrodes 1021 and 1022 thereby capacitively coupling the input/output electrodes 1021 and 1022.

Capacitor electrodes 1011, 1012, and 1013 are arranged in the capacitor electrode formation layer 902 so as to oppose the ground electrode 1009.

A via-electrode 1031 is electrically connected to the input/output electrode 1021, a capacitor electrode 1011 and one end of a line electrode 1016, and a via-electrode 1035 is electrically connected to the input/output electrode 1022, a capacitor electrode 1013, and one end of a line electrode 1018.

A via-electrode 1032 is electrically connected to the other end of the line electrode 1016 and to the ground electrode 1009. A via-electrode 1033 is electrically connected to the ground electrode 1009 and one end of the line electrode 1017, and a via-electrode 1034 is electrically connected to the other end of the line electrode 1017 and to the capacitor electrode 1012. A via-electrode 1036 is electrically connected to the other end of the line electrode 1018 and to the ground electrode 1009.

FIG. 55A shows an equivalent circuit of the multilayer bandpass filter. This equivalent circuit is similar to that shown in FIG. 43A according to the sixteenth preferred embodiment. In this equivalent circuit shown in FIG. 55A, capacitors C1, C2, and C3 represent capacitance between capacitor electrodes 1011, 1012 and 1013 and the ground electrode 1009. An inductor L1 represents inductance on the line electrode 1016 and the via-electrodes 1031 and 1032. An inductor L2 represents inductance on the line electrode 1017 and the via-electrodes 1033 and 1034. An inductor L3 represents inductance on the line electrode 1018 and the via-electrodes 1035 and 1036. A capacitor C12 represents capacitance in an electrode-electrode gap between the capacitor electrode 1011 and the capacitor electrode 1012, and a capacitor C23 represents capacitance in an electrode-electrode gap between the capacitor electrode 1012 and the capacitor electrode 1013. A capacitor C13 represents total capacitance of the capacitance that appears in an electrode-electrode gap between the input-output capacitor electrode 1060 and the input/output electrodes 1021 and 1022 and capacitance appearing between two ends of input-output capacitor electrode 1060 and the capacitor electrodes 1011 and 1013. M1 represents inductive coupling between the inductors L1 and L2, and M2 represents inductive coupling between the inductors L2 and L3. The three LC parallel resonators are coupled so as to have a sequence of polarities of <101>.

As a whole, the above-described three-stage LC parallel resonator configuration functions as a bandpass filter.

In this twenty-second preferred embodiment, of the three line electrodes 1016, 1017, and 1018, the central line electrode 1017 has a meandering shape. This makes it possible to provide a long line electrode in a limited area. Therefore, it is possible to achieve necessary inductance in a small area, and thus, it possible to reduce the total size.

The capacitor electrode 1012 of the second-stage LC parallel resonator is provided in the capacitor electrode formation layer 902, at a location which is not between the capacitor electrode 1011 of the LC parallel resonator at the input side and the capacitor electrode 1013 of the LC parallel resonator at the output side.

The above-described arrangement of the capacitor electrodes enables independent setting of the capacitance between the two capacitor electrodes 1011 and 1013 to an optimum value while maintaining the capacitance between the capacitor electrodes 1011 and 1012 and the capacitance between the capacitor electrode 1013 and 1012 at small values. That is, the capacitance between the input terminal and the output terminal can be set simply by adjusting the distance between the two capacitor electrodes 1011 and 1013, and thus, the frequencies of attenuation poles at both edges of the passband can be easily design. In contrast, in the example shown in FIG. 42, because the capacitor electrode 312 of the second-stage resonator is disposed between the capacitor electrodes 311 and 313, a relatively large capacitance occurs between the capacitor electrode 312 and the capacitor electrodes 311 and 313. As a result, it is difficult to design the value of the capacitance between the input terminal and the output terminal, and it is difficult to control the attenuation pole based on the jumping coupling.

Furthermore, in this twenty-second preferred embodiment, the input-output capacitor electrode 1060 is disposed at a location which does not directly face the capacitor electrode 1012 of the second-stage LC parallel resonator (that is, so that the input-output capacitor electrode 1060 is not capacitively coupled with the capacitor electrode 1012). This suppresses undesirable coupling between the input-output capacitor electrode 1060 and the capacitor electrode 1012 of the second-stage LC parallel resonator, and it is possible to achieve a desirable attenuation characteristic based on jumping coupling between the first-stage resonator and the third-stage resonator.

As described above, by coupling the three resonators such that their coupling polarities are set so as to have a polarity sequence of <101>, and by capacitively coupling the first-stage resonator and the third-stage resonator with each other, the characteristic shown in FIG. 55B is obtained. In this figure, S21 represents a transfer characteristic, and S11 represents a reflection characteristic. In this example, a passband is obtained in a range of about 2.3 GHz to about 2.9 GHz. Two attenuation poles occur in a lower range adjacent to the passband. As can be clearly seen from a comparison with FIG. 43B, of the two attenuation poles existing in the lower range adjacent to the passband, an attenuation pole closer to the passband causes large attenuation in the lower range adjacent to the passband. More specifically, attenuation of about −40 dB is achieved in the frequency range lower than about 2.2 GHz.

Twenty-Third Preferred Embodiment

Figure 56:
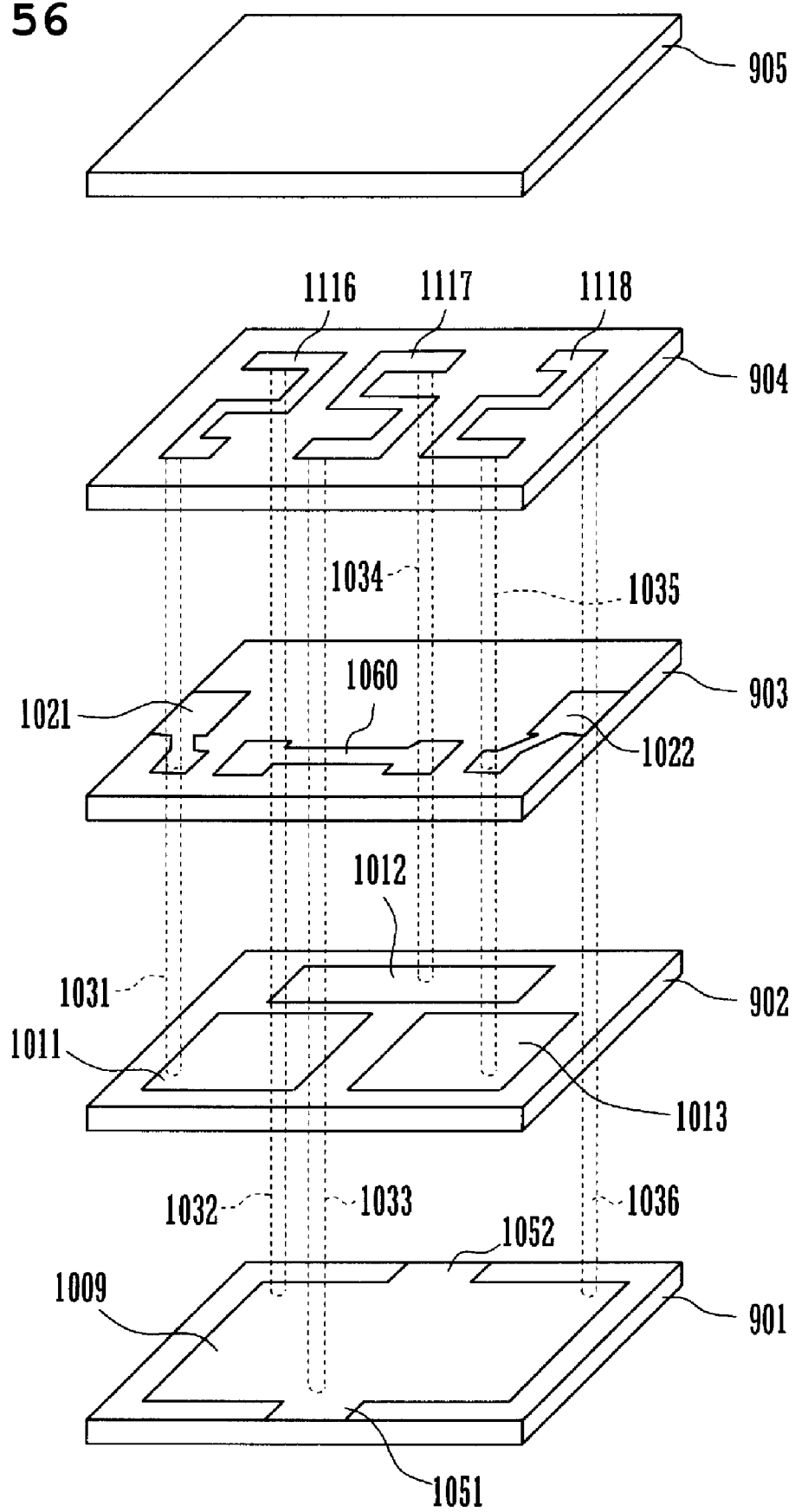
FIG. 56 is an exploded perspective view of a multilayer bandpass filter according to a twenty-third preferred embodiment of the present invention.

FIG. 56 is an exploded perspective view of a multilayer bandpass filter according to a twenty-third preferred embodiment. The twenty-third preferred embodiment is different from the example shown in FIG. 54 according to the twenty-second preferred embodiment in terms of the line electrode patterns provided in the line electrode formation layer 904. In the example shown in FIG. 56, line electrodes 1116, 1117, and 1118 are arranged in a meandering shape in the line electrode formation layer 904. The other elements are similar to those shown in FIG. 54. FIG. 55A shows an equivalent circuit of the multilayer bandpass filter configured in the above-described manner.

The line electrode pattern is arranged so as to be point-symmetric about the center of the line electrode formation layer 904. This symmetric configuration allows an inductor L1 of a first-stage LC parallel resonator and an inductor L3 of a third-stage LC parallel resonator in the equivalent circuit to have substantially the same inductance, and inductive coupling M1 between the inductors L1 and L2 and inductive coupling M2 between the inductors L2 and L3 to be substantially equal.

Although in this specific example, all of the line electrodes 1116, 1117, and 1118 have a meandering shape, the line electrodes 1116 and 1118 at first and third stages may have a U-like shape with an open side facing inward.

In this configuration, the line electrodes 1116, 1117, and 1118 have a large length, which allows the inductors L1, L2, and L3 of the LC parallel resonators in the equivalent circuit to have large inductance. Thus, it is possible to set the passband in a lower frequency range, as compared to the configuration in which the line electrodes 1116, 1117, 1118 are arranged in straight lines.

As described above, the present preferred embodiment obtains a small-sized multilayer bandpass filter, and it is possible to modify the filter characteristics by modifying only the line electrode formation layer 904.

Twenty-Fourth Preferred Embodiment

Figure 57:
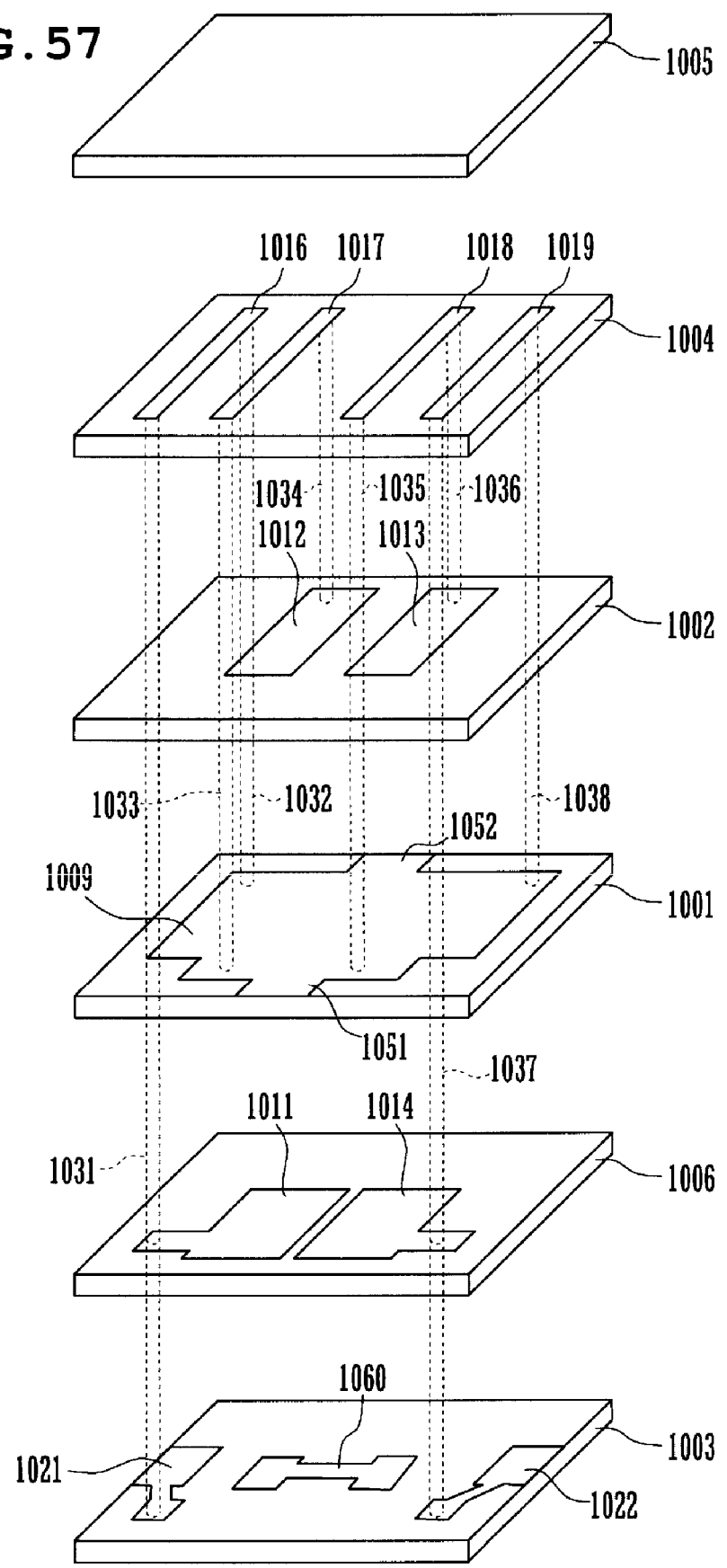
FIG. 57 is an exploded perspective view of a multilayer bandpass filter according to a twenty-fourth preferred embodiment of the present invention.
Figure 58A:
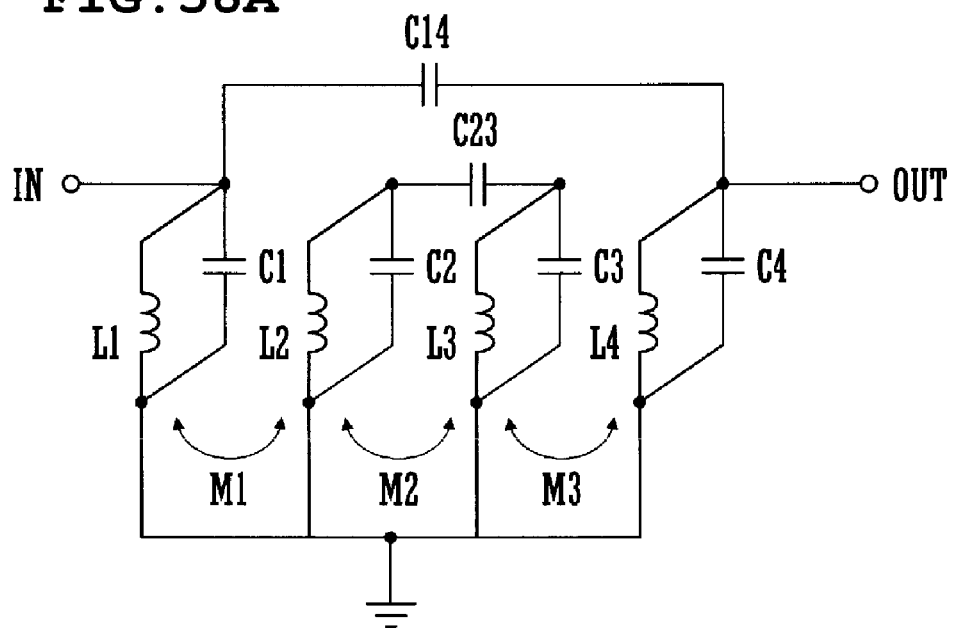
FIGS. 58A and 58B show an equivalent circuit and a characteristic of the multilayer bandpass filter according to the preferred twenty-fourth embodiment of the present invention.
Figure 58B:
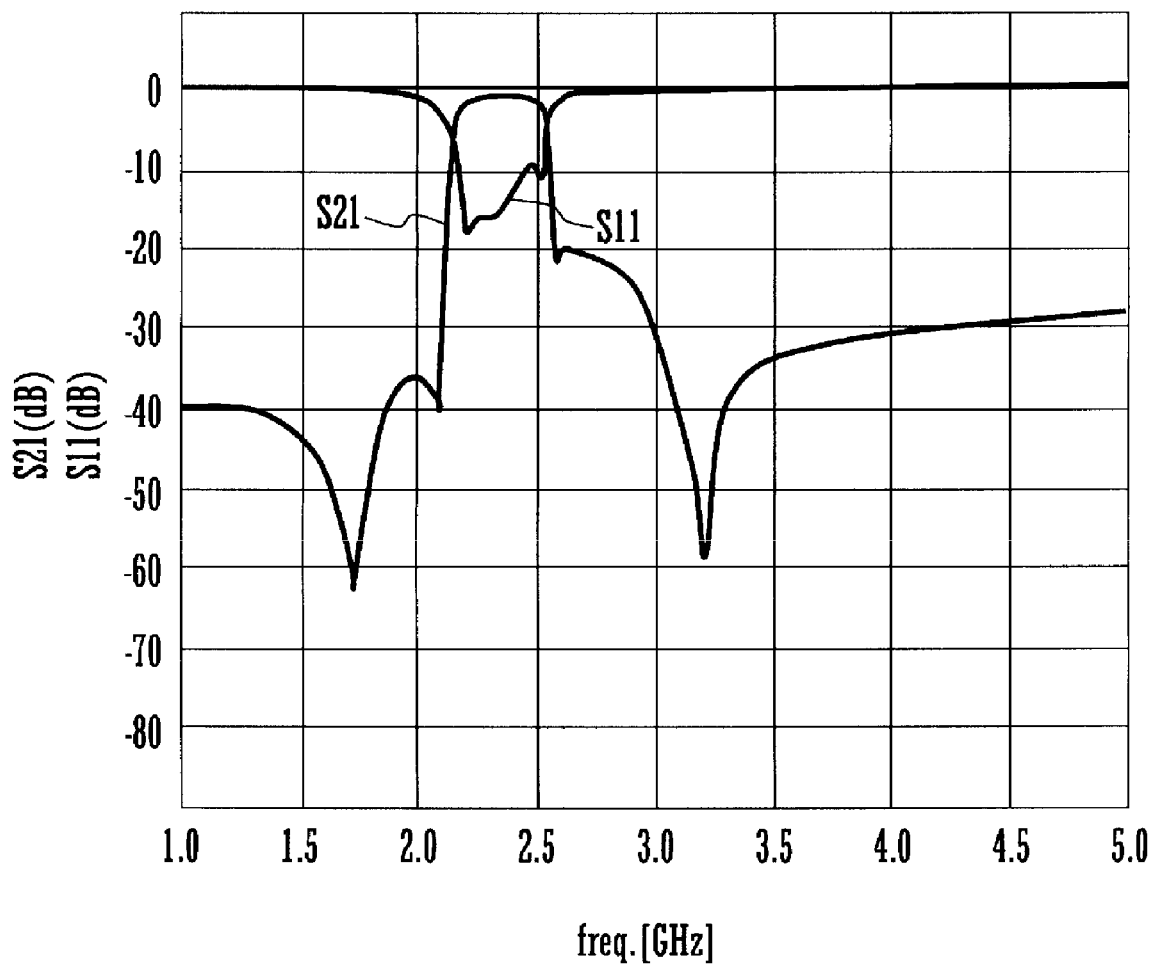

FIG. 57 is an exploded perspective view of a multilayer bandpass filter according to a twenty-fourth preferred embodiment, FIG. 58A shows an equivalent circuit thereof, and FIG. 58B shows a transfer characteristic and a reflection characteristic thereof.

This multilayer bandpass filter is configured as a multilayer structure including a ground electrode formation layer 1001, capacitor electrode formation layers 1002 and 1006, an input/output electrode formation layer 1003, a line electrode formation layer 1004, and an external layer 1005. Input/output terminals and a ground terminal are formed on end surfaces of the multilayer structure. This multilayer bandpass filter is similar to that shown in FIG. 2B.

As shown in FIG. 57, input/output electrodes 1021 and 1022 and an input-output capacitor electrode 1060 are provided in the input/output electrode formation layer 1003. The input-output capacitor electrode 1060 causes capacitance to occur between the two input/output electrodes 1011 and 1014 thereby capacitively coupling the input/output electrodes 1021 and 1022.

Capacitor electrodes 1011 and 1014 are provided in the capacitor electrode formation layer 1006 so as to oppose the ground electrode 1009.

Capacitor electrodes 1012 and 1013 are provided in the other capacitor electrode formation layer 1002 so as to oppose the ground electrode 1009.

A via-electrode 1031 is electrically connected to the input/output electrode 1021, the capacitor electrode 1011, and one end of the line electrode 1016. A via-electrode 1032 is electrically connected to the other end of the line electrode 1016 and to the ground electrode 1009. A via-electrode 1033 is electrically connected to the ground electrode 1009 and one end of the line electrode 1017. A via-electrode 1034 is electrically connected to the other end of the line electrode 1017 and to the capacitor electrode 1012. A via-electrode 1035 is electrically connected to one end of the line electrode 1018 and to the ground electrode 1019. A via-electrode 1036 is electrically connected to the other end of the line electrode 1018 and to the capacitor electrode 1013. A via-electrode 1037 is electrically connected to the input/output electrode 1022, the capacitor electrode 1014, and the line electrode 1019. A via-electrode 1038 is electrically connected to the other end of the line electrode 1019 and to the ground electrode 1009.

FIG. 58A shows an equivalent circuit of the multilayer bandpass filter. In this equivalent circuit shown in FIG. 58A, capacitors C1, C2, C3, and C4 represent capacitance between capacitor electrodes 1011, 1012, 1013, and 1014 and the ground electrode 1009. An inductor L1 represents inductance on the line electrode 1016 and the via-electrodes 1031 and 1032. An inductor L2 represents inductance on the line electrode 1017 and the via-electrodes 1033 and 1034. An inductor L3 represents inductance on the line electrode 1018 and the via-electrodes 1035 and 1036. An inductor L4 represents inductance on the line electrode 1019 and the via-electrodes 1037 and 1038.

A capacitor C23 represents capacitance in an electrode-electrode gap between the capacitor electrode 1012 and the capacitor electrode 1013. A capacitor C14 represents the total capacitance in an electrode-electrode gap between the input-output capacitor electrode 1060 and the input/output electrodes 1011 and 1014 and capacitance between two ends of input-output capacitor electrode 1060 and the capacitor electrodes 1011 and 1014.

M1 represents inductive coupling between the inductors L1 and L2, n2 represents inductive coupling between the inductors L2 and L3, and M3 represents inductive coupling between the inductors L3 and L4. The four LC parallel resonators are coupled so as to have a sequence of polarities of <1001>.

The entire above-described four-stage LC parallel resonator configuration functions as a bandpass filter.

In this twenty-fourth preferred embodiment, because the capacitor electrodes 1011 and 1014 of the resonators respectively located at the input side and the output side are provided in an electrode layer separate from an electrode layer of the capacitor electrodes 1012 and 1013 of the other resonators, the capacitors 1011 and 1014 of the resonators at the input and output sides are not coupled with the capacitor electrodes 1012 and the 1013 of the other resonators, and thus, high reliability in terms of capacitance is achieved. This allows improvements in attenuation pole characteristics and filter characteristics.

Furthermore, the capacitor electrodes 1011 and 1014 of the resonators at the input and output sides are not electromagnetically coupled with inductors of resonators, and thus, the resonators have high Q values, which allow improvements in attenuation pole characteristics and filter characteristics.

Furthermore, because capacitor electrodes are disposed on both sides of the ground electrode 1009, that is, the capacitor electrodes 1011 and 1014 of the resonators at the input and output sides are disposed in a layer on one side of a layer in which the ground electrode 1009 is provided, and the other capacitor electrodes 1012 and 1013 are disposed in a layer on the other side of the layer in which the ground electrode 1009 is provided, the ground electrode has a large effective area and thus, the overall size of the filter can be reduced.

FIG. 58B shows characteristics of this multilayer bandpass filter according to the twenty-fourth preferred embodiment. In this figure, S21 represents a transfer characteristic, and S11 represents a reflection characteristic. In this example, a passband is obtained in a range of about 2.2 GHz to about 2.5 GHz. Two attenuation poles occur in lower and higher ranges adjacent to the passband. As can be clearly seen from a comparison with FIG. 46B, of the two attenuation poles existing in the higher range adjacent to the passband, an attenuation pole closer to the passband causes great attenuation in the higher range adjacent to the passband.

Twenty-Fifth Preferred Embodiment

Figure 59:
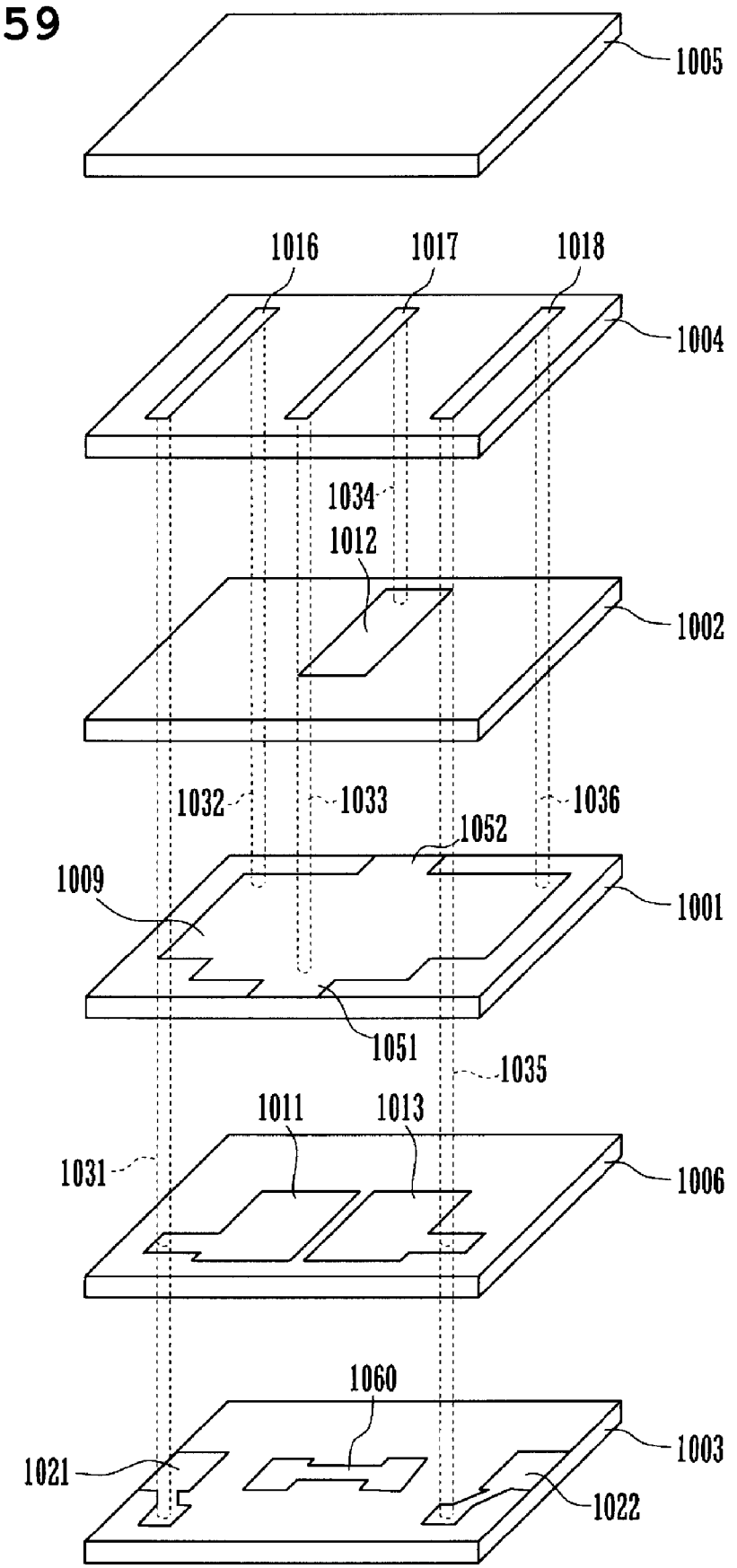
FIG. 59 is an exploded perspective view of a multilayer bandpass filter according to a twenty-fifth preferred embodiment of the present invention.
Figure 60A:
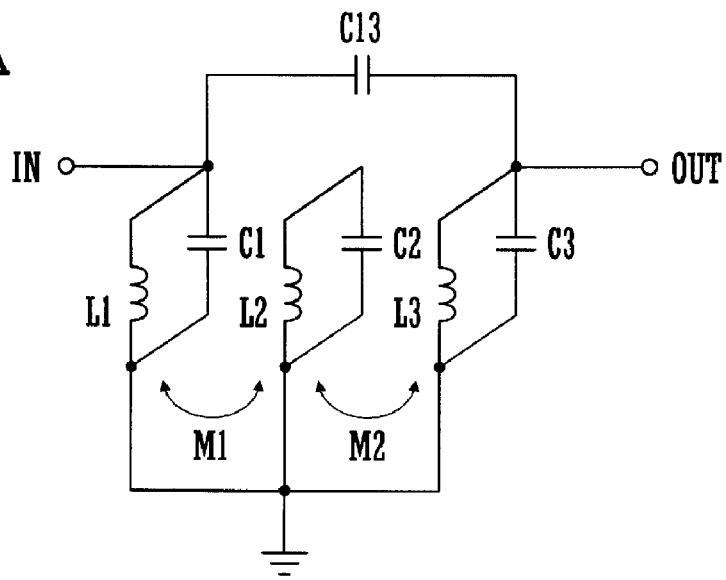
FIGS. 60A and 60B show an equivalent circuit and a characteristic of the multilayer bandpass filter according to the preferred twenty-fifth embodiment of the present invention.
Figure 60B:
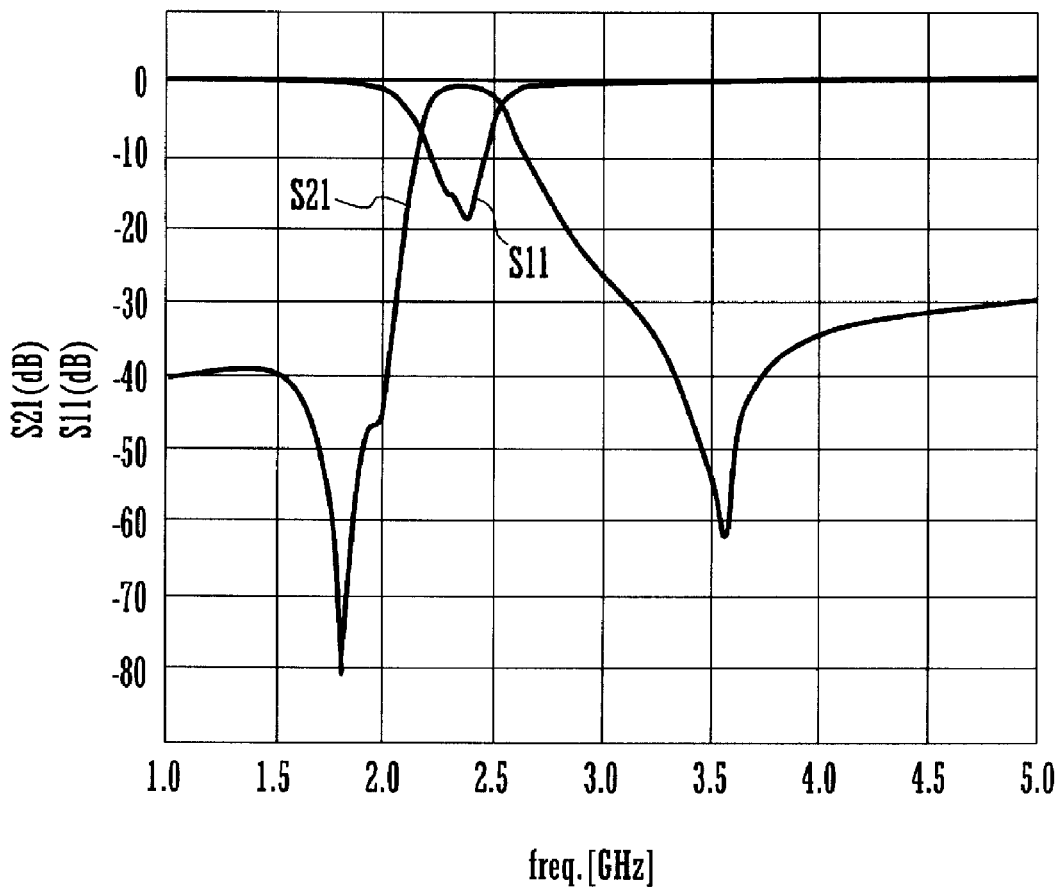

FIG. 59 is an exploded perspective view of a multilayer bandpass filter according to a twenty-fifth preferred embodiment, FIG. 60A shows an equivalent circuit thereof, and FIG. 60B shows a transfer characteristic and a reflection characteristic thereof.

In this twenty-fifth preferred embodiment, in contrast to the twenty-fourth preferred embodiment in which the multilayer bandpass filter is configured to have four resonators, the multilayer bandpass filter is configured to have three resonators.

This multilayer bandpass filter is configured as a multilayer structure including a ground electrode formation layer 1001, capacitor electrode formation layers 1002 and 1006, an input/output electrode formation layer 1003, a line electrode formation layer 1004, and an external layer 1005. Input/output terminals and a ground terminal are formed on end surfaces of the multilayer structure. The multilayer bandpass filter has an appearance similar to that shown in FIG. 2B.

As shown in FIG. 59, three line electrode 1016, 1017, and 1018 are provided in the line electrode formation layer 1004, and one capacitor electrode 1012 is provided in the capacitor electrode formation layer 1002. In accordance with shapes and locations of these electrodes, locations of via-electrodes are determined. The other electrode layers are arranged in a similar manner to those shown in FIG. 57 such that electrodes are arranged so as to have electrode patterns similar to those of the 4-stage configuration shown in FIG. 57.

A via-electrode 1031 is electrically connected to the input/output electrode 1021, the capacitor electrode 1011, and one end of the line electrode 1016. A via-electrode 1032 is electrically connected to the other end of the line electrode 1016 and to the ground electrode 1009. A via-electrode 1033 is electrically connected to the ground electrode 1009 and one end of the line electrode 1017. A via-electrode 1034 is electrically connected to the other end of the line electrode 1017 and to the capacitor electrode 1012. A via-electrode 1035 is electrically connected to the input/output electrode 1022, the capacitor electrode 1013, and one end of the line electrode 1018. A via-electrode 1036 is electrically connected to the other end of the line electrode 1018 and to the ground electrode 1009.

FIG. 60A shows an equivalent circuit of the multilayer bandpass filter. In this equivalent circuit shown in FIG. 60A, capacitors C1, C2, and C3 represent capacitance between capacitor electrodes 1011, 1012 and 1013 and the ground electrode 1009. An inductor L1 is defined by the line electrode 1016 and the via-electrodes 1031 and 1032. An inductor L2 is defined by the line electrode 1017 and the via-electrodes 1033 and 1034. An inductor L3 is defined by the line electrode 1018 and the via-electrodes 1035 and 1036.

A capacitor C13 represents the total capacitance in an electrode-electrode gap between the input-output capacitor electrode 1060 and the input/output electrodes 1011 and 1013 and capacitance between two ends of input-output capacitor electrode 1060 and the capacitor electrodes 1011 and 1013.

M1 represents inductive coupling between the inductors L1 and L2, and M2 represents inductive coupling between the inductors L2 and L3. The three LC parallel resonators are coupled so as to have a sequence of polarities of <101>.

The overall above-described three-stage LC parallel resonator configuration functions as a bandpass filter.

In this twenty-fifth preferred embodiment, because the capacitor electrodes 1011 and 1013 of the resonators respectively located at the input side and the output side are formed in an electrode layer separate from an electrode layer of the capacitor electrode 1012 of the other resonator, the capacitors 1011 and 1013 of the resonators at the input and output sides are not coupled with the capacitor electrode 1012 of the other resonator, and thus, high reliability in terms of capacitance is achieved. This enables improvements in attenuation pole characteristics and filter characteristics.

Furthermore, the capacitor electrodes 1011 and 1013 of the resonators at the input and output sides are not electromagnetically coupled with inductors of resonators, and thus, the resonators have high Q values, which enables improvements in attenuation pole characteristics and filter characteristics.

Furthermore, because capacitor electrodes are disposed on both sides of the ground electrode 1009, that is, the capacitor electrodes 1011 and 1013 of the resonators at the input and output sides are disposed in a layer on one side of a layer in which the ground electrode 1009 is provided, and the other capacitor electrode 1012 is disposed in a layer on the other side of the layer in which the ground electrode 1009 is provided, the ground electrode has a large effective area, and thus, the total size of the filter can be reduced.

FIG. 60B shows characteristics of this multilayer bandpass filter according to the twenty-fifth preferred embodiment. In this figure, S21 represents a transfer characteristic, and S11 represents a reflection characteristic. In this example, a passband is obtained in a range of about 2.2 GHz to about 2.5 GHz. Two attenuation poles occur in a lower range adjacent to the passband, and one attenuation pole occurs in a higher range adjacent to the passband. As can be clearly seen from a comparison with FIG. 43B, of the two attenuation poles existing in the lower range adjacent to the passband, an attenuation pole closer to the passband causes great attenuation in the lower range adjacent to the passband.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A multilayer bandpass filter having a multilayer structure comprising:
a plurality of dielectric layers; and
a plurality of electrode layers each having at least one of a capacitor electrode and an inductor electrode; wherein
at least three LC parallel resonators are defined by the capacitor electrodes and the inductor electrodes such that adjacent LC parallel resonators are coupled with each other;
the multilayer bandpass filter includes a single input electrode and a single output electrode, the input electrode being electrically connected to one of the at least three LC parallel resonators that is located at an input side, and the output electrode being electrically connected to another of the at least three LC parallel resonators that is located at an output side;
the inductor electrode of each of the at least three LC parallel resonators are arranged to form a loop such that the loop extends starting from a node between one end of the inductor electrode and the capacitor electrode of each of the at least three LC parallel resonators, and such that when seen in a direction in which the inductor electrodes are arranged, a loop plane of the loop of the inductor electrode of each LC parallel resonator at least partially overlaps a loop plane of the loop of the inductor electrode of an adjacent LC parallel resonator thereby coupling these LC parallel resonators; and
a direction of the loops of the inductor electrodes of the at least two of LC parallel resonators is opposite to each other when seen in a direction in which the inductor electrodes are arranged.

2. The multilayer bandpass filter according to claim 1, wherein the direction of the loop of the inductor electrode of the LC parallel resonator at the input side is opposite to the direction of the loop of the inductor electrode of the LC parallel resonator adjacent to the inductor electrode of the LC parallel resonator at the input side, and the direction of the loop of the inductor electrode of the LC parallel resonator at the output side is opposite to the direction of the loop of the inductor electrode of the LC parallel resonator adjacent to the inductor electrode of the LC parallel resonator at the output side.

3. The multilayer bandpass filter according to claim 1, further comprising:
   a side electrode provided on a side surface of the plurality of dielectric layers; wherein
   a ground electrode provided in a ground side of the LC parallel resonators is electrically connected to the side electrode via at least one connection electrode.

4. The multilayer bandpass filter according to claim 1, wherein the inductor electrode of each of the at least three LC parallel resonators is arranged in the shape of a coil with a via-electrode extending in a direction in which the dielectric layers are arranged on one another and at least a line electrode extending in a direction that is substantially perpendicular to the direction in which the dielectric layers are placed one on another, and the inductor electrodes and the capacitor electrodes are disposed in a direction that is substantially perpendicular to the direction in which the dielectric layers and the electrode layers are arranged on one another.

5. The multilayer bandpass filter according to claim 4, wherein an input/output electrode formation layer in which the input electrode and the output electrode are provided is disposed separately from an electrode layer in which at least one of the capacitor electrodes and the line electrodes of electrodes are provided, and the input terminal and the output terminal respectively electrically connected to the input electrode and the output electrode are disposed on side surfaces of the multilayer structure.

6. The multilayer bandpass filter according to claim 5, wherein the input/output electrode formation layer is disposed between the electrode layer in which the line electrodes are provided and the electrode layer in which the capacitor electrodes are provided.

7. The multilayer bandpass filter according to claim 4, wherein the capacitor electrode of each of the at least three LC parallel resonators creates capacitance between the capacitor electrode and a common ground electrode extending over a region in which the capacitor electrodes of the at least three LC parallel resonators are located, and the capacitor electrodes are disposed in the same electrode layer.

8. The multilayer bandpass filter according to claim 4, wherein the line electrodes are disposed in the same electrode layer.

9. The multilayer bandpass filter according to claim 8, wherein the capacitor electrodes and the line electrodes are arranged in an area such that they are distributed in a line-symmetric fashion about an imaginary center line passing through the center of the area and extending in parallel to the line electrodes.

10. The multilayer bandpass filter according to claim 4, wherein each line electrode is connected to two via-electrodes spaced from each other by a distance which is different than a distance between at least two of the line electrodes.

11. The multilayer bandpass filter according to claim 4, wherein the dielectric layer on which the electrode layer including the line electrodes is disposed has a relative dielectric constant in a range of about 6 to about 80, and the dielectric layer on which the electrode layer including the capacitor electrodes is disposed has a relative dielectric constant equal to or greater than about 20.

12. The multilayer bandpass filter according to claim 1, wherein the dielectric layers are made of low temperature cured ceramic.

* * * * *